(12) United States Patent
Ravnikar et al.

(10) Patent No.: US 8,280,701 B2
(45) Date of Patent: *Oct. 2, 2012

(54) METHOD AND APPARATUS FOR COMPUTER-AIDED DESIGN OF THREE-DIMENSIONAL OBJECTS TO BE FABRICATED

(75) Inventors: Edvard Edo Ravnikar, Ljubljana (SI); Roman Šoper, Novo mesto (SI)

(73) Assignee: Archi con des Inventions (UK) Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/206,106

(22) Filed: Aug. 9, 2011

(65) Prior Publication Data

US 2011/0295566 A1 Dec. 1, 2011

Related U.S. Application Data

(63) Continuation of application No. 12/124,008, filed on May 20, 2008, now Pat. No. 8,103,484.

(30) Foreign Application Priority Data

May 21, 2007 (EP) ..................................... 07010053
Mar. 31, 2008 (EP) ..................................... 08006353

(51) Int. Cl.
*G06F 17/50* (2006.01)
(52) U.S. Cl. ................................ 703/1; 700/98; 345/419
(58) Field of Classification Search ........................ 703/1
See application file for complete search history.

(56) References Cited

U.S. PATENT DOCUMENTS

| | | |
|---|---|---|
| 4,600,919 A | 7/1986 | Stern |
| 4,821,214 A | 4/1989 | Sederberg |
| 4,858,146 A | 8/1989 | Shebini |
| 5,452,238 A | 9/1995 | Kramer et al. |
| 5,524,187 A | 6/1996 | Feiner et al. |
| 6,154,213 A | 11/2000 | Rennison et al. |
| 6,587,746 B1 | 7/2003 | D'Souza |

(Continued)

FOREIGN PATENT DOCUMENTS

FR   2793926   3/2002

(Continued)

OTHER PUBLICATIONS

EP Search report dated Feb. 11, 2007 from corresponding EP Application No. 07010053.2.

(Continued)

*Primary Examiner* — Mary C Jacob
(74) *Attorney, Agent, or Firm* — Lando & Anastasi, LLP

(57) ABSTRACT

A computer-aided design apparatus generates a tree structure of coordinate systems defining the topology of a three-dimensional object to be fabricated. The coordinate systems are positioned and orientated in accordance with mathematical functions. The mathematical function positioning child coordinate systems has the identity of the parent coordinate systems as a variable so that the positions of the child coordinate systems relative to their parent coordinate systems vary in accordance with the identity of the parent coordinate systems. Data defining the coordinate systems and connections therebetween is stored in a graph. Bases having a defined relationship are identified and three-dimensional content objects are added thereto. The content objects are added using the same mathematical function to generate a three-dimensional content object in each of a plurality of coordinate systems. The mathematical function for generating the content objects has the identity of the coordinate systems as a variable thereof to generate the content object in each coordinate system with a different shape.

31 Claims, 70 Drawing Sheets

U.S. PATENT DOCUMENTS

| | | |
|---|---|---|
| 6,600,485 B1 | 7/2003 | Yoshida et al. |
| 6,718,291 B1 | 4/2004 | Shapiro et al. |
| 6,791,549 B2 | 9/2004 | Hubrecht et al. |
| 6,844,877 B1 | 1/2005 | Rajkumar et al. |
| 6,940,505 B1 | 9/2005 | Savine et al. |
| 6,985,793 B2 | 1/2006 | Landers et al. |
| 7,089,511 B2 | 8/2006 | Allen et al. |
| 7,190,363 B2 | 3/2007 | Guest et al. |
| 2002/0083076 A1 | 6/2002 | Wucherer et al. |
| 2002/0123812 A1 | 9/2002 | Jayaram et al. |
| 2003/0043154 A1 | 3/2003 | Nimura et al. |
| 2003/0214503 A1 | 11/2003 | Venkataraman et al. |
| 2004/0049739 A1 | 3/2004 | McArdle et al. |
| 2004/0145614 A1 | 7/2004 | Takagaki et al. |
| 2004/0153186 A1 | 8/2004 | Khurana |
| 2004/0205519 A1 | 10/2004 | Chapel et al. |
| 2004/0236561 A1 | 11/2004 | Smith et al. |
| 2005/0021318 A1 | 1/2005 | Inoue et al. |
| 2006/0106485 A1 | 5/2006 | Landers et al. |
| 2009/0204373 A1 | 8/2009 | Brown et al. |

FOREIGN PATENT DOCUMENTS

| | | |
|---|---|---|
| WO | 02097735 | 12/2002 |

OTHER PUBLICATIONS

EP Search report dated Feb. 6, 2008 from corresponding EP Application No. 08006353.0.

Van Emmerik M. J. G. M, "Interactive Design of 3D Models with Geometric Constraints", Visual Computer, Springer, Berlin, DE, vol. 7, No. 5-6, 1991, pp. 309-325, ISSN: 0178-2789.

Emering L et al: "Live participant's action recognition for virtual reality interactions" Computer Graphics and Applications, 1997. Proceedings, the Fifth Pacific Conference on Seoul, South Korea, Oct. 13-16, 1997, Los Alamitos, CA, USA, IEEE Comput. Soc, US, Oct. 13, 1997, pp. 15-21, ISBN:08-8186-8028-8.

Hui K C Ed—Banissi E et al: "Axial representation for modelling 3D shapes" Information Visualization, 2000. Proceedings. IEEE International Conference London, UK Jul. 19-21, 2000, Los Alamitos, CA, USA, IEEE Comput. Soc, US, Jul. 19, 2007, pp. 401-406, ISBN: 0-7695-0743-3.

Sohrt W et al: "Interaction with constraints in 3D modeling" Proceedings. Symposium on Solid Modeling Foundations and CAD/CAM Applications, Jun. 5, 1991, pp. 387-396.

Marhl M et al: "Extensions of sweep surface constructions" Computers and Graphics, Pergamon Press Ltd. Oxford, GB, vol. 20, No. 6, Nov. 19996, pp. 893-903, ISSN: 0097-8493.

Jean-Eudes Marvie et al: "The FL-system: A functional L-system for procedural geometric modeling", The Visual Computer; International Journal of Computer Graphics, Springer Verlag, BE, vol. 21, No. 5, Jun. 1, 2005, pp. 329-339, ISSN: 1432-8726.

Mai Ali Nur et al: "Animating the escape response of the sea anemone, Stomphia coccinea from the starfish, Dermasteris imbricate modeled using implicit surfaces" Computer Graphics International 2001. Proceedings Jul. 3-6, 2001, Piscataway, NJ, USA, IEEE, Jul. 3, 2001, pp. 81-88, ISBN: 0-7695-1007-8.

Day A M et al: "Combining polygonal and subdivision surface approaches to modelling of urban enviroments" Cyberworlds, 2003. Proceedings. 2003 International Conference on Dec. 3-5, 2003, Piscataway, NJ, USA, IEEE, Dec. 3, 2003, pp. 189-196, ISBN:0-7695-1922-9.

Pratt M J: "Extension of ISO 10303, the STEP standard, for the exchange of procedural shape models" Shape Modeling Applications, 2004. Proceedings Genova, Italy Jun. 7-9, 2004, Piscataway, NJ, USA, IEEE, Jun. 7, 2004, pp. 317-326, ISBN: 0-7695-2075-8.

Pratt M J et al: "Towards the standardized exchange of parameterized feature-based CAD models" Computer Aided Design, Elsevier Publishers BV., Barking, GB. vol. 37, No. 12, Oct. 2005, pp. 1251-1265. ISSN: 0010-4485.

Havemann S.: "Generative Mesh Modeling (Dissertation)", Internet Citation, [Online] Dec. 16, 2005, retreived from the Internet: URL:http://www.digibib.tu-bs.de/?docid=000 00008> [retrieved on Aug. 13, 2007].

"Allplan 2004 Schritt für Schritt Goedäsie" Nemetschek Campus, Jun. 1, 2004, pp. 116-133, XP007904798, Munich, Germany (English Translation Provided).

"Pro/Engineer—Behavioral Modeling Task Guide" Jun. 1, 1999, pp. 1-96, XP007904996.

Ju T. et al.,: "Recursive turtle programs and iterated affine transformations", Computers and Graphics, Pergamon Press Ltd. Oxford, GB, vol. 28, No. 6, Dec. 2004, pp. 991-1004, XP004615312 ISSN:0097-8793.

Nemetschek: Allplan Version 12 Handbuch Architektur, Teil 1 p. 5.34-6.01 'Makromodellierer', 'Öffnungen', Teil 3 p. 1.01-1.47 'Makro' Handbuch Architektur Allplan, Nov. 1, 1996, pp. 1-71, XP002301600 (English Translation Provided).

Sutherland I. E. Ed—American Federation of Information Processing Societies: "Sketchpad a Man-Machine Graphical Communication System" Proceedings of the Spring Joint Computer Conference. Detroit, May 1963; [Joint Computer Conference], Baltimore, Spartan Books, US, 1963. vol. 23, May 1, 1963, pp. 329-346, XP009032646.

Nemetschek AG: "Neues in Version 16 (Excerpt: p. 111)", Allplan/Allplot V16, Jun. 2000, p. 111, Munich, Germany (English Translation Provided).

"Generative Components" by David Chadwick; CAD User, Jul./Aug. 2007; www.caduser.com.

"Digital Fabricators" by Michael Stacey, Philip Beesley and Vincent Hui; Cambridge Galleries Nov. 11, 2004-Jan. 30, 2005, in association with the AIA/ACADIA Fabricatiohn Conference 2004.

"Implementation Issues in Generative Design Systems"; First International Conference on Design Computing and Cognition, Workshop 3, Jul. 17, 2004; http://faculty.arch.usyd.edu.au/kcdc/conferences/dcc04/.

"A Constraint Based Approach for Design Support Systems" First International Conference on Design Computing and Cognition 2004; Workshop 5, Jul. 18, 2004; http//faculty.arch.usyd.edu.au/kcdc/conferences/dcc04/.

"Cognition and Computation in Digital Design", First International Conference on Design Computing and Cognition 2004; Workshop 6, Jul. 18, 2004; pp. 1-80.

"Virtual Words: Design and Research Directions", First International Conference on Design Computing and Cognition 2004; Workshop 7, Jul. 18, 2004; http//faculty.arch.usyd.edu.au/kcdc/conferences/dcc04/.

"Mental Conceptions of Emergent Spaces in Architectural Design", First International Conference on Design Computing and Cognition 2004; Workshop 8, Jul. 18, 2004; http//faculty.arch.usyd.edu.au/kcdc/conferences/dcc04/.

"Generic Naming in Generative, Constraint-Based Design" by Vasilis Capoyleas, Xianping Chen and Christoph M. Hofmann; first communicated as report CSD-TR-94-011, CAD28, Jan. 1996, 17-26.

David Marchiex and Guy Pierra: "A Survey of the Persistent Naming Problem", ACM Symposium on Solid and Physical Modeling Archive; Proceedings of the Seventh ACM Symposium on Solid Modelling Applications; Sarrbrücken, Germany; pp. 13-22; year of publication 2002; ISBN:1-58113-506-8.

"Three Ways to Grow Designs: A Comparison of Embryogenies for an Evolutionary Design Problem" by Peter Bentley and Sanjeev Kumar; Genetic and Evolutionary Computation Conference (GECCO '99), Jul. 14-17, 1999, Orlando, Florida USA, pp. 35-43. RN/99/2.

(Learning from Experience)2 Promises, Problems and Side-Effects of Case-Based Reasoning in Architectural Design, International Journal of Architectural Computing, Issue 01, 2003, pp. 60-71; http//www.asro.kuleuven.ac.be/CAADPUBS/files/11.pdf.

"Emergent Designer: An Integrated Research and Design Support Tool Based on Models of Complex Systems" by Rafal Kicinger, Tomasz Arciszewski and Kenneth De Jong, ITcom, vol. 10 (2005); published Dec. 2005 at http://www.itcon.org/2005/22/.

"A Graph-Constructive Approach to Solving Systems of Geometric Constraints" by Ioannis Fudos and Christoph M. Hoffmann, ACM Transactions on Graphics, vol. 16, No. 2, Apr. 1997, pp. 176-216.

"Instant Architecture" by Peter Wonka, Michael Wimmer, Francois Sillion and William Ribarsky, ACM Transactions on Graphics, vol. 22, No. 4, pp. 669-677; Jul. 2003.

"Geometric Modelling with Conical Meshes and Developable Surfaces" by Yang Liu, Helmut Pottmann, Johannes Wallner, Yong-Liang Yang and Wenping Wang; ACM Transactions on Graphics 25-03 (2006), pp. 681-689, Proc. SIGGRAPH.

"Generative Components"; first downloaded from the internet sometime in 2006.

"Introduction to Generative Components—A parametric and associative design system for architecture, building engineering and digital fabrication" by Dr. Robert Aish; downloaded from the Bentley website in Nov. 2007.

"A Feature-Based Solution to the Persistent Naming Problem" by R. Bidarra, P.J. Nyirenda and W.F. Bronsvoort; Computer-Aided Design & Applications, vol. 2, Nos. 1-4, 2005, pp. 517-526.

"Parametric Modeling in AutoCAD" by N.C. Katz; SOM website: www.som.com/resources/content/5/0/4/0/5/6/7/documents/SOM.com_ParametricModeling.pdf; first version published on AECbytes: www.aecbytes.com/viewpoint/2007/issue_32.html.

"Parametric Design. A Review and some Experiences" by J. Monedero; 15th eCAADe-Conference Proceedings Vienna University of Technology, Sep. 17-20, 1997; http://info.tuwien.ac.at/ecaade/proc/moneder/moneder.html.

"A Review of Object Oriented CAD Potential for Building Information Modelling and Life Cycle Management" by S.B. Garba and M.A. Hassanain (2004); e-Design in Architecture, Conference Proceedings, 1st ASCAAD International Conference, ISBN 9960-07-213-4, Dhahran, Saudi Arabia, pp. 343-359.

"Conceptual Design of High-Rises with Parametric Methods" by V. Gane and J. Haymaker (2007), Predicting the Future, 25th eCAADe Conference Proceedings, ISBN 978-0-9541183-6-5 Frankfurt, Germany, Sep. 26-29, 2007, pp. 293-301.

"Some Patterns for Parametric Modeling" by R. Woodbury, A. Kilian and R. Aish; ACADIA 2007 pp. 222-229. ACADIA, Oct. 2007.

Generative Components—Manual, Jan. 2008.

M. Khabazi, Algorithmic Modelling with Grasshopper, http://blog.rhino3d.com/2009/04/algorithmic-modelling-with-grasshopper.html, Apr. 1, 2009.

M. Emmerik et al., "Simplifying Interactive Design of Solid Models," The Visual Computer (1993) 9:239-254 Springer-Verlag 1993.

H. Whitehead, "Laws of Form", Kolarevic, Branko (editor); Architecture in the digital age; Taylor&Francis 2005 Chapter 7 'Laws of form': pp. 81-100.

Design Patterns, http://www.designpatterns.ca/, Sep. 3, 2009.

H. Pottmann et al., "Discrete Surfaces for Architectural Design," Curve and Surface Design: Avignon 2006 Patrick Chenin, Tom Lyche, and Larry L. Schumaker (eds.), pp. 213-234 Copyright 2007 by Nashboro Press, Brentwood, TN.

H. Pottmann et al., "Geometry of Architectural Freeform Structures," Internat. Math. Nachrichten Nr. 209 (2008), 15-28 2008 Österr. Math. Gesellschaft.

A. Schiftner, "Planar quad meshes from relative principal curvature lines," Diploma thesis Institute of Discrete Mathematics and Geometry, Vienna University of Technology, 2007.

Liang et al., "Conceptual Design System in a Web-Based Virtual Interactive Environment for Product Development," Int J Manuf Technol 30, pp. 1010-1020, 2006.

Laakko et al, "A Feature Definition Language for Bridging Solids and Features," 2nd ACM Solid Modeling, Montreal, Canada, 1993.

"Authorization and Access Control Technologies," http://technet.microsoft.com/en-us/library/cc782880(WS.10).aspx.

Xiangping Chen, Christoph M. Hoffmann, "On editability of feature-based design." Computer-Aided Design, 27: Dec. 1995; pp. 905-914.

Christoph M. Hoffmann, "Constraint-Based CAD." JCISE 5:3, 182-187.

Christoph M. Hoffmann and Robert Juan, "Erep—an editable, high-level representation for geometric design and analysis." In: P. Wilson, M. Wozny, and M. Pratt, (Eds), Geometric and Product Modeling, pp. 129-164, North Holland.

Jiri Kripac, "A mechanism for persistently naming topological entities in history based parametric solid models." Computer-Aided Design, 29(2):113-122.

Srinivas Raghothama, Vadim Shapiro, "Topological Framework for Part Families.", J. Comput. Inf. Sci. Eng.—Dec. 2002—vol. 2, Issue 4, 246 (10 pages).

Ari Rappoport, "Breps as displayable-selectable models in interactive design of families of geometric objects." In: Geometric Modeling: Theory and Practice, Strasser, Klein, Rau, (Eds), Springer-Verlag, 1997, pp. 206-225.

Ari Rappoport, "The Generic Geometric Complex (GGC): a modeling scheme for families of decomposed pointsets." Proceedings, Fourth ACM/Siggraph Symposium on Solid Modeling and Applications (Solid Modeling '97).

Shea et al., "Towards Integrated Performance-Driven Generative Design Tools", Automation in Construction 14, pp. 253-264, 2005.

Aish et al., "Multi-Level Interaction in Parametric Design," Smart Graphics, Lecture Notes in Computer Science, 2005, vol. 3638/2005, pp. 151-162.

Bentley Institute, "Bentley Platform Training, Generative Components Essentials," Sep. 2007/.

Capoyleas et al., "Generic Naming in Generative, Constraint Based Design", Computer Aided Design, vol. 28, No. 1, pp. 17-26, 1996.

Gossweiler et al., "DIVER: a Distributed Virtual Environment Research Platform", Proceedings of the IEEE 1993 Symposium on Research Frontier in Virtual Reality, Oct. 25-16, 1993.

Hanna et al., "Teaching Parametric Design in Code and Construction", Proceedings of 10th SIGraDi, Santiago de Chile, Chile, pp. 158-161.

Hsu et al., "A Constraint-based Manipulator Toolset for Editing 3D Objects", Solid Modeling, 1997.

Lourenco et al., "Constraint Solving for Direct Manipulation of Features", Artificial Intelligence for Engineering Design, Analysis and Manufacturing (2006) 20, pp. 369-382.

van Holland et al., "Feature Modeling for Assembly," Report 93-103, Delft University of Technology, 1993.

English Translation of FR2793926.

"Introduction to the Generative Modeling Language" by Sven Havemann, downloaded from http://www.cgv.tugraz.at/GenerativeModeling/Documents/.

D. G. Aliaga et al., "Style Grammars for Interactive Visualization of Architecture," IEEE Transactions on Visualization and Computer Graphics, vol. 13, Issue 4 (Jul. 2007), pp. 786-797.

R. Issa et al., Extract from http://grasshopper.rhino3d.com/—Grasshopper Scripting Gallery, Aug. 14, 2009.

A. Payne et al., Extract from http://grasshopper.rhino3d.com/—The Grasshopper Primer.

Various Website Extracts from http://grasshopper.rhino3d.com/.

D. Cline, "A Comparison of Tabular PDF Inversion Methods," Arizona State University, vol. 0 (1981), No. 0, pp. 1-6.

M. Cui et al., "A new image registration scheme based on curvature scale space curve matching," Visual Comput (2007) 23:607-618.

P. Karnick et al., "A Shape Grammar for Developing Glyph-based Visualizations," Computer Graphics Forum, vol. 0, (1981), No. 0, pp. 1-12.

S. Williams et al., "Tiamat: A Three-Dimensional Editing Tool for Complex DNA Structures."

J. Jang et al., "Appearance-Preserving View-Dependent Visualization," GVU Center, Georgia Institute of Technology.

S. Ali et al., "Compressed Facade Displacement Maps," IEEE Transactions on Visualization and Computer Graphics, vol. 15, No. 2, Mar./Apr. 2009.

D. Cline et al., "Dart Throwing on Surfaces," Eurographics Symposium on Rendering 2009, vol. 28 (2009), No. 4.

P. Wonka, "Occlusion Culling for Real-Time Rendering of Urban Environments," Technische Universitat Wien, Jun. 2001.

J. Bittner et al., "Fast Exact From-Region Visibility in Urban Scenes," Eurographics Symposium on Rendering (2005).

J. Hu et al., "Fourier Shape Descriptors of Pixel Footprints for Road Extraction From Satellite Images," 2004.

X. Yin et al., "Generating 3D Building Models from Architectural Drawings: A Survey," IEEE Computer Society, Jan./Feb. 2009.

D. Bhagvat et al., "GPU Rendering of Relief Mapped Conical Frusta," Computer Graphics Forum, vol. 0, (1981), No. 0, pp. 1-8, 2009.

P. Wonka et al., "Guided Visibility Sampling," pp. 1-9.

P. Wonka et al., "Instant Visibility," Eurographics 2001, vol. 20, No. 3 (2001), pp. 1-11.

B. Weber et al., "Interactive Geometric Simulation of 4D Cities," Eurographics 2009, vol. 28, No. 2, (2009), pp. 1-12.
G. Esch et al., "Interactive Procedural Street Modeling," one page.
G. Chen et al., "Interactive Procedural Street Modeling," ten pages.
M. Cui et al., "Interactive Hyperspectral Image Visualization Using Convex Optimization," pp. 1-12.
P. Wonka et al., "Occluder Shadows for Fast Walkthroughs of Urban Environments," Eurographics '99, vol. 18 (1999), No. 3, pp. 1-11.
O. Mattausch et al., "Optimized Subdivisions for Preprocessed Visibility," pp. 1-8.
J. Rovira et al., "Point Sampling with Uniformly Distributed Lines," Eurographics Symposium on Point-Based Graphics (2005), pp. 1-10.
M. Wimmer et al., "Point-Based Impostors for Real-Time Visualization," pp. 1-15.
P. Muller et al., "Procedural 3D Reconstruction of Puuc Buildings in Xkipche," The 7th International Symposium on Virtual Reality, Archaeology and Cultural Heritage, (2006), pp. 1-8.
B. Watson et al., "Procedural Urban Modeling in Practice," IEEE Computer Graphics and Applications, 28(3), pp. 18-26, 2008.
P. Muller et al., "Image-based Procedural Modeling of Facades," ACM SIGGRAPH 2007, pp. 1-9.
J. Jang et al., "Punctuated simplification of man-made objects," Visual Comput (2005), pp. 1-10.
P. Wonka et al., "Ray Tracing of Nonlinear Fractals," Technical University Vienna, pp. 1-9.
M. Wimmer et al., "Rendering Time Estimation for Real-Time Rendering," Eurographics Symposium on Rendering 2003, pp. 1-12.
J. Hu et al., "Road Network Extraction and Intersection Detection From Aerial Images by Tracking Road Footprints," IEEE Transactions on Geoscience and Remote Sensing, vol. 45, No. 12, Dec. 2007, pp. 4144-4157.
P. Karnick et al., "Route Visualization using Detail Lenses," IEEE Transactions on Visualization and Computer Graphics, pp. 1-13.
P. Muller et al., "Transformations in Architectural Design," Proceedings of the ACM SIGGRAPH 2005 Electronic Art and Animation Catalog, ACM Press, p. 299.
J. Bittner et al., "Visibility in Computer Graphics," Journal of Environment and Planning B: Planning and Design, pp. 729-725, vol. 30, No. 5, Sep. 2003.
J. Bittner et al., "Visibility Preprocessing for Urban Scenes Using Line Space Subdivision," In Proceedings of Pacific Graphics (PG'01), pp. 276-284, Tokyo, Japan, Oct. 2001.
S. Reddy et al., "Constraint management methodology for conceptual design tradeoff studies," Proceedings of the 1996 ASME Design Engineering Technical Conferences and Computers in Engineering Conference, Aug. 18-22, 1996, Irvine, California.
C. Rolland et al., "Modeling Goals and Reasoning with Them," Engineering and Managing Software Requirements; Chapter 9: "Modeling Goals and Reasoning with Them" pp. 189-217; Springer; 1 edition (Aug. 8, 2005).
D.T. Ross et al., "Structured Analysis for Requirements Definition," IEEE Transactions on software engineering, vol. SE-3, No. 1, Jan. 1977.
S. Takai et al., "Integrating Target Costing Into Perception-Based Concept Evaluation of Complex and Large-Scale Systems Using Simultaneous Decomposed QFD," Journal of Mechanical Design, vol. 128, Nov. 2006, pp. 1186-1195.
R. Woodbury et al., "Whither design space?", Artificial Intelligence for Engineering Design, Analysis and Manufacturing, vol. 20, 2006, pp. 63-82.
"Integrated Project Delivery: A Guide," The American Institute of Architects 2007, Version 1, www.aia.org/contractdocs/AIAS077630.
T. Oetiker et al., "The Not So Short Introduction to LATEX", Version 4.26, Sep. 25, 2008.
WYSIWYG Wikipedia Article, http://en.wikipedia.org/wiki/WYSIWYG.
G. Caprio, Design Patterns: Dependency Injection—MSDN Magazine, Sep. 2005, http://msdn.microsoft.com/sl-si/magazine/cc163739(en-us).aspx.
R. Stallman et al., GNU Make, A Program for Directing Recompilation, GNU make Version 3.81, Apr. 2006.
B. Collins-Sussman et al., Version Control with Subversion for Subversion 1.5 (Compiled from r3305), http://svnbook.red-bean.com/en/1.5/svn-book.pdf.
"How Security Descriptors and Access Control Lists Work," http://technet.microsoft.com/en-us/library/cc781716(WS.10).aspx.
H. Pottmann et al., "Geometry of Multi-layer Freeform Structures for Architecture," Int. Mathematische Nachrichten 209 (2008), 15-28.
H. Pottmann et al., "The focal geometry of circular and conical meshes," Adv. Comp. Math 29 (2008), 249-268.
Y. Liu et al., "Geometric Modeling with Conical Meshes and Developable Surfaces," ACM Transactions on Graphics 25/3 (2006), 681-689, Proc. SIGGRAPH.
W. Wang et al., "An angle criterion for conical mesh vertices," Journal for Geometry and Graphics 11 (2007), 199-208, Heldermann Verlag 2007.
J. Wallner, "Computing quadrilateral and conical meshes," Discrete differential geometry, vol. 3 of Oberwolfach Reports 2006, Abstracts from the workshop held Mar. 6-10, 2006.
H. Pottmann et al., "Principal curvatures from the integral invariant viewpoint," Computer Aided Geometric Design, vol. 24, Issue 8-9 (Nov. 2007), pp. 428-442.
R. Bidarra et al., "Validity Maintenance of Semantic Feature Models," Fifth ACM Symposium on Solid Modeling, 1999; Proceedings of the fifth ACM symposium on Solid modeling and applications table, pp. 85-96.
P. Muller et al., "Procedural Modeling of Buildings," International Conference on Computer Graphics and Interactive Techniques, Boston, Massachusetts, ACM SIGGRAPH 2006 Papers, Session: Shape modeling and textures, pp. 614-623.
P. Wonka et al., "Instant Architecture," International Conference on Computer Graphics and Interactive Techniques, San Diego, California, ACM SIGGRAPH 2003 Papers, Session: Modeling and simplification, pp. 669-677.
Y. I H Parish, "Procedural Modeling of Cities," International Conference on Computer Graphics and Interactive Techniques, Proceedings of the 28th annual conference on CGIT, pp. 301-308, Year of Publication: 2001.
J. Heisserman et al., "Generating Languages of Solid Models," ACM Symposium on Solid and Physical Modeling Proceedings on the second ACM symposium on Solid modeling and applications, Montreal, Quebec, Canada, pp. 103-112, Year of Publication: 1993.
M. Lipp et al., "Interactive Visual Editing of Grammars for Procedural Architecture," International Conference on Computer Graphics and Interactive Techniques, Los Angeles, California, ACM SIGGRAPH 2008 papers, Session: Procedural modeling & design,Article No. 102.
P. Wonka et al., "Visibility Preprocessing with Occluder Fusion for Urban Walkthroughs," Vienna University of Technology, pp. 1-12.
K. Zhou, "Visibility-driven Mesh Analysis and Visualization through Graph Cuts," (2008), pp. 1-8.
P. Wonka et al., "Urban Design and Procedural Modeling," SIGGRAPH 2007, pp. 1-229.
Extracts from www.procedural.com Aug. 27, 2009.
O. Akin, "Variants in Design Cognition," Design Knowing and Learning: Cognition in Design Education, pp. 105-124, Elsevier Science, 1 edition (Feb. 22, 2001).
D-Z Chen et al., "A Methodology for Conceptual Design of Mechanisms by Parsing Design Specifications," Journal of Mechanical Design, Nov. 2005, vol. 127 / pp. 1039-1044.
P. Ellis et al., "Automated mulivariate optimization tool for energy analysis," Proceedings of SimBuild 2006, MIT, Cambridge, MA, pp. 1-7.
V. Gane et al., "Benchmarking Conceptual High-rise Design Processes," CIFE Technical Report #TR174 Oct. 2008, Stanford University, pp. 1-43.
G. Goldschmidt, "Quo vadis, design space explorer?" Artificial IntelligenceArtificial Intelligence for Engineering Design, Analysis and Manufacturing, vol. 20, Issue 2 (Apr. 2006), Special Issue: Design Spaces: The Explicit Representation of Spaces of Alternatives, pp. 105-111.
J. Haymaker et al., "Coordinating goals, preferences, options, and analyses for the Stanford Living Laboratory feasibility study," Intelligent Computing in Engineering and Architecture 13th EG-ICE Revised Selected Papers, Lecture Notes in Computer Science, vol. 4200/2006, Ian Smith (ed.), Springer-Verlag, Berlin, Heidelberg, New York, pp. 320-327.

W. Hsu et al., "Current research in the conceptual design of mechanical products," Computer Aided Design ISSN 0010-4485, 1998, vol. 30, No. 5, pp. 377-389 (105 ref.) Elsevier Science, Oxford, Royaume-Uni (1968).

Y. Jin et al., "Value aggregation for collaborative design decision making," Decision Making in Engineering Design, Chapter 24; pp. 291-300 "Value Aggregation for Collaborative Design Decision Making" American Society of Mechanical Engineers; illustrated edition (Oct. 30, 2006).

R. Keeney et al., "Practical Value Models," Advances in Decision Analysis New York: Cambridge; Chapter: Part IV/13: "Practical Value Models", pp. 232-252.

E. Kinzel et al., "Function generation with finitely seperated precision points using geometric constraint programming," Journal of Mechanical Design, Nov. 2007, vol. 129, Issue 11, pp. 1185-1191.

A. Kiviniemi et al., "PREMISS—Requirements Management Interface to Building Product Models: Problem Definition and Research Issues," CIFE Working Paper #092, Oct. 2004, Stanford University.

T. Knight, "Shape grammars in education and practice: history and prospects," only available online: http://www.mit.edu/~tknight/IJDC/.

R. Krishnamurti, "Explicit design space?" Artificial Intelligence for Engineering Design, Analysis and Manufacturing 2006, 20, pp. 95-103 Cambridge University Press.

A. Van Lamsweerde, "Requirements Engineering in the Year 00: A Research Perspective," Artificial Intelligence for Engineering Design, Analysis and Manufacturing vol. 20, 2006, pp. 95-103.

M. Leary et al., "Enhancing the quality function deployment conceptual design tool," Journal of mechanical Design vol. 129, Jul. 2007, pp. 701-708.

Mark Birbeck; "Professional XML 2nd Edition, Chapter 8: Navigating XML—Xpath", 2001 Wrox Press.

Mark Birbeck; "Professional XML 2nd Edition, Chapter 9: Transforming XML.", 2001 Wrox Press.

Mark Birbeck; "Professional XML 2nd Edition, Chapter 11: The Document Object Model", 2001 Wrox Press.

CATIA Knowledge Expert, CATIA version 5.14.

CATIA Product Knowledge Template, CATIA version 5.14. p. 1-282 Managing Power Copies, p. 18-33, Managing User Features (UDFs), p. 34-69, Product Knowledge Template, p. 70-95, Scripting language, p. 110-233.

CATIA Product Function Definition, CATIA version 5.14.

CATIA Infrastructure User Guide, CATIA version 5.14.

CATIA Generative Shape Design and Optimizer, CATIA version 5.14—Managing PowerCopies, p. 1-792.

CATIA Knowledge Advisor, CATIA version 5.14—p. 1-461 Storing a Design Table in a PowerCopy, p. 154-158, Using Rules and Checks in a PowerCopy, p. 172-173, Creating a PowerCopy Containing a Loop, p. 303-311.

CATIA Part Design, CATIA version 5.14—Using PowerCopies, p. 1-617.

CATIA Functional Molded Part, CATIA version 5.14—PowerCopy, p. 1-245.

Bittner, Mattausch, Wonka, Havran and Wimmer; "Adaptive Global Visibility Sampling", ACM Transactions on Graphics. vol. 28, No. 3, pp. 1-10, 2009. (Proceedings of SIGGRAPH 2009).

Ji Liu, Przemyslaw Musialski, Peter Wonka, Jieping Ye; "Tensor Completion for Existing Missing Values in Visual Data", ICCV (accepted). 2009.

M. Cui, J. Femiani, J. Hu, P. Wonka, A. Razdan; "Curve Matching for Open 2D Curves", Pattern Recognition Letters. vol. 30, No. 1, pp. 1-10. 2009.

Peter Wonka, "Procedural Modeling of Architecture", Course Procedural Modeling of Urban Environments, pp. 17-83, SIGGRAPH 2006.

Eric Hanson, Urban Modeling in Visual Effects, Course Procedural Modeling of Urban Environments, pp. 84-136, SIGGRAPH 2006.

Neil Eskuri, Urban Modeling in the Game Industry, Course Procedural Modeling of Urban Environments, pp. 137-138, SIGGRAPH 2006.

Pascal Muller, "Procedural Modeling of Cities", Course Procedural Modeling of Urban Environments, pp. 139-184, SIGGRAPH 2006.

Watson, Benjamin, "Modeling Land Use with Urban Simulation", Course Procedural Modeling of Urban Environments, pp. 185-251, SIGGRAPH 2006.

Office Action received in U.S. Appl. No. 12/124,041, mailed Nov. 21, 2011.

|   |   |   |
|---|---|---|
| 1 ○ | 1 ○ INDEX: 1<br>NAME: BASE 1<br>LEVEL: CENTERS<br>COLOR: 0 | 1 ○ INDEX: 1<br>NAME: BASE 1<br>LEVEL: CENTERS<br>COLOR: 0 |
| 2 ○ | 2 ○ INDEX: 2<br>NAME: BASE 2<br>LEVEL: CENTERS<br>COLOR: 0 | 2 ○ INDEX: 2<br>NAME: BASE 2<br>LEVEL: CENTERS<br>COLOR: 0 |
| 3 ○ | 3 ○ INDEX: 3<br>NAME: BASE 3<br>LEVEL: CENTERS<br>COLOR: 0 | 3 ○ INDEX: 3<br>NAME: BASE 3<br>LEVEL: CENTERS<br>COLOR: 0 |
| 4 ○ | 4 ○ INDEX: 4<br>NAME: BASE 4<br>LEVEL: CENTERS<br>COLOR: 0 | 4 ○ INDEX: 4<br>NAME: BASE 4<br>LEVEL: CENTERS<br>COLOR: 0 |
| 5 ○ | 5 ○ INDEX: 5<br>NAME: BASE 5<br>LEVEL: CENTERS<br>COLOR: 0 | 5 ○ INDEX: 5<br>NAME: BASE 5<br>LEVEL: CENTERS<br>COLOR: 0 |
| 6 ○ | 6 ○ INDEX: 6<br>NAME: BASE 6<br>LEVEL: CENTERS<br>COLOR: 0 | 6 ○ INDEX: 6<br>NAME: BASE 6<br>LEVEL: CENTERS<br>COLOR: 0 |
| 7 ○ | 7 ○ INDEX: 7<br>NAME: BASE 7<br>LEVEL: CENTERS<br>COLOR: 0 | 7 ○ INDEX: 7<br>NAME: BASE 7<br>LEVEL: CENTERS<br>COLOR: 0 |
| 8 ○ | 8 ○ INDEX: 8<br>NAME: BASE 8<br>LEVEL: CENTERS<br>COLOR: 0 | 8 ○ INDEX: 8<br>NAME: BASE 8<br>LEVEL: CENTERS<br>COLOR: 0 |
| FIG. 14a | FIG. 14b | FIG. 14c |

CREATION ORDER ↓ (between FIG. 14b and FIG. 14c)

METHOD AND APPARATUS FOR COMPUTER-AIDED DESIGN OF THREE-DIMENSIONAL OBJECTS TO BE FABRICATED

CROSS-REFERENCE TO RELATED APPLICATIONS

This application is a continuation of and claims priority under 35 U.S.C. §120 to U.S. application Ser. No. 12/124,008, filed May 20, 2008 now U.S. Pat. No. 8,103,484, entitled "METHOD AND APPARATUS FOR COMPUTER-AIDED DESIGN OF THREE-DIMENSIONAL OBJECTS TO BE FABRICATED," which application claims the right of priority under 35 U.S.C. §119 based on European patent application numbers EP 07 010 053.2 filed on 21 May 2007 and EP 08 006 353.0 filed on 31 Mar. 2008 which are hereby incorporated by reference herein in their entirety as if fully set forth herein.

BACKGROUND (1) Field of Invention

The present invention relates to the field of computer-aided design apparatus, and more particularly, to apparatus for the design of three-dimensional objects to be fabricated. The invention is particularly applicable to the design of complex objects made up of over 5,000 constituent parts.

(2) Discussion of Related Art

There are many examples of fabricated objects, such as urban agglomerations, buildings and building complexes, industrial plants and power generating plants, transport terminals, oil rigs, aeroplanes, cars, trucks and trains, ships, satellites and spaceships, micro-chips, nanotechnology structures, etc. These objects are fabricated by assembling together small units that in turn become parts to larger components. Fitting them together involves complex interrelations of a great amount of individual shapes. Furthermore, the fitting together of components involves complex physical interactions which are dependent not only on the components themselves, but also the topology of the overall structure and the relative positions which the components occupy within this topology.

Existing computer-aided design systems for fabricated objects require the user to create constituent components of the design in design files which for historical reasons emulate the traditional design techniques that served the bottom-up approach to building construction.

Components from the design file are then exported into an overall space for the model, where each component is manually placed into position so that the components fit together and generate the topology of the overall model.

Accordingly, the design, placement and fitting of components are separate tasks in existing systems.

By way of example, "Interactive Design of 3D Models With Geometric Constraints" by van Emmerik MJGM in The Visual Computer, Springer-Verlag, volume 7, 1991, pages 309-325, XP009088118, presents an interactive graphical approach for the design of parameterized part-hierarchies. Primitive solids can be grouped into compound objects, and multiple instances of a compound object can be used in further designs. Geometric relations between primitives and instances are specified by geometric constraints between their local coordinate systems.

These systems suffer from a number of problems, however. In particular, considerable effort and time is required on the part of the user to create the design in an existing system. This defeats the purpose of computer support. For example, variations in the components can only be introduced by redesigning components in the design files and then placing them manually to recreate the overall model. Also, the consistency of such designs relies upon the designer's ability to check for and iron out inconsistencies (such as objects which encroach upon each other—that is, they occupy the same space). How real this problem is shown by the fact that most existing systems provide so called 'interference checking' devices to check for inconsistencies such as encroaching objects.

Such systems have therefore forced designers to create regular-shaped fabricated objects, using repeatable design patterns and compositions of copies of the same components, to the detriment of functionality, all while the demand for increasingly articulate and diversified large fabricated objects grows rapidly. In fact so great is the problem, that any small improvement in the design process which reduces the problem is hailed as a breakthrough.

A further problem is that a building component manufactured according to a design from a system which designs, places and fits the components as separate tasks is often not consistent with the huge amount of other components that are to form the fabricated object. As a result, skill-intensive labour is required to fit the components together.

Experience of using components manufactured from a design created by existing systems has given rise to the commonly held belief that it is sometimes quicker and cheaper to fine tune the fittings of components on site (or return them to the factory for adjustment) than to spend the time that is required by existing design systems to design components that will fit without adjustment. Waywardly, the responsibility for fitting of components is thus passed from the designer to the builder. This particular problem in the design and construction of buildings defeats the fundamental purpose of design which is that it should be complete and consistent before the fabrication stage. With the growing relevance of information technology, completeness and consistency become requirements in rigorous (logical) terms. This makes the problem even more acute.

For the same reasons, the synergy of industrial production of components, relying on numerically controlled machines and robots in production lines is hugely underemployed in building construction. The cost of building components is out of step with the cost of other industrial products that are no different in terms of materials used or energy consumed in their production.

SUMMARY OF INVENTION

The present invention aims to address one or more of the problems with existing computer-aided design systems.

In particular, the present invention aims to address the problem of how to provide an apparatus for the design of a complex three-dimensional object without using a design file environment but which enables the user to generate the design so that it is rich in variations of topology and/or content.

According to the present invention, there is provided an apparatus for the design of a three-dimensional object, comprising:

a coordinate system generator operable to generate a plurality of coordinate systems; and a feature generator operable to generate at least one respective further feature in each coordinate system using at least one mathematical function having a variable identifying the different coordinate systems, such that the mathematical function introduces variations in accordance with the value of the variable from coordinate system to coordinate system of at least one of the positions of the further features relative to their containing coordinate system, and the orientations of the further features relative to their containing coordinate system.

The present invention also provides a method of generating a design for a three-dimensional object to be fabricated using a computer-aided design apparatus, the method comprising:

generating a plurality of bases, each base comprising a local coordinate system; and generating a respective further feature for the design in the local coordinate system of each base such that at least one of the positions and orientations of the further features relative to their local coordinate systems changes, the further features being generated using at least one mathematical function having a base identification number identifying the respective bases as a variable of the function, such that each further feature has at least one of a position and orientation relative to the local coordinate system of the base in which it is located which depends upon the value of the base identification number thereof.

As a result of these features, variations in the positions and/or orientations of the further features relative to their containing local coordinate system can be introduced throughout the design in accordance with the changing value of the local coordinate system identifier used as a variable in the mathematical function(s). Consequently, the user does not have to introduce the variations by positioning and/or orientating each further feature manually.

The present invention also provides a computer program product, embodied for example as a storage medium storing computer program instructions or other physical product carrying computer program instructions, for configuring a programmable apparatus as an apparatus having the features set out above.

According to one aspect, a computer-aided design apparatus for the design of three-dimensional objects to be fabricated is provided. According to one embodiment, the apparatus comprises a processor and a computer usable medium having computer readable program instructions embodied therein, the computer readable program instructions executable by the processor to so as to provide a base generator operable to generate a plurality of bases in a reference coordinate system, each base comprising a local coordinate system, and a feature generator operable to generate a respective further feature for the design in the local coordinate system of each base in accordance with at least one mathematical function having base identification numbers representative of the respective bases as a variable of the function, such that each further feature has at least one of a position and orientation relative to the local coordinate system of the base in which it is located which depends upon the value of the base identification number thereof and such that at least one of the positions and orientations of the further features relative to their local coordinate systems changes in accordance with the values of the base identification numbers.

According to one embodiment, the base identification numbers representative of the plurality of bases correspond to the order of creation of the bases. According to one embodiment, each respective further feature has a unique feature identification number, and the feature generator is operable to generate the further features using at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

According to one embodiment, the feature generator is operable to generate a plurality of respective further features in the local coordinate system of each base in accordance with the at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

According to one embodiment, the feature generator is operable to generate a plurality of groups of further features in accordance with the at least one mathematical function, each respective group of further features being located in the local coordinate system of a different base and each further feature having a unique feature identification number, and wherein the at least one mathematical function has the base identification numbers and also the feature identification numbers as variables of the function(s) such that each group of further features has at least one of a position and orientation relative to the local coordinate system of the base in which it is located which depends upon the value of the base identification number thereof and each further feature has at least one of a position and orientation within the group to which it belongs which depends upon the feature identification number of the feature.

According to one embodiment, the feature generator is operable to generate the further features in accordance with a first mathematical function having the base identification numbers as a variable thereof and a second mathematical function having the feature identification numbers as a variable thereof. According to one embodiment, the apparatus further comprises a transformation controller operable to transform at least some of the further features in accordance with a mathematical transformation dependent upon the base identification numbers such that the further features are transformed differently in dependence upon the values of the base identification numbers of their corresponding bases. According to one embodiment, the base generator is operable to generate each of the plurality of bases before the feature generator generates any of the further features.

According to one embodiment, the feature generator is operable to generate further features comprising bases, each base comprising a local coordinate system. According to one embodiment, the feature generator is operable to generate further features comprising content objects.

According to one aspect, a method of designing a three-dimensional object with a computer-aided design apparatus comprising a processor, a display, and a computer usable medium having computer readable program instructions embodied therein, the computer readable program instructions executed by the processor to implement the method is provided.

According to one embodiment, the method comprises generating, with the computer-aided design apparatus, a plurality of bases in a reference coordinate system, each base comprising a local coordinate system, and generating, with the computer-aided design apparatus, a respective further feature for the design in the local coordinate system of each base in accordance with at least one mathematical function having base identification numbers representative of the respective bases as a variable of the function, such that each further feature has at least one of a position and orientation relative to the local coordinate system of the base in which it is located which depends upon the value of the base identification number thereof and such that at least one of the positions and orientations of the further features relative to their local coordinate systems changes in accordance with the values of the base identification numbers, and displaying a three-dimensional object representative of the generated bases and features.

According to one embodiment, the base identification numbers of the plurality of bases correspond to the order of creation of the bases. According to one embodiment, each respective further feature has a unique feature identification number, and the further features are generated using at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

According to one embodiment, a plurality of respective further features are generated in the local coordinate system of each base in accordance with the at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

According to one embodiment, a plurality of groups of further features are generated in accordance with the at least one mathematical function, each respective group of further features being located in the local coordinate system of a different base and each further feature having a unique feature identification number, and wherein the at least one mathematical function has the base identification numbers and also the feature identification numbers as variables of the function(s) such that each group of further features has at least one of a position and orientation relative to the local coordinate system of the base in which it is located which depends upon the value of the base identification number thereof and each further feature has at least one of a position and orientation within the group to which it belongs which depends upon the feature identification number of the feature.

According to one embodiment, the further features are generated in accordance with a first mathematical function having the base identification numbers as a variable thereof and a second mathematical function having the feature identification numbers as a variable thereof. According to one embodiment, the method further comprises transforming at least some of the further features in accordance with a mathematical transformation dependent upon the base identification numbers such that the further features are transformed differently in dependence upon the values of the base identification numbers of their corresponding bases.

According to one embodiment, each of the plurality of bases is generated before any of the further features are generated. According to one embodiment, the further features comprise bases, each base comprising a local coordinate system. According to one embodiment, the further features comprise content objects. According to one embodiment, the method further comprises an act of modifying at least one of the generated bases and features, and wherein the act of displaying the three-dimensional object includes displaying the three-dimensional object representative of the generated bases and features and the at least one of the modified bases and features. According to one embodiment, the method further comprises an act of modifying at least one of the generated bases and features, and wherein the act of displaying the three-dimensional object includes displaying the three-dimensional object having any modifications of the at least one of the modified bases and features.

According to one aspect, a non-transitory computer usable medium having computer readable program instructions embodied therein, the computer readable program instructions adapted to be executed to implement a method for operating a computer to design a three-dimensional object to be fabricated is provided. According to one embodiment, the method comprises generating a plurality of bases in a reference coordinate system, each base comprising a local coordinate system, and generating a respective further feature for the design in the local coordinate system of each base in accordance with at least one mathematical function having base identification numbers representative of the respective bases as a variable of the function, such that each further feature has at least one of a position and orientation relative to the local coordinate system of the base in which it is located which depends upon the value of the base identification number thereof and such that at least one of the positions and orientations of the further features relative to their local coordinate systems changes in accordance with the values of the base identification numbers.

According to one embodiment, the computer readable program instructions are such that the base identification numbers representative of the plurality of bases correspond to the order of creation of the bases. According to one embodiment, the computer readable program instructions are such that each respective further feature has a unique feature identification number, and the further features are generated using at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

According to one embodiment, the computer readable program instructions are such that a plurality of respective further features are generated in the local coordinate system of each base in accordance with the at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature. According to one embodiment, the computer readable program instructions are such that a plurality of groups of further features are generated in accordance with the at least one mathematical function, each respective group of further features being located in the local coordinate system of a different base and each further feature having a unique feature identification number, and wherein the at least one mathematical function has the base identification numbers and also the feature identification numbers as variables of the function(s) such that each group of further features has at least one of a position and orientation relative to the local coordinate system of the base in which it is located which depends upon the value of the base identification number thereof and each further feature has at least one of a position and orientation within the group to which it belongs which depends upon the feature identification number of the feature.

According to one embodiment, the computer readable program instructions are such that the further features are generated in accordance with a first mathematical function having the base identification numbers as a variable thereof and a second mathematical function having the feature identification numbers as a variable thereof. According to one embodiment, the computer readable program instructions when executed further cause the computer to transform at least some of the further features in accordance with a mathematical transformation dependent upon the base identification numbers such that the further features are transformed differently in dependence upon the values of the base identification numbers of their corresponding bases.

According to one embodiment, the computer readable program instructions are such that each of the plurality of bases are generated before generation of any of the further features. According to one embodiment, the further features are generated comprising bases, and wherein each base comprises a local coordinate system. According to one embodiment, the computer readable program instructions are such that the further features are generated comprising content objects.

BRIEF DESCRIPTION OF THE DRAWINGS

Embodiments of the present invention will now be described, by way of example only, with reference to the accompanying drawings, in which:

FIGS. 14a, 14b and 14c illustrate the addition of attributes and connections to a graph for the model at step S400 in the first round of processing;

DETAILED DESCRIPTION

Figure 1:
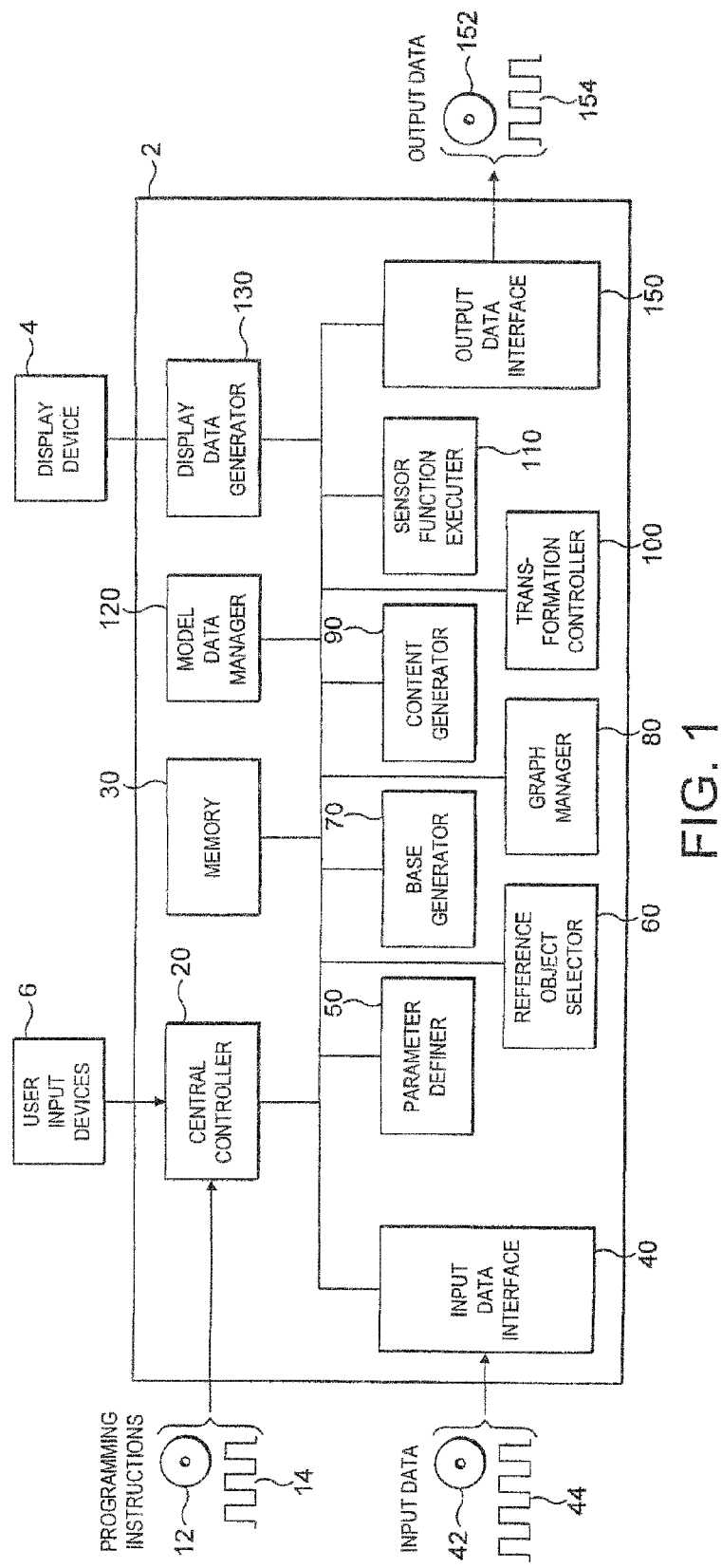
FIG. 1 schematically shows the components of an embodiment of the invention, together with the notional functional processing units into which the processing apparatus component may be thought of as being configured when programmed by computer program instructions.

Referring to FIG. 1, an embodiment of the invention comprises a programmable processing apparatus 2, such as a personal computer (PC), containing, in a conventional manner, one or more processors, memories, graphics cards etc, together with a display device 4, such as a conventional personal computer monitor, and user input devices 6, such as a keyboard, mouse etc.

The processing apparatus 2 is programmed to operate in accordance with programming instructions input, for example, as data stored on a data storage medium 12 (such as an optical CD ROM, semiconductor ROM, magnetic recording medium, etc), and/or as a signal 14 (for example an electrical or optical signal input to the processing apparatus 2, for example from a remote database, by transmission over a communication network (not shown) such as the Internet or by transmission through the atmosphere), and/or entered by a user via a user input device 6 such as a keyboard.

As will be described in more detail below, the programming instructions comprise instructions to program the processing apparatus 2 to become configured to generate data defining a three-dimensional computer model of a design for a three-dimensional object to be fabricated. The design model comprises bases and content objects. Each base is a local coordinate system and acts as "place-holder" to accept further bases and/or content objects.

Figures 13A, 13B, 13C, 13D:
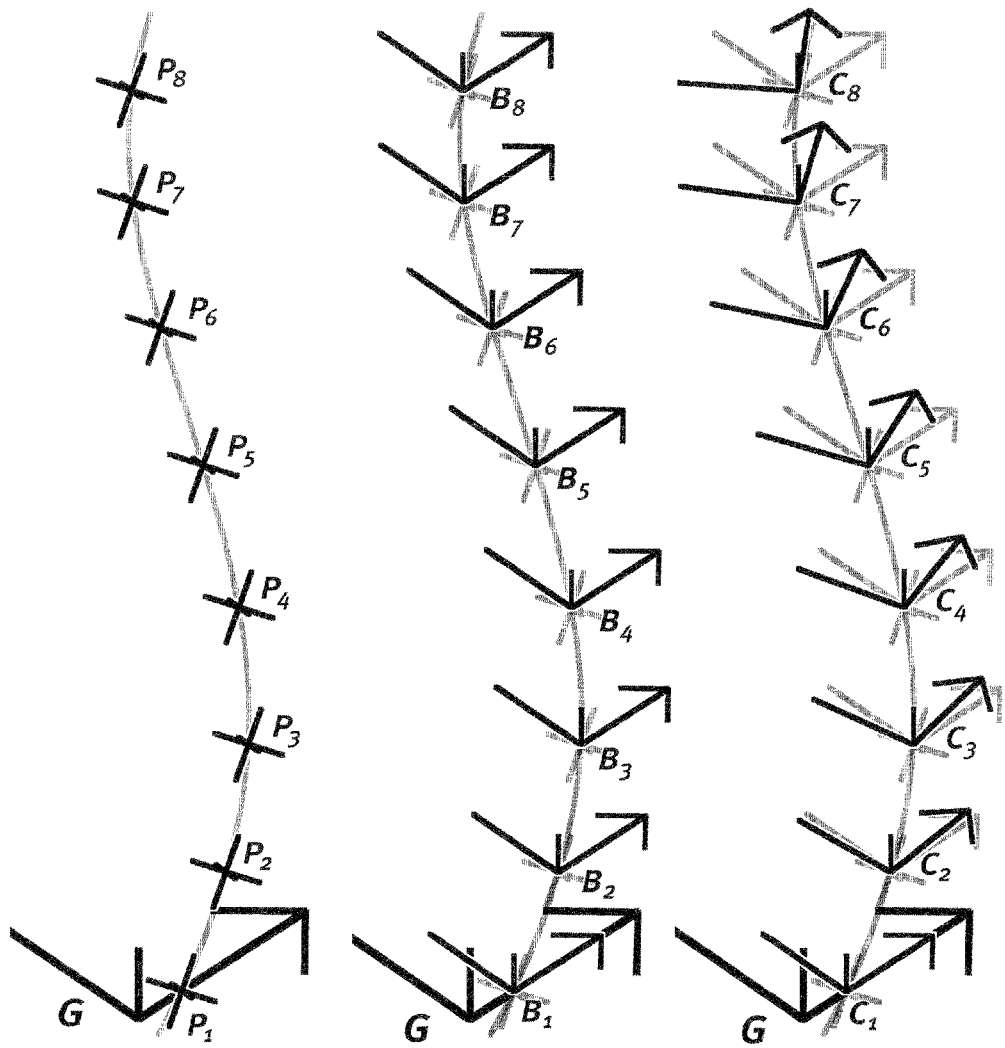
FIGS. 13a, 13b, 13c and 13d show an example to illustrate the generation of backbone bases at step S300 during the first round of processing to generate a design model.

Referring to FIG. 13d, the programmed apparatus is operable to generate a plurality of first-generation bases $C_1$-$C_8$. Each base comprises a local coordinate system, and in this embodiment, the bases are positioned and orientated in accordance with at least one mathematical function (although this could be done by a user).

Figure 18:
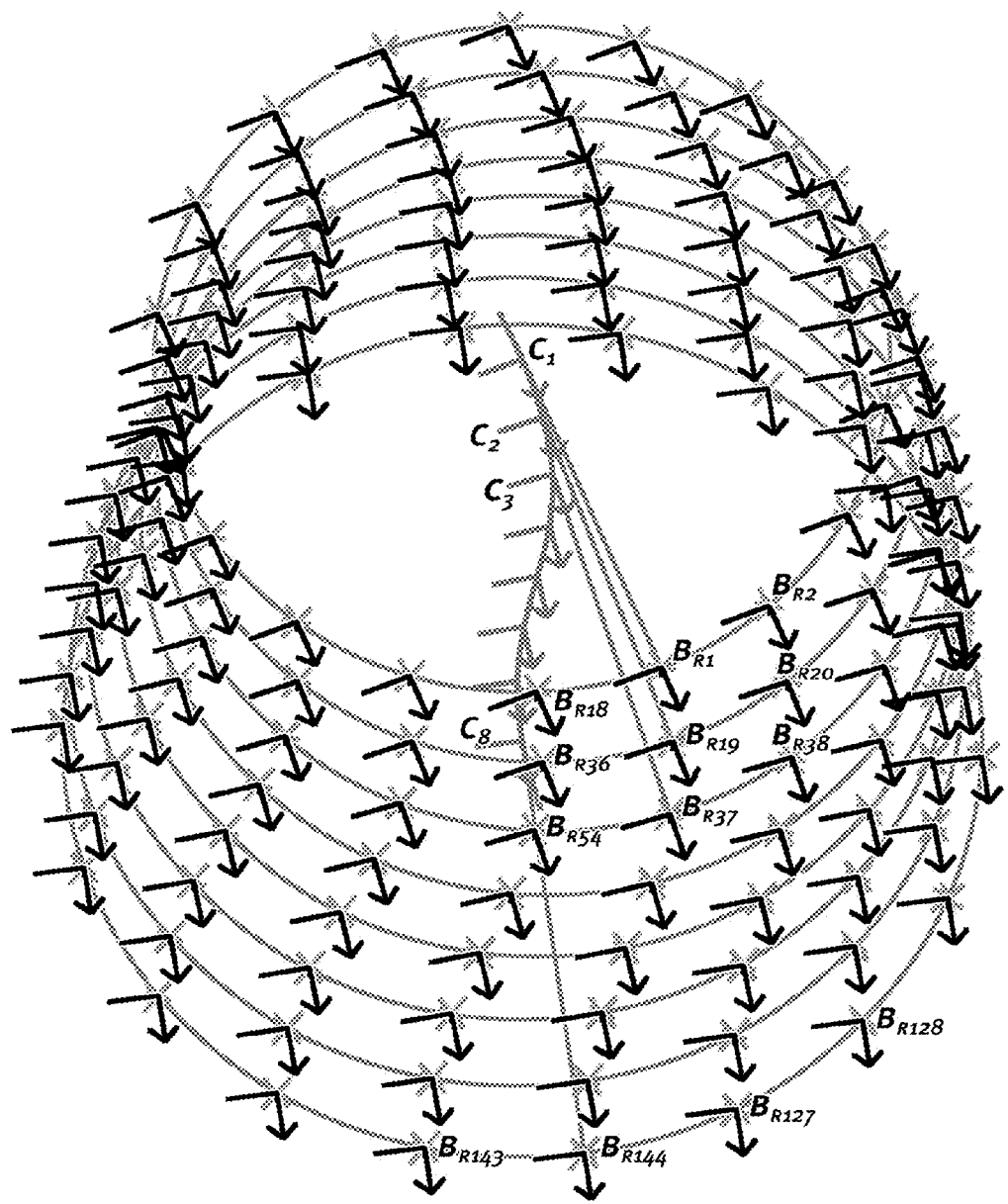

Referring to FIG. 18, the apparatus is then operable to generate second-generation bases $B_{R1}$-$B_{R144}$ with a respective plurality of these second-generation bases located in a group in the local coordinate system of each first generation base. Each second-generation base comprises a local coordinate system, and the positions and/or orientations of the second-generation bases are defined in accordance with at least one mathematical function having the identities of the first generation bases as a variable thereof, with the result that each second-generation base has a position and/or orientation relative to the first-generation base in which it is located which depends upon that first-generation base. In this way, the positions and/or orientations of the second-generation bases relative to their containing first-generation base change in each first-generation base in accordance with the mathematical function(s).

Thus, in the example of FIG. 18, the second-generation bases have positions on circles around the first-generation bases such that 18 second-generation bases are located in a group in the coordinate system of each first generation base. The radii of the circles (and therefore the positions of the second-generation bases relative to the origin of the containing first-generation base) are defined in accordance with a mathematical function such that the radius of the circle is different for each first generation base. As a result of this feature, variations in the positions and/or orientations of the second-generation bases can be introduced throughout the model in accordance with the defining mathematical function(s), without the user having to introduce the variations by positioning and/or orientating each second-generation base manually.

Data defining the bases is stored in a graph. More particularly, for each base, base data defining the base is stored as a respective vertex in the graph, and connection data defining interconnections between the bases is stored as directed edges between the vertices in the graph. Thus, referring to FIGS. 23 and 24, base data is stored for each base which defines the base itself, and connection data is stored which defines the adjacent bases within the same group (defined by the "NEXT" and "PREV" directed edges), and the corresponding bases in the adjacent groups (defined by the "to" and "from" directed edges). In this way, intra-group connections and inter-group connections are stored linking the bases together.

The arrangement of bases in groups and the storage of base data and connection data as described above provides a number of important advantages. In particular, the relative positions of the bases can be tracked in a reliable and efficient way even for a complex design. As a result, bases having required relationships for the addition of a further base or a further content object can be readily identified.

Furthermore, the stored base data and connection data can be used to define bases within a mathematical function. For example, bases to be used in a mathematical procedure can be defined by defining a start base and then defining bases relative thereto using the "NEXT", "PREV", "to" and "from" connections. As a result, it is not necessary to specify each base to be used by its base index value. This again provides particularly important advantages in a complex design with many bases.

The apparatus may add further generations of bases and/or content objects to the model in accordance with mathematical functions or procedures. In particular, the apparatus is operable to add each generation of bases or content objects such that a property thereof varies in accordance with the identity of the existing base in which the new base/content object is placed.

However, one problem which arises in a complex model is how to determine the positions at which the bases and/or content objects should be added bearing in mind the large number of bases within the complex design. To address this problem, functionality is provided to identify bases having a required relationship for the addition of a further base or content object. As a result of this functionality, the locations for new bases and/or content objects can be determined rapidly without considerable effort on the part of the user.

Figure 30A:
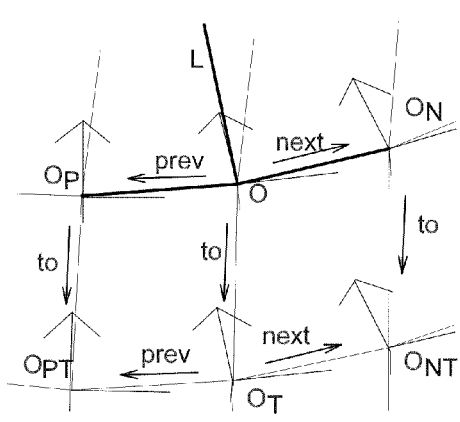
FIGS. 30a, 30b, 30c, 30d, 31a and 31b show an example to illustrate the creation of new content objects at step S700 in the second round of processing.
Figure 30C:
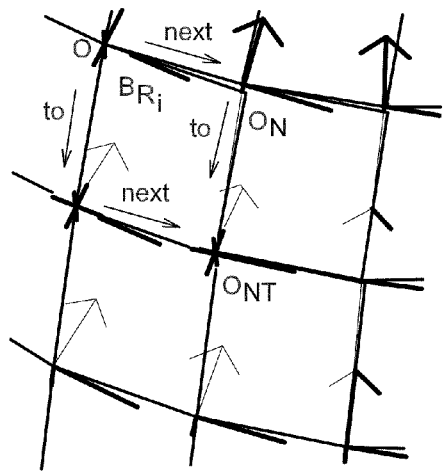
Figure 30B:
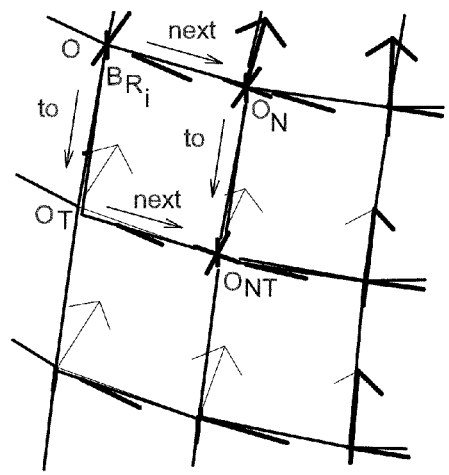
Figure 30D:
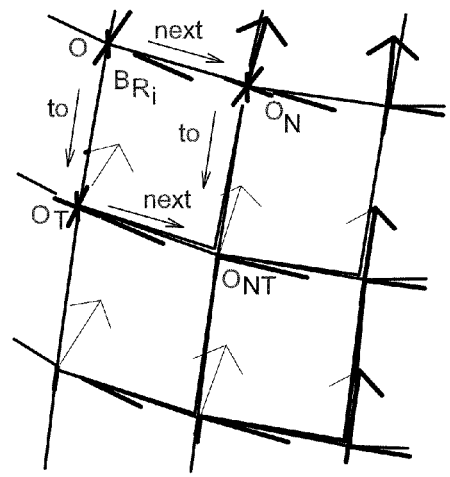

FIGS. 30b-30d illustrate the generation of a content object comprising a plane in the local coordinate system of each second-generation base. The plane is defined by a mathematical procedure which is the same for each second-generation base but which depends upon the relative positions of a plurality of adjacent second-generation bases. Accordingly, because the relative positions of the second-generation bases change throughout the model (because their positions depend upon the identity of their corresponding first-generation base as described above), the planes also change throughout the model (even though they were defined by the same mathematical procedure).

The apparatus is operable to generate content objects in adjacent bases using a mathematical procedure which is dependent upon the positions and orientations of the adjacent bases so that the content objects fit together. For example, referring to FIGS. 31a and 31b, the apparatus is operable to generate adjacent solid objects $W_i$ and $W_N$ by a procedure which constructs planes that are defined in dependence upon the positions and orientations of the adjacent bases $B_{Ri}$, $B_N$, $B_{NN}$, $B_T$, $B_{NT}$ and $B_{NNT}$. By constructing content objects in this way, the apparatus is operable to generate content objects throughout a generation of bases using the same procedure such that the content objects vary in accordance with the variations of the bases but still fit together without gaps or overlaps.

The apparatus is therefore operable to generate a model such that the process is staged into sequential generations of bases, where denser placements of bases follow from earlier sparser generations. In this way, the bases have a "tree" structure.

Because bases are positioned and orientated by at least one mathematical function, a large number of bases can be generated, enabling complex models to be generated.

The bases define the topology of the model. Variations and patterns in the topology (positions and/or orientations of bases) can be imparted by defining bases in one generation using a mathematical function which varies in dependence upon the identity of bases in a previous generation.

Content objects are added to the topology defined by the bases. The content objects are defined by mathematical procedures which may be dependent upon one or more bases, so that the content objects vary in accordance with the variations in the topology of the bases and/or impart further variations to the model.

Furthermore, content objects may be generated by a procedure which is dependent upon the mathematically defined positions and/or orientations of the bases that hold the content objects (they are not produced and placed separately as in existing design file systems). Therefore, content objects are matched to adjacent content objects by the defined generation procedure. Furthermore, the content objects automatically change to adapt to any changes in the bases without changing the generation procedure. This is because the generation procedure is defined to be dependent upon the positions and/or orientations of the bases, and changes in these positions and/or orientations merely result in different values of the parameters to be used in the generation procedure. Thus, content objects do not comprise finished objects, designed separately, placed in the bases and expected to fit. Instead content objects are created with the same procedure, taking into account the positions and orientations of the bases, and resulting in content objects which vary in accordance with the bases to fit together.

In accordance with these features, and other features described below, a complex and varied model can be built up, in which content objects fit together and adapt to any changes in the model.

When programmed by the programming instructions, processing apparatus 2 can be thought of as being configured as a number of functional units for performing processing operations. Examples of such functional units and their interconnections are shown in FIG. 1. The units and interconnections illustrated in FIG. 1 are, however, notional and are shown for illustration purposes only to assist understanding; they do not necessarily represent units and connections into which the processor, memory etc of the processing apparatus 2 actually become configured.

Referring to the functional units shown in FIG. 1, central controller 20 is operable to process inputs from the user input devices 6, and also to provide control and processing for the other functional units. Memory 30 is provided for use by central controller 20 and the other functional units.

Input data interface 40 is operable to control the storage of input data within processing apparatus 2. The data may be input to processing apparatus 2 for example as data stored on a storage medium 42, as a signal 44 transmitted to the processing apparatus 2, or using a user input device 6.

In this embodiment, the input data may comprise data for a model (or part thereof) that has been previously generated (either by the present system or a separate system of the same type) and is to be amended/developed further by the present system.

Parameter definer 50 is operable to define the parameters to be used in the creation of the model in accordance with user instructions and/or by computation. In this embodiment, the parameters fall into two groups, namely geometric parameters (such as point, line, plane, solid object, etc) and all other types of parameters (such as numbers, strings, etc). The parameters required vary in accordance with the model to be produced, and examples will be described later with reference to a specific example of a model.

Reference object selector 60 is operable to select reference objects. A reference object is an object that provides the foundation on which new bases and/or new content objects are created. The reference object may comprise a global coordinate system (that is, a coordinate system that stands by itself without reference to any other object), an existing base (local coordinate system) or an existing content object.

Base generator 70 is operable to generate bases. Each base comprises a local coordinate system (where a coordinate system is a system of assigning a tuple of numbers to each point in an n-dimensional space). Different types of coordinate system may be defined by base generator 70, such as Euclidean, spherical, polar, a coordinate system in Calabi-Yau space, etc.

Figure 2:
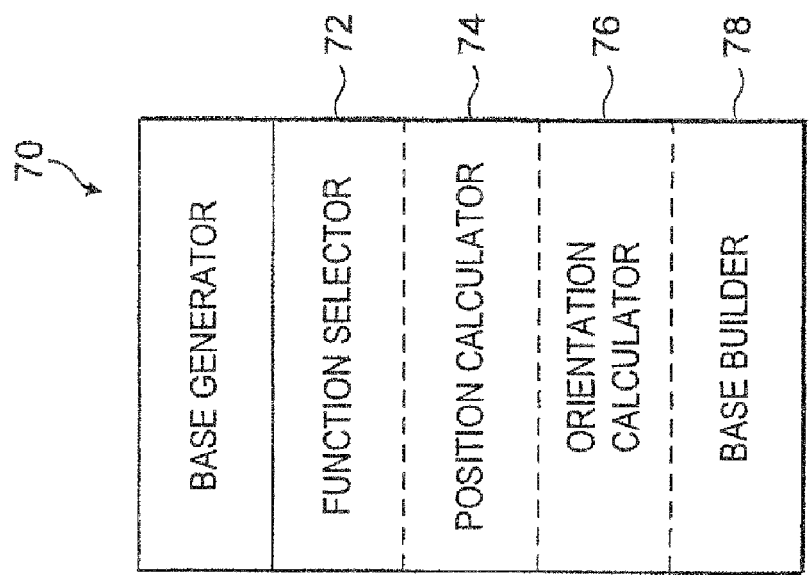
FIG. 2 shows the components of the base generator in FIG. 1.

Referring to FIG. 2, in this embodiment, base generator 70 comprises function selector 72, position calculator 74, orientation calculator 76 and base builder 78.

Function selector 72 is operable to select one or more mathematical functions to compute each base. For example, in the case of a base comprising a Euclidean coordinate system, functions to compute the position and orientation of the base are required.

Position calculator 74 is operable to apply the function(s) selected by function selector 72 to calculate the base position (the origin of the base).

Orientation calculator 76 is operable to apply the function(s) selected by function selector 72 to calculate the base orientation (the direction of the coordinate axes).

Base builder 78 is operable to combine the position and orientation calculated by position calculator 74 and orientation calculator 76 to produce data defining a base.

Referring again to FIG. 1, graph manager 80 is operable to generate, and maintain, a graph for each model created by the system. A graph of a model is a directed and labelled multigraph. The vertices of a graph represent indexed bases and content objects from each generation in a model. Edges represent the relation between two objects, and therefore represent relations between pairs of bases, content objects or both. The directions of edges go from the first vertex in a pair to the second vertex in a pair. There can be more than one edge between any two vertices. All vertices and edges have labels. For vertices, the labels are attributes of underlying bases and content objects. For edges, the labels represent the type of relation between two objects.

In this embodiment, there are two predefined relations which have unique labels. An edge with a label SUBBASE represents the relation between a reference base and a base 'contained' in it. In other words, if a reference base is a container for another base, the other base in a pair is contained in this container. Similarly, an edge with a label CONTENT represents the relation between a reference base and a content object that lies in it. In the present embodiment, when a reference base is transformed (moved and/or rotated), all of the bases linked to it with relation SUBBASE and all of the content objects linked to it with relation CONTENT are transformed in the same way. Since every base can be a container for the other bases, this relation is recursive and not limited.

Graph manager 80 is operable to create a graph, insert vertices into the graph representing each base and content object within the model, assign values for different attributes of the vertices, and add connections between the vertices.

Graph manager 80 is operable to assign the values for attributes and connections between vertices in accordance with user instructions or by calculation in accordance with a function or procedure.

Content generator 90 is operable to insert content objects into the model by inserting the content objects into the local coordinate systems of bases generated by base generator 70. The content objects may be of different types. For example, a content object may be defined by content generator 90 to be invariant, with the result that the content object cannot then be changed by the system. A solid object is an object of bounded volume. A primary object is a point, vector, line, curve, plane or planar polygon.

Figure 3:
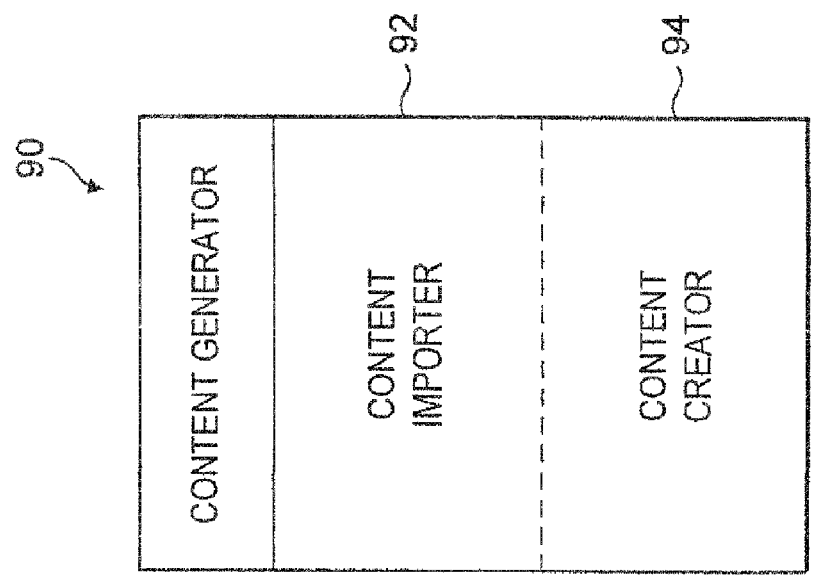
FIG. 3 shows the components of the content generator in FIG. 1.

Referring to FIG. 3, in this embodiment, content generator 90 comprises content importer 92 and content creator 94.

Content importer 92 is operable to input content objects into the system from an outside source, such as an external CAD application running on apparatus 2 or an external apparatus. In the present embodiment only primary content objects and invariant content objects can be imported.

Content creator 94 is operable to create content objects within the system in accordance with mathematical procedures defined in accordance with user instructions or in accordance with pre-stored geometric modelling kernels. Each mathematical procedure comprises one or a series of mathematical operations which create and/or manipulate geometric components in order to create a content object for the design. The operations may include the execution of mathematical functions, transformations, logical (Boolean) operations, conditional operations (where the operation to be performed is dependent upon a condition), etc. For example, a modelling kernel may be stored to create a solid object by Boolean operation (union, intersection, difference) and a modelling kernel may be stored to create a solid object from bounding planes. Many other modelling kernels may be stored.

Content creator 94 is operable to use the same mathematical procedure to generate a respective content object relative to each of a plurality of bases. More particularly, the mathematical procedure creates and/or manipulates a geometric component in dependence upon base position and/or orientation so that the resulting content objects vary in accordance with changes in the position and/or orientation of the bases even though they were generated using the same mathematical procedure.

Referring again to FIG. 1, transformation controller 100 is operable to apply transformations to bases and/or content objects, thereby enabling a plurality of bases and/or content objects to be changed without defining changes for each one individually. In this embodiment, transformation controller 100 is operable to apply the following transformations (although others could be applied instead or as well):
    changing origins and/or rotations of bases;
    changing positions and/or rotations of content objects;
    scaling and mirroring of content objects.

Transformation controller 100 is operable to define a transformation to be applied in accordance with user instructions or by computation. In particular, transformation controller 100 is operable to compute a transformation to be applied in accordance with one or more parameters used previously in the modelling. For example, transformation controller 100 is operable to apply a transformation to bases and/or content objects that is dependent upon the identity of the reference base in which the base and/or content object is located, so that the transformation applied varies in accordance with the reference base identity. In this way, bases and/or content objects in different bases are transformed in different ways.

Transformation controller 100 is operable to apply a transformation to every content object in each base, or to apply a transformation selectively to some but not all of the content objects in each base. For example, a transformation can be applied to transform a content object with name POLYGON-1 in each base but leave content objects with other names unchanged. The selection of content objects to which a transformation is to be applied can be based on different criteria, for example name, type, geometry data, connections in a model graph, etc.

Sensor function executor 110 is operable to generate and execute procedures to perform a mathematical test on a property of an individual base or content object or on a plurality of bases and/or content objects. More particularly, sensor function executor 110 is operable to identify each base (or content object) having an attribute or connection in the graph maintained by graph manager 80 which satisfies a defined relationship. As a result, sensor function executor 110 is operable to divide bases (or content objects) into equivalence classes. Sensor function generator 110 permits new attributes or connections to be added to each base or content object so that the value of the new attribute and/or connection can be used to classify the bases or content objects.

Model data manager 120 is operable to maintain the model data generated by the system, and to write the data to, and retrieve the data from, memory 30 as required. In this embodiment, the model data comprises data defining the bases, content objects and graph. Every base is represented by its logical data and geometry data. The logical data contains at least a generation index. The index may be an explicit value or may be implicit in the order by which bases are arranged in computer memory. The geometry data of a base comprises its origin and a rotation matrix in the global coordinate system. A base may have additional attributes, such as name, colour, group, etc., as described later.

A particular base in a model may be reached in three different ways:
    by index in a list of bases and content objects
    by matching values of additional attributes (by name, level, etc.)
    by performing a search operation in the graph
    (following connections in the graph)
    Each content object has the following data:
    type of content
    transformation
    attributes
    data depending on type of content The type content can be a type of three-dimensional object (e.g. point, line, polygon, solid), or an operation on content objects (e.g. intersection between line and plane, union of solids, extrusion of a polygon in a direction).

The transformation orients the content object in relation to a base in which the content object resides.

Attributes are from the same categories as attributes for bases (name, colour, group, etc.).

The data part of the content object depends on its type. For fixed types (point, line, polygon, solid, etc.), the data contain actual geometry data (a point is represented by a list of three coordinates, a line by two points, a solid by a list of vertices, a list of edges and a list of faces, etc.).

When the type of content is an operation on content objects, the data contain lists of content objects or references (pointers) to content objects. In such case, the actual data are computed only when needed:

if another operation requires actual geometry data for visualization of a model for export of data from a model.

Display data generator 130, under the control of central controller 20, is operable to generate image data for display (including instructions to the user and images of a design created using processing apparatus 2) and to control display device 4 to display the image data.

Output data interface 150 is operable to control the output of data from processing apparatus 2. In this embodiment, the output data may comprise part or all of the model data generated by the system, and may be output to other systems for different purposes, such as analysis or manufacturing.

Output data interface 150 is operable to output the data for example as data on a storage medium 152 (such as an optical CD ROM, semiconductor ROM, magnetic recording medium, etc), and/or as a signal 154 (for example an electrical or optical signal transmitted over a communication network such as the Internet or through the atmosphere). A recording of the output data may be made by recording the output signal 154 either directly or indirectly (for example by making a first recording as a "master" and then making a subsequent recording from the master or from a descendent recording thereof) using a recording apparatus (not shown). In particular, output data interface 150 is operable to output data to a manufacturing machine for the fabrication of an object according to the design. In this case, data may be output for separate components of the design, and the data may be output as CNC (computer numerically controlled) machine-readable code, so that the manufacturing machine can read the code directly, without translation.

FIGS. 4 to 12 show the processing operations performed by processing apparatus 2 to generate a design model in this embodiment.

To assist understanding, these processing operations will be described with reference to an example in which a model of a building is produced comprising three generations of interacting bases and two sets of final content objects. The generations of bases within this example are referred to as backbone, ring and centre generations. This requires three rounds of the processing shown in FIG. 4-a first round to generate the backbone bases, a second round to generate the ring bases and their content, and a third round to generate the centre bases and their content. The result of each round is a generation of bases (and possibly content) added to the model.

It will, of course, be understood that the example described is for illustration purposes only, and that different types of objects to be fabricated (other than buildings) and/or different numbers of generations of bases and/or different content objects can be generated by the present embodiment.

First Round of Processing: Generating Backbone Bases (First Generation Bases)

In the example to be described, a model is generated in a 3 dimensional Euclidean space. All of the values representing coordinates are expressed relative to the global origin in the standard basis of this space.

Step S100

Figure 4:
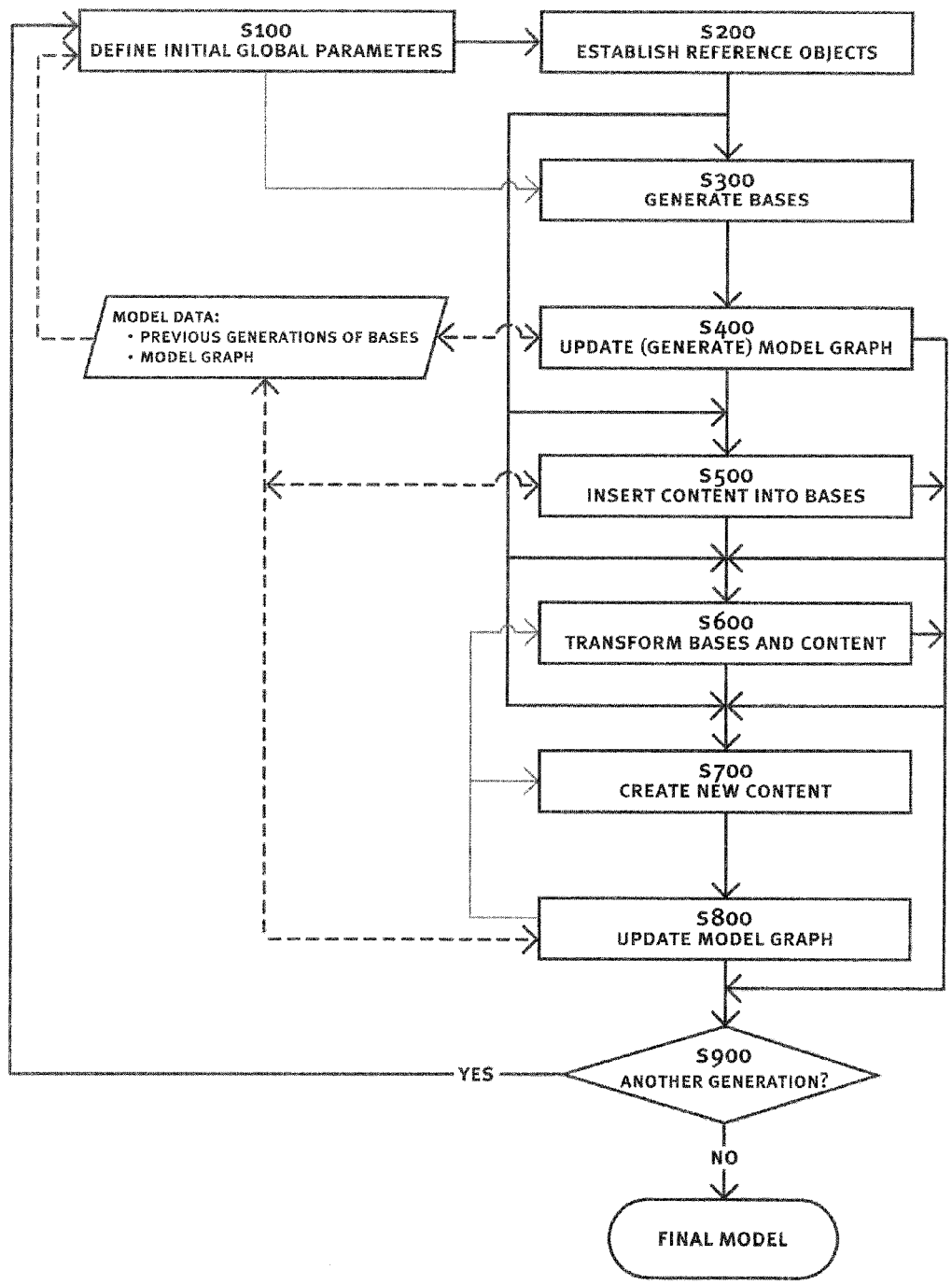
FIG. 4 shows the processing operations performed by the apparatus of FIG. 1.

Referring to FIG. 4, at step S100, parameter definer 50 defines global parameters for the model. In this example, the backbone bases are the first objects in the model, and the global parameters defined at step S100 are also used for the generation of these bases and also some subsequent objects in the model (as will be described later).

Figure 5:
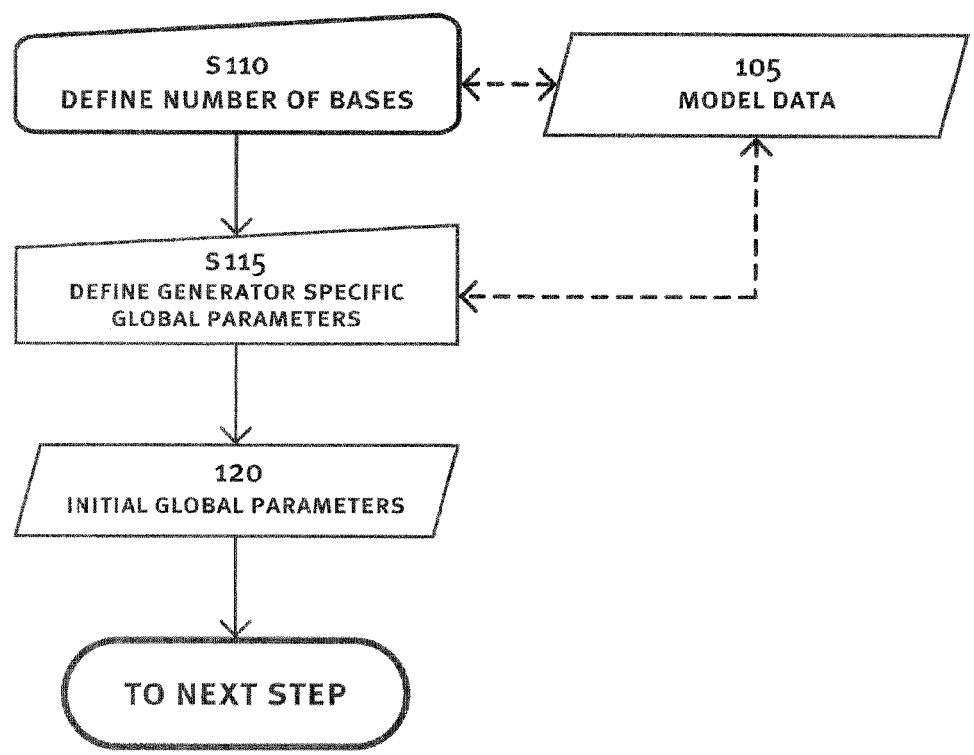
FIG. 5 shows the processing operations performed at step S100 in FIG. 4.

FIG. 5 shows the processing operations performed by parameter definer 50 at step S100.

Referring to FIG. 5, at step S110, parameter definer 50 defines the number of bases. This may be done in accordance with instructions from a user, by computing the number of bases using a mathematical function, or deriving the number of bases from a previous generation of bases.

On this round of processing, parameter definer 50 defines the number of backbone bases in accordance with user instructions, and in this example the number of backbone bases is defined to be 8.

At step S115, parameter definer 50 defines other global parameters. These parameters and the values assigned in this example comprise:

floor height: 4.2 meters position of first backbone base direction of X-axis of first backbone base The values for these global parameters are then stored as initial global parameters 120.

It should be noted that, instead of defining the parameters described above at step S110 and S115, the parameters could be defined "in-place", that is, in the steps where the particular function or procedure which uses the parameters is selected and applied. For example, the parameter for the number of bases could be defined at step 300. However, in that case, the parameter is valid only for that particular function. In contrast, by defining it at step S100, the parameter is an integral part of the model data 105 and therefore its value is subsequently accessible for the processing in other steps.

Step S200

Referring again to FIG. 4, at step S200, reference object selector 60 selects one or more reference objects to carry the bases to be generated in the current round of processing. This is performed by selecting on or more existing reference bases and/or content objects.

In this example, each base must have a reference base—some other base or a base that represents the orientation of a global coordinate system (global base).

The reference base in the latter case is a virtual base—that is, each base that does not have a previously-generated base as its reference base is considered to have a global base as its reference base. The reference base is important in this example because all numeric quantities representing positions in space are expressed relative to the position and orientation of the reference base.

Figure 6:
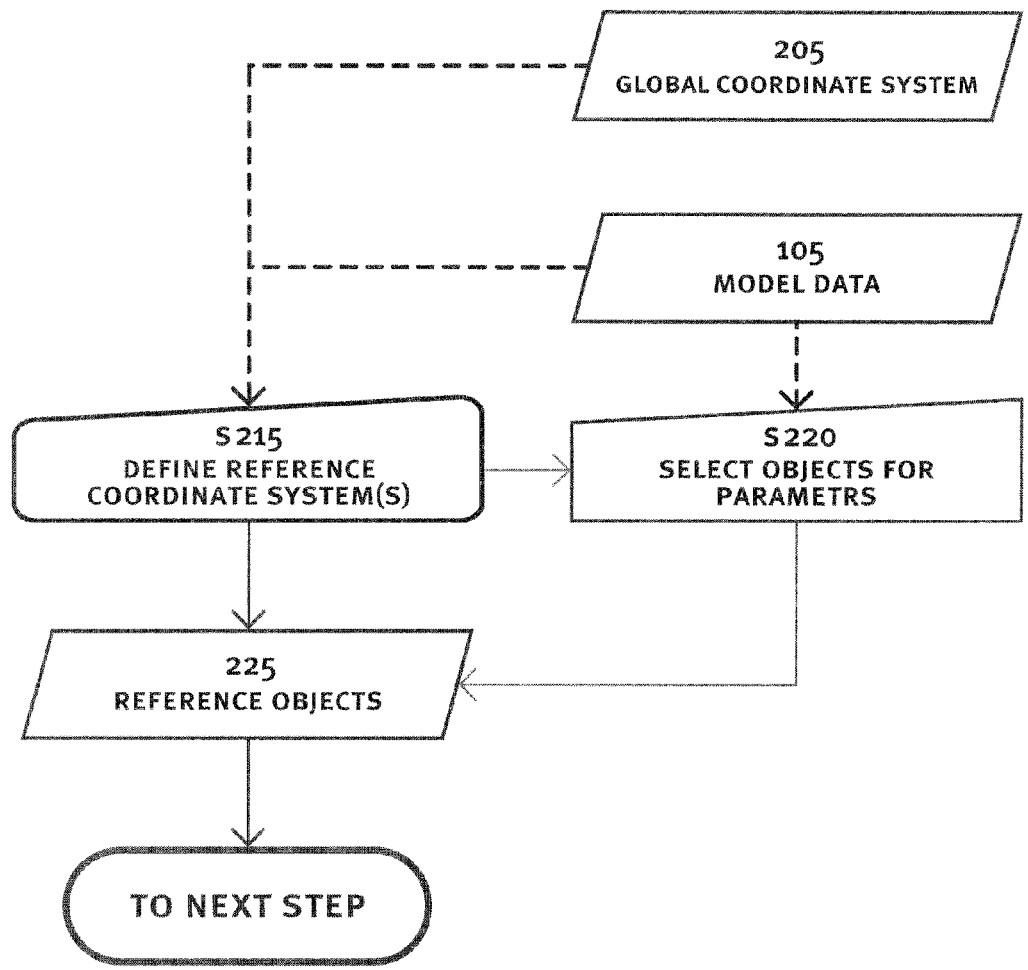
FIG. 6 shows the processing operations performed at step S200 in FIG. 4.

FIG. 6 shows the processing operations performed by reference object selector 60 at step S200 to generate reference objects data 225.

Referring to FIG. 6, at step S215, object selector 60 selects a reference coordinate system. Since backbone bases are the first bases generated in the model in this example, object selector 60 selects, by default, a reference coordinate system on this round of processing comprising the global Euclidean coordinate system 205. Although the global coordinate system (global base) is not a real object, it is shown on some figures to help the viewer with the orientation of objects on the figure.

FIG. 13a depicts the symbols used for a base in all of the following figures, wherein:

O=origin of the base x=X-axis of the base y=Y-axis of the base z=Z-axis of the base Since there are no other objects at this stage of the processing, none can be selected for parameters for functions or procedures, and therefore step S220 in FIG. 6 is not performed on this round of the processing.

Step S300

Referring again to FIG. 4, at step S300, base generator 70 performs processing to generate the number of bases previously defined at step S110 (that is, 8 backbone bases on this round of the processing) in the coordinate system(s) of the reference object(s) selected at step S215.

Figure 7:
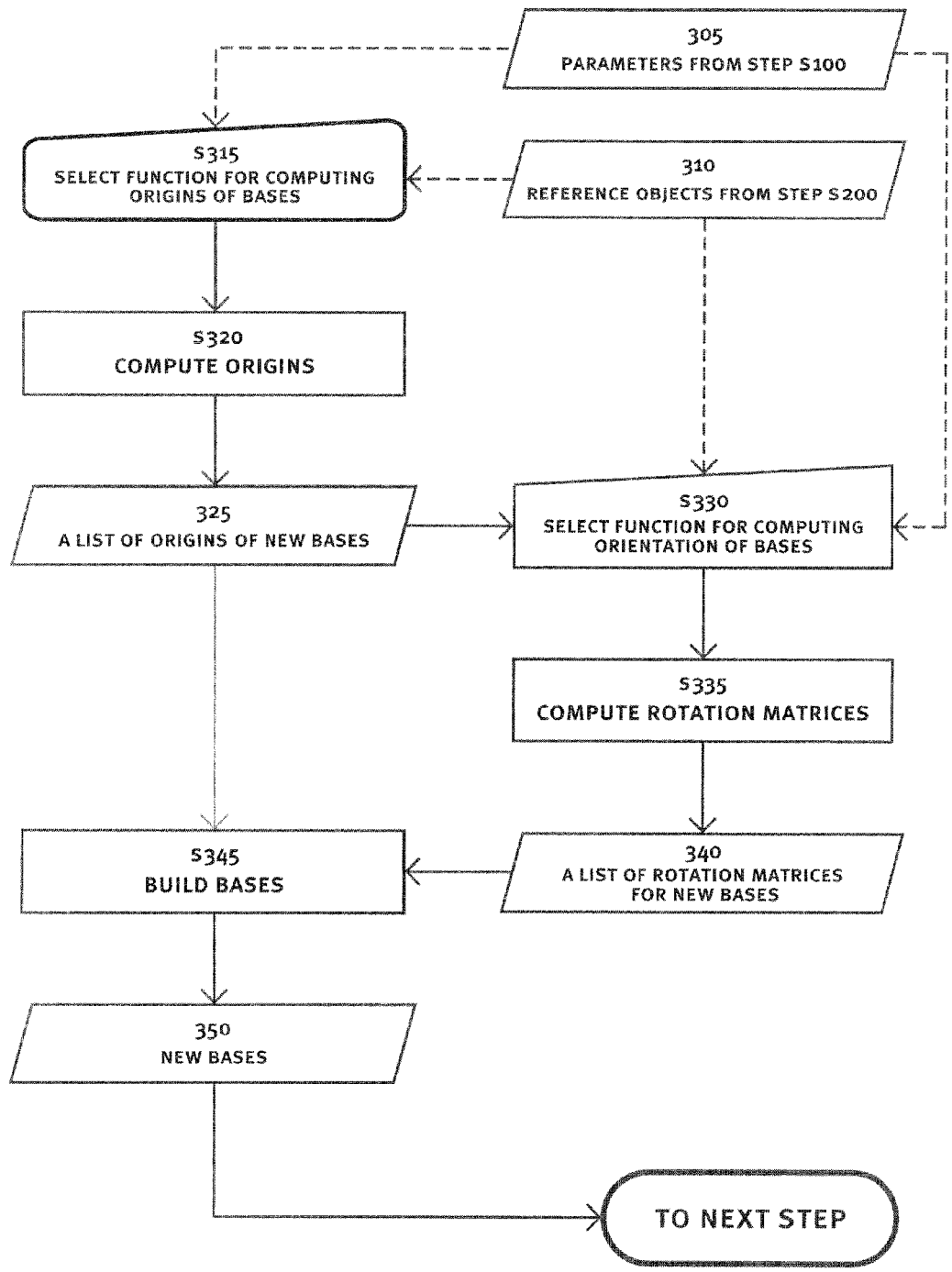
FIG. 7 shows the processing operations performed at step S300 in FIG. 4.

FIG. 7 shows the processing operations performed at step S300.

First, the origins (positions) of the bases are computed. As part of this, at step S315, function selector 72 uses parameters 305 from step s100 and reference objects 310 from step s200 and selects one or more mathematical functions for computing the origins of the bases in accordance with user instructions.

For this example, the following function is chosen:

Origins$[i] = \{fx[i], fy[i], fz[i]\}, \{i, 1$ to Number of backbone bases$\}$ $fx[i] = A$ Sin $[P+2Pi(i-1)F/$Number of backbone bases$]+1$ $fy[i] = B$ Sin $[2Pi(i-1)/$Number of backbone bases$]$ $fz[i] =$ Floor Height$(i-1)$ The values of the parameters assigned in this example are:
Number of backbone bases 8
Floor Height: 4.20
A: 0.80
P: 10.00
F: 0.75
B: 0.60

The parameters Number of backbone bases and Floor Height were defined previously in steps S110 and S115 respectively. The other parameters are used only for this function.

At step S320, position calculator 74 uses the function and parameter values selected at step S315 to calculate the origins of the backbone bases, which are stored as a list of origins of new bases 325. In this example, the positions $P_i$ of the origins of the backbone bases are calculated as:

P1={0.56478311, 0.0, 0.0}
P2={0.26519985, 0.42426406, 4.2}
P3={0.21328889, 0.6, 8.4}
P4={0.42654739, 0.42426406, 12.6}
P5={0.83309427, 0.0, 16.8}
P6={1.29589853, −0.42426406, 21.0}
P7={1.65896699, −0.6, 25.2}
P8={1.79992353, −0.42426406, 29.4}

FIG. 13b shows the computed points $P_i$ in relation to the global coordinate system G.

Bases are not just positions in space; each base also represents a local coordinate system at that position. Accordingly, a rotation matrix is needed for each base to be complete. This matrix defines the amount of rotation needed to rotate the coordinate axes of the reference base to the coordinate axes of the generated base. In the present embodiment, orientation calculator 76 defines a default orientation for each base which is then changed in accordance with user instructions. More particularly, the default orientation is the same as the orientation of the reference base (in this case global coordinate system G). This is represented with the identity rotation matrix.

FIG. 13c shows bases $B_i$ positioned on the points $P_i$ from FIG. 13b with each base having the default orientation of the global coordinate system G.

At step S330, function selector 72 selects one or more mathematical functions for additional rotation of each base. In this embodiment, the rotation function(s) is selected in accordance with user instructions. In the present example, the following function is selected to compute a respective rotation matrix for each backbone base:

$R[i]=$RotationAroundAxis$[\{0,0,1\},(i-1)\alpha],\{i,1$ to Number of backbone bases$\}$ Angle $\alpha=16°/$(Number of backbone bases−1)

This function defines the rotation of each backbone base $B_i$ as a function of the value of the backbone base index "i" and rotation angle $\alpha$, so that the rotation of each backbone base will be different.

At step S335, orientation calculator 76 applies the function(s) selected at step S330 to compute a respective rotation matrix for each backbone base, thereby generating a list 340 of rotation matrices for the bases.

At step 345, base builder 78 puts together the base origins generated at step S320 and the rotation matrices generated at step S335 to define each base as a respective coordinate system comprising a position and orientation.

As a result of this processing, data 350 defining the backbone bases is generated and stored.

FIG. 13d shows the backbone bases $C_i$ positioned on points the $P_i$ from FIG. 13b with applied function R[i] for their rotation.

Step S400

Referring again to FIG. 4, at step S400, graph manager 80 inserts the bases generated at step S300 into a model graph and records different attributes for each base.

Figure 8:
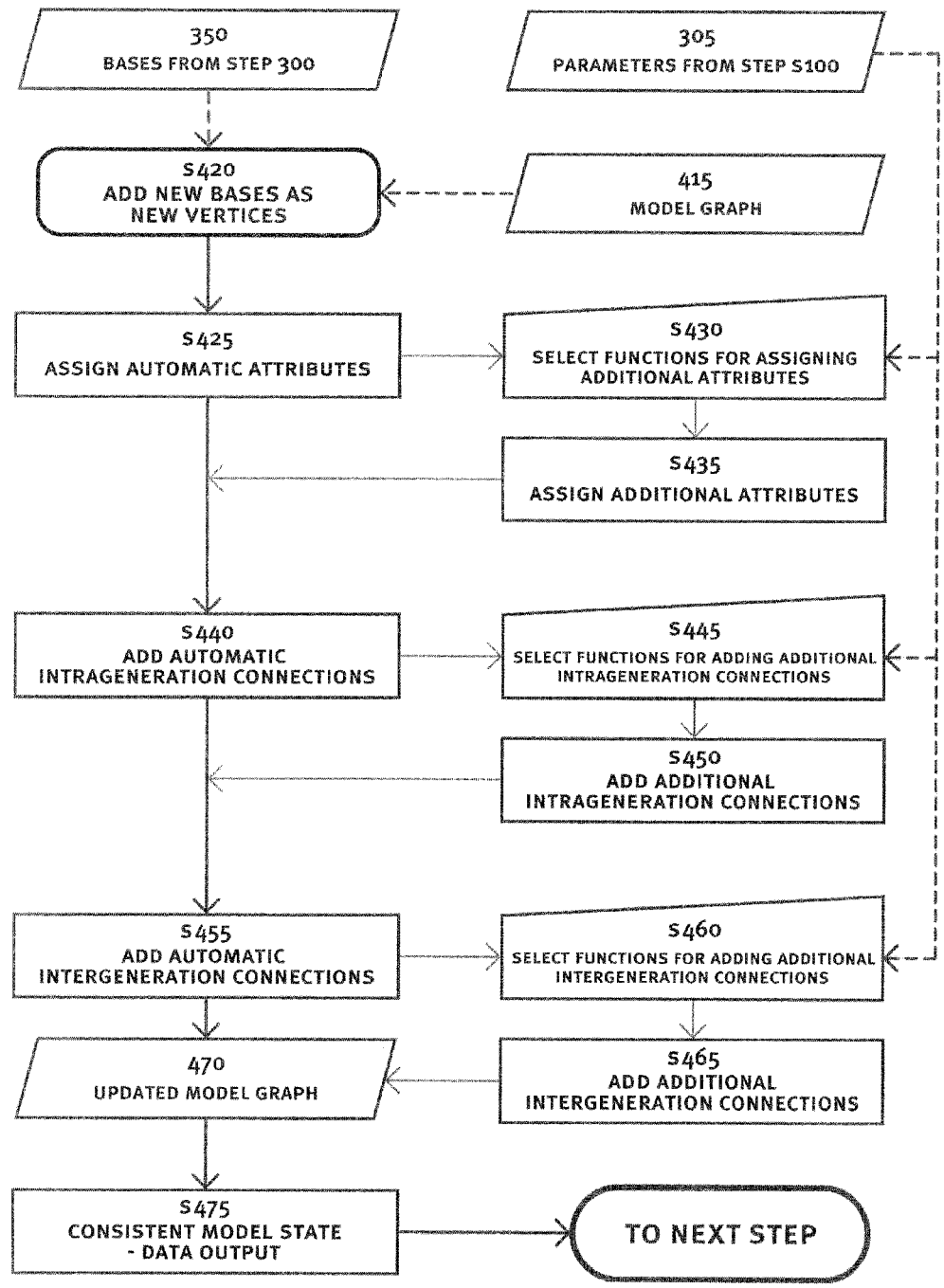
FIG. 8 shows the processing operations performed at step S400 in FIG. 4.

FIG. 8 shows the processing operations performed by graph manager 80 at step S400.

In the present example, 8 backbone bases were created as objects at step S300. Therefore, at step S420, 8 new vertices are inserted into the model graph 415. Actually, at this stage in the processing, no model graph 415 has previously been created, and therefore graph manager 80 creates a model graph from scratch and inserts the 8 vertices therein.

FIG. 14a shows the state of the model graph after step S420.

At step S425, graph manager 80 assigns automatic attributes to each vertex (base) in the model graph. In this embodiment, the automatic attributes comprise:

Generation name: Name of the generation of bases. It has the same value for all bases in the generation.

Index: Every base in a generation is assigned a consecutive number starting from one for the first base created. The index is therefore a unique identifier of the base within a particular generation. It should be noted that the index of a base need not be explicitly defined. Instead, for example, the index of a base may be implicitly defined by the order in which the bases are generated or arranged in computer memory.

Name: This attribute is either unique for every base or has the same value for all bases in a generation. Which method is used depends on the context of a generation. For example, bases that represent floors in a building might have distinct names (e.g. floor1, floor2, . . . ). On the other hand, bases that represent a type of windows might have the same name.

Level: Used for the purpose of visualization of a model. Usually it has the same value for all bases in a generation.

Colour: Used for the purpose of visualization of a model. It defines the colour in which a base will be rendered and displayed.

The attribute values assigned in this example comprise:
Generation: Backbone
Index: 1-8
Name: base1-base8
Level: CENTERS
Colour: 0 (white)

The combination of the attributes "generation" and "index" (or "generation" and "name") define a unique identifier for each base.

FIG. 14b shows the model graph after the automatic attributes have been assigned at step S425.

Referring again to FIG. 8, additional attributes may be selected and added at steps S430 and S435. However, in the present example, there is no need for additional attributes for backbone bases, so the next step is step S440, at which graph manager 80 adds automatic connections between vertices representing backbone bases—referred to as intrageneration connections where "intrageneration" means between vertices representing bases from the same generation.

In the present example, there is only one automatic intrageneration connection called "CREATION ORDER". This connection connects the vertices in the order in which the bases were created from first to last. Which one is first and which one last is governed by the index "i" in all of the functions used at step S300. This index always runs from 1 to the number of bases in the current generation. Connections are represented as edges in the model graph (that is, as pairs of vertices—actually indices of vertices). The first vertex in a pair represents the starting point of the connection and the second vertex represents the end point. Graph manager 80 computes edges for the connection "CREATION ORDER" with the following formula:

Edges={(I,I+1),{I,1 to number of bases in a generation−1}}

FIG. 14c shows the model graph after the processing at step S440.

Referring again to FIG. 8, additional intrageneration connections may be added at steps S445 and S450. However, in the present example, there is no requirement for additional intrageneration connections for backbone bases, and therefore the processing at steps S445 and S450 is omitted during the current round of processing.

At steps S455, S460 and S465, automatic intergeneration connections and additional intergeneration connections may be added to the model graph to generate an updated model graph 470. However, the generation of backbone bases is the first generation in a model, and therefore there are no intergeneration connections to be defined at this stage in the processing. Accordingly, steps S445, S460 and S465 are omitted on this round of processing.

The model graph resulting from the processing at step S400 for this example is therefore as shown in FIG. 14c.

At the end of step S400, the model is in a consistent state. As used herein, the term "consistent state" of the model means that all of the data from bases, content objects, and attributes and connections in the model graph are in accordance with each other (that is, there is no base or content object without the required attributes and connections). As a result, at step S475, the designer and/or another user of the system has a chance to export the model data to other systems for the purpose of visualization, analysis, manufacturing, etc.

Which bases, content objects and other data are exported depends on the purpose of the other system. Not all of the data needs to be exported. For example, for quick visualization of the model, data for only the last generation of bases need to be exported.

Depending on the purpose of the export, data can be formatted in different ways. For example, for visualization, only the geometry and the attributes "Level" and "Colour" are needed. For structural analysis, the geometry, information about the material of content objects (contained in custom attributes—like the attribute MATERIAL described later in this example) and connections from the model graph are needed. For manufacturing, at least the geometry, the material of the content objects and their identification number (label) are needed.

Step S500

Referring again to FIG. 4, at step S500, content objects can be inserted into the bases generated at step S300 in the current round of processing.

In the present example, there is no need for content objects in the backbone bases, and accordingly step S500 is omitted on this round of the processing. Step S500 is, however, performed (and described) for subsequent rounds.

Step S600

At step S600, additional transformations can be applied to bases and content objects. This feature enables the present embodiment to change the position and/or orientation of some, or all, of the bases or some, or all, of the content objects using one or more mathematical functions without re-defining each base or content object individually.

In the present example, the backbone bases generated at step S300 are reoriented in a series of transformations by transformation controller 100.

The processing at step S600 is provided separately in this embodiment from the processing at step S300 (at which bases were generated and orientated) and the processing at step S500 (at which content objects were generated and orientated) so that transformations can be applied taking into account both the bases and the content objects. For example, one or more content objects added at step S500 may be used to compute a transformation to transform bases and/or content objects.

Figure 10:
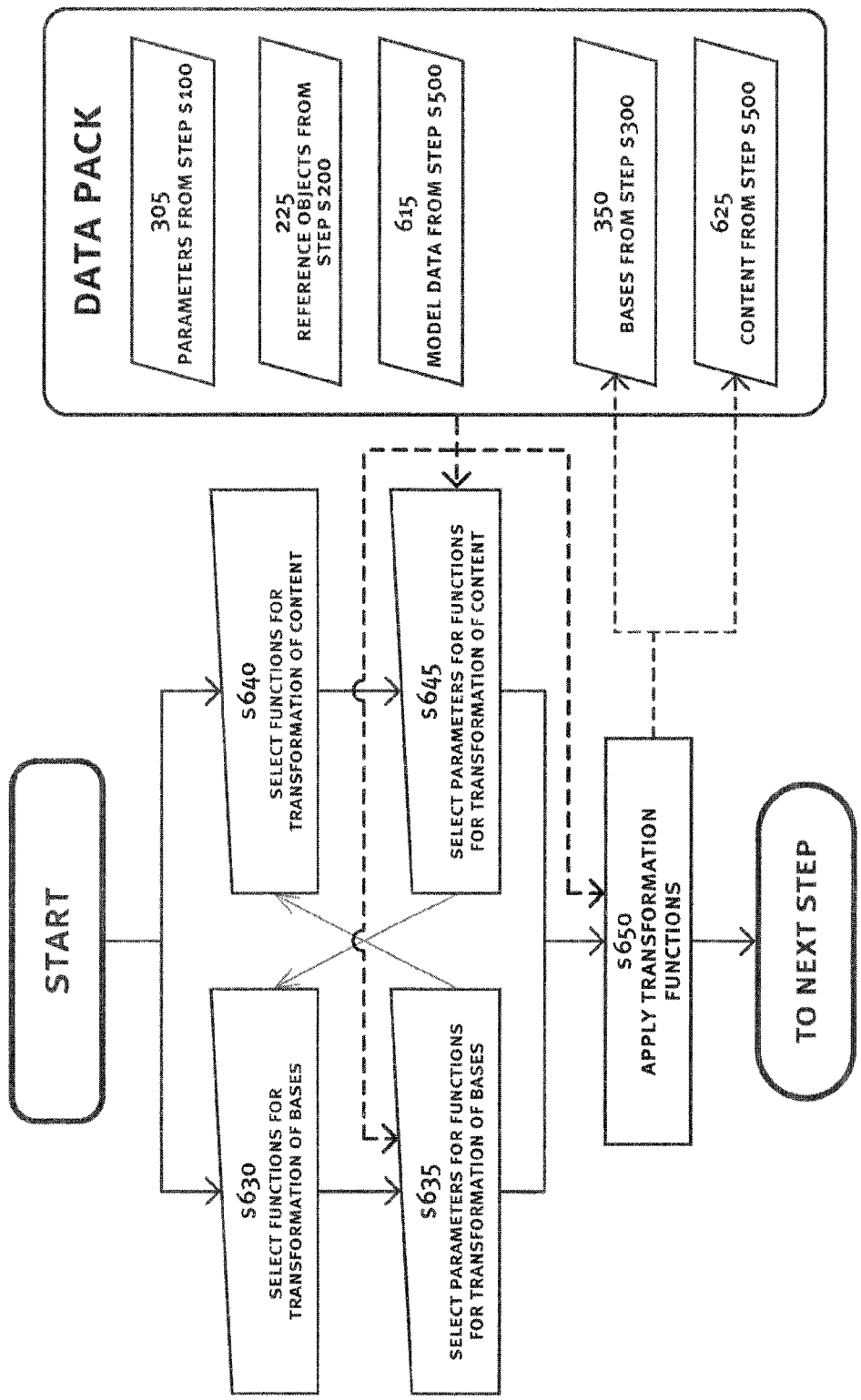
FIG. 10 shows the processing operations performed at step S600 in FIG. 4.

FIG. 10 shows the processing operations performed by transformation controller 100 at step S600, together with the data inputs comprising parameters 305 from step s100, reference objects 225 from step s200 and model data 615 from step s500.

Referring to FIG. 10, at step S630, transformation controller 100 selects one or more functions for the transformation of bases. In this embodiment, the transformation(s) are selected in accordance with instructions from a user (although they could be selected by computation).

At step S635, transformation controller 100 selects one or more parameters to be used in the function(s) selected at step S630 for the transformation of bases. In this embodiment, the parameter(s) are selected in accordance with user instructions (although they could be selected by computation).

At step S640, transformation controller 100 selects one or more functions for the transformation of content objects. In this embodiment, the transformation(s) are selected in accordance with user instructions (although they could be selected by computation).

At step S645, transformation controller 100 selects one or more parameters to be used in the function(s) selected at step S640 for the transformation of content objects. In this embodiment, the parameter(s) are selected in accordance with user instructions (although they could be selected by computation).

At step S650, transformation controller 100 applies the transformation(s) selected at steps S630 and S640 to the bases 350 from step s300 and the content 625 from step s500 using the parameter(s) selected at steps S635 and S645, thereby generating transformed bases and/or content objects.

The processing in FIG. 10 will be illustrated for the present example in a case where all of the backbone bases are transformed with the same transformation in such a way that origin of the last base $B_8$ lies directly over the origin of the first base $B_1$ (that is, the x and y coordinates of the origins of bases $B_1$ and $B_8$ are the same). This transformation is accomplished as set out below.

Consider the three points $O_1$, $O_8$ and $O_V$ where $O_1$ is the origin of base $B_1$, $O_8$ is the origin of base $B_8$ and $O_V$ is $O_1+\{0, 0, 1\}$. Transformation $TR_1$ is a transformation needed to rotate vector $O_8-O_1$ to vector $O_V-O_1$ through the point $O_1$.

$O_1=\{0.56478311, 0.0, 0.0\}$
$O_8=\{1.79992353, -0.42426406, 29.4\}$
$O_V=O_1+\{0, 0, 1\}=\{0.56478311, 0.0, 1.0\}$
$TR_1=\text{TransformationVectorToVector}[O_1, O_8-O_1, O_V-O_1]$ Transformation $TR_1$ is applied only to the origins of the backbone bases $B_i$. The rotation part of the bases $B_i$ is kept intact.

$B_i=\text{Base}[T_{Bi}, T_{Bi}]=\{x_i, y_i, z_i\}$
$TR_1=[T, R]$
$B_i'=\text{Base}[T+R \cdot T_{Bi}, R_{Bi}]$ After applying the transformation $TR_1$, a correction to each origin's z coordinate must be made. Accordingly, the Z coordinates of the bases $B_i'$ are reset to the values of the original bases $B_i$. This step is needed in the present example to preserve floor heights between backbone bases.

Figure 15A:
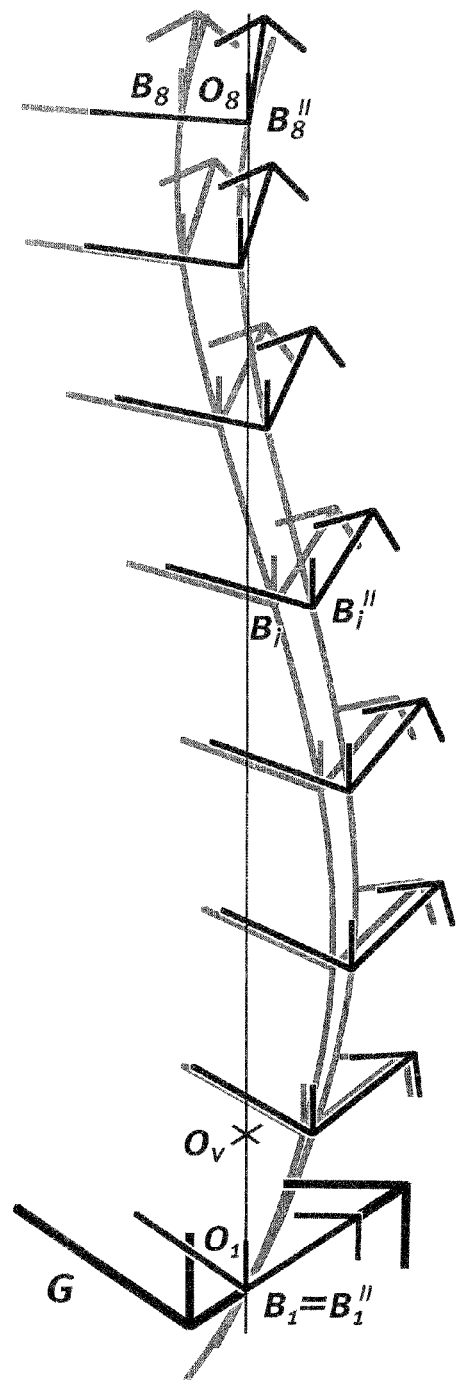
FIGS. 15a, 15b and 15c illustrate the transformation of the backbone bases at step S600 in the first round of processing.

$B_i=\text{Base}[\{X_i, y_i, z_i\}, R_{Bi}]$
$B_i'=\text{Base}[\{x_i', y_i', z_i'\}, R_{Bi}']$
$B_i''=\text{Base}[\{x_i', y_i', z_i\}, R_{Bi}']$ FIG. 15a shows the bases $B_i$ before transformation (illustrating that the origin of base $B_8$ does not lie directly over the origin of base $B_1$) and the bases $B_i''$ after transformation controller 100 has applied transformation $TR_1$ and correction to their z coordinates (illustrating that the origin of base $B_8''$ now lies directly over the origin of base $B_1''$).

A second transformation of the backbone bases turns them upside down. This is achieved by applying a global rotation $R_1$ to the bases $B_i''$. Rotation $R_1$ is defined as rotation around global Y-axis $\{0, 1, 0\}$ for 180 degrees:

$R_1=\text{RotationAroundAxis}[\{0, 1, 0\}, 180°]$
$B_i'''=R1 \cdot B_i''$

Thereafter, a rotation $R_2$ is applied locally—that is, only on the rotation part of each backbone base B'''. This is meant to bring the X-axis of each backbone base to point again in the direction it had before application of the global rotation $R_1$.

Figure 15B:
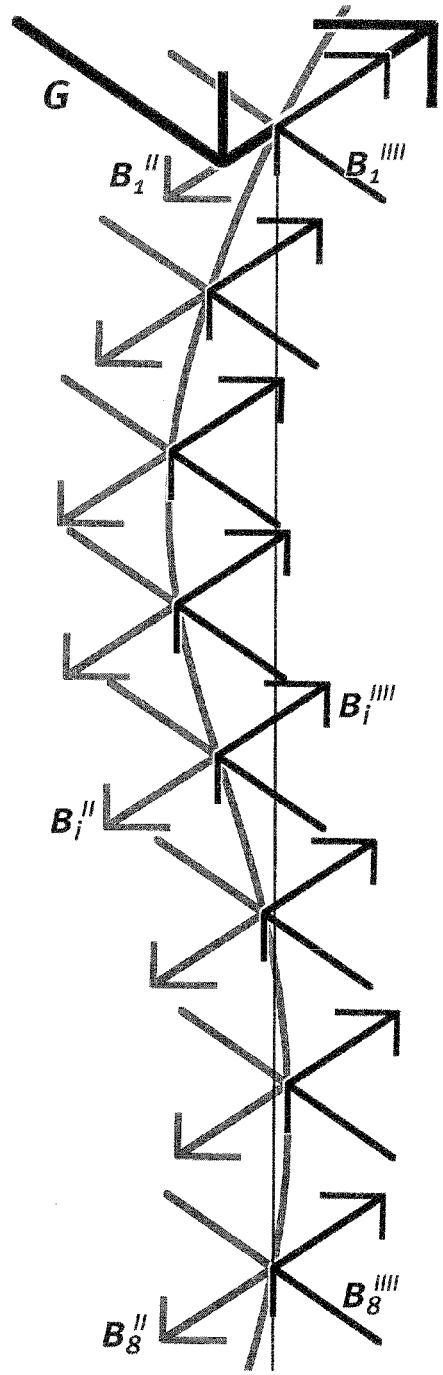

$R_2=\text{RotationAroundAxis}[\{0, 0, 1\}, 180°]$
$B_i'''=\text{Base}[T_{Bi}''', R_{Bi}''']$
$B_i''''=\text{Base}[T_{Bi}''', R_2 \cdot R_{Bi}''']$ The result of applying rotations $R_1$ and $R_2$ on bases B'' is shown in FIG. 15b (in which it will be seen that base $B_8''''$ is now the bottom base and $B_1''''$ is now the top base).

Figure 15C:
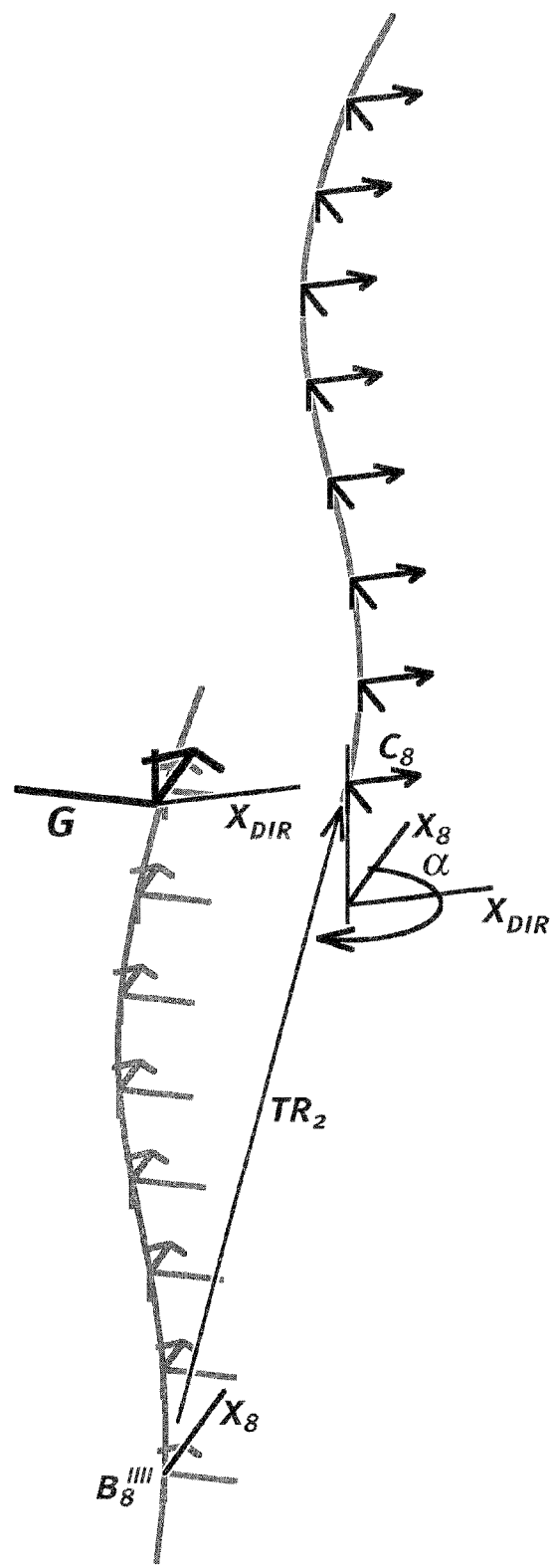

A final transformation $TR_2$ transforms the backbone bases $B_i''''$ in such a way that the origin and orientation of the bottom base (which, after applying rotations $R_1$ and $R_2$, is now base $B_8''''$ as described above) follows the parameters specified in step S100. Their numerical values are:

Pos=$\{2, -3.5, 0\}$
X-axis direction vector $X_{dir}=\{0.8, -1.25, 0\}$
Transformation $TR_2$ is defined as follows:
$TR_2=[T, R]$
T=Pos
$X_8$=Direction of X-axis of base $B_8''''$
α=directed angle from vector $X_8$ to vector $X_{dir}$
R=RotationAroundAxis $[\{0, 0, 1\}, \alpha]$ $C_i=TR_2 \cdot B_i''''$ The result of applying transformation $TR_2$ on the bases $B_i''''$ is shown in FIG. 15c.

Steps S700 and S800

Referring again to FIG. 4, at step S700, content generator 90 can add new content objects to the model, and at step S800, graph manager 80 can perform processing to update the model graph.

In the present example, the processing at steps S700 and S800 is not performed during the current round of processing. More particularly, because no new content objects are to be defined and all of the attributes and connections have already been established at step S400, then steps S700 and S800 are not necessary.

At this stage in the processing, the model is in a consistent state, and therefore data can be exported to one or more other systems, as described previously with reference to step S475.

Step S900

At step S900, a check is performed to determine whether another generation of bases is to be added to the model.

In the present example, the backbone bases comprise the first generation of bases, and further generations of bases are to be added. Accordingly, processing returns to step S100 for the next round of processing, which will be described below.

Second Round of Processing: Generating Ring Bases (Second Generation Bases) with Content Objects The second generation of bases in the present example is a generation of "ring" bases.

Each backbone base serves as a reference base (that is, a containing base) for a specific number of ring bases to be arranged in a ring on a plane around the backbone base.

The ring bases are generated by performing a second round of the processing in FIG. 4, as will now be described.

Step S100

Referring to FIG. 5, at step S110, parameter definer 50 defines the number of bases for this generation of bases in accordance with user instructions. For this example, the number is 18 new bases for each backbone base. This number is the same for each backbone base, but it could be a different number for each backbone base.

Parameter definer 50 then calculates the total number of ring bases: number of backbone bases*number of bases per ring=8×18=144.

At step S115, parameter definer 50 defines a value for a specific global parameter comprising the depth of white blocks. As will be described later, the parameter "depth of white blocks" is used at step S700 for the creation of content objects.

In the present example, the parameter "depth of white blocks" is set to the value 1.0.

Step S200

Referring to FIG. 6, at step S215, reference object selector 60 selects reference bases for the new ring bases. In the present example, each backbone base is chosen as a reference base for 18 respective ring bases. The first backbone base serves as a reference base for the first 18 ring bases, the second backbone base serves as a reference base for the next 18 ring bases, and so on up to the last backbone base, which serves as a reference base for the last 18 ring bases. This relation is expressed with the formula:

I=index of ring base
$I_{ref}$=index of reference backbone base $I_{ref}[I]$=Quotient[I−1, number of bases per ring]+1

Function Quotient (n, m) gives the integer quotient of n and m

At the current stage of processing in the present example, there are no content objects in the model, and therefore there is no reference object to be used for parameters of functions. Accordingly, the processing at step S220 is not required on this round of processing.

Step S300

At step S300, base generator 70 generates the ring bases. The number of ring bases is equal to the number of bases defined at step S110 in this round of processing (that is, 144).

Referring to FIG. 7, at steps S315 and S320, the origins of the bases are computed. The procedure for computing the origin of each ring base in the present example will be described with reference to FIG. 16.

Figure 16:
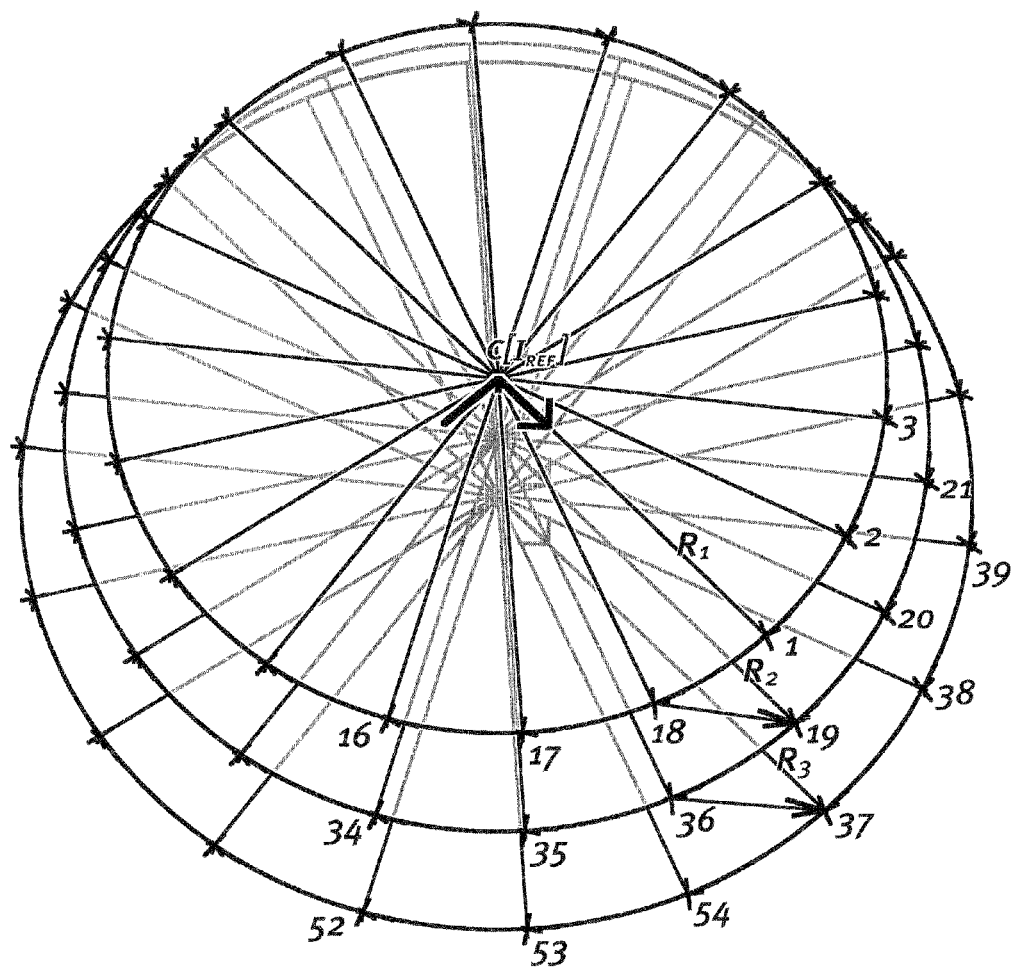
FIGS. 16, 17, 18, 19a and 19b show an example to illustrate the generation of ring bases at step S300 in a second round of processing to generate the design model.

Referring to FIG. 16, for each backbone base, the origins of its 18 ring bases are positioned on a circle with a specific radius in the XY plane of the backbone base. The origins are equidistantly spaced around the perimeter of the circle, with the first origin at 0° angle and the others following in the counter-clockwise direction.

The positions of the origins of the ring bases are computed as if they all lie in an XY plane with the global coordinate system as a local coordinate system. After that each ring base is transformed with appropriate transformation to lie in the same position relative to its reference base (backbone base) as it is in the global coordinate system.

More particularly:

I=index of ring base, (runs from 1 to total number of ring bases)

$I_{ref}[I]$=index of reference backbone base computed by formula from step S215 on this round of processing Angle α=−360°/number of bases per ring Function for radii $R[I]=R_{fixed}+(I_{ref}[I]-1)(R_2-R_1)/$(Number of Backbone Bases−1)

Origins $O[I]=R[I]\{Cos[I\alpha], Sin[I\alpha], 0\}$

From the function R[I] for radii, it will be seen that $I_{ref}[I]$ is a variable of the function—that is, the radius of the circle upon which the origins of the ring bases lie is dependent upon the index I of the reference base (the backbone base to which the ring bases belong). In other words, the radius changes as the index I changes, so that the radius is different for each backbone base. In FIG. 16, therefore, the radius R1 of the circle of ring bases 1-18 is different from the radius R2 of the circle of ring bases 19-36 and the radius R3 of the circle of ring bases 37-54. As a result, the positions of the second-generation bases (which lie on the circles) change relative to their containing backbone base from circle to circle. This feature of the present embodiment enables variations in the ring bases to be introduced throughout the model without having to define the ring bases individually. This is particularly advantageous where a large number of ring bases are to be defined for the model. The form and extent of this variation is set in accordance with the mathematical function having the index of the backbone base as a variable.

Similarly, from the function O[I], it will be seen that I is a variable of the function. That is, the position of each second-generation base upon its circle is dependent upon the value of its index I. The variable I therefore acts as a variable feature identification number which controls the position of each second-generation base.

Although the mathematical functions R[I] and O[I] are separate functions in the present example, it will be appreciated that, in other examples, a single function having both $I_{ref}$ and I as variables could be used to defined the position and/or orientation of each second-generation base.

In the present example, the following values are assigned to the parameters in the functions above:

number of bases per ring: 18
total number of ring bases: 144
Number of backbone bases: 8
$R_{fixed}$: 12.00 m
$R_1$: 0.00 m
$R_2$: 3.00 m The parameters "number of bases per ring" and "total number of ring bases" were defined at step S100 in the current round of processing, and the parameter "Number of backbone bases" was defined at step S110 in the previous round during the generation of the backbone bases.

Figure 17:
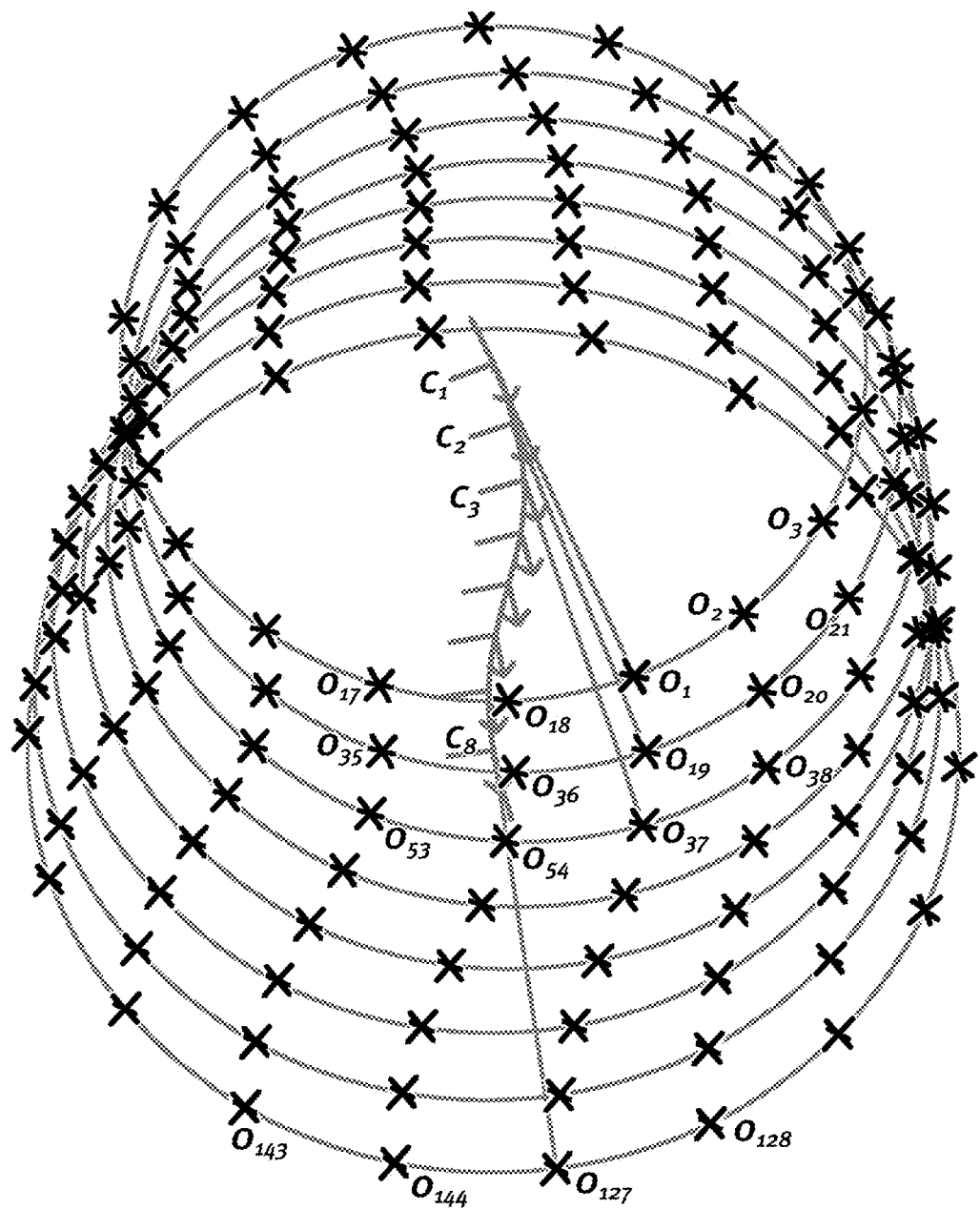

To compute global coordinates of the origins of the ring bases, each origin $O_i$ must be transformed with a transformation TB[I] which is in reality a defining transformation of the ring base's reference backbone base $C[I_{ref}[I]]$ $TB[I]=Transformation[C[I_{ref}[I]]]$ FIG. 17 shows the global positions of the origins $O_i$ of the ring bases computed by position calculator 74 in accordance with the equations above. In this figure, $C_i$ are the reference backbone bases.

The origins of the backbone bases are computed locally to their reference base and then transformed to the global coordinate system. They could instead be defined directly in the global coordinate system, but the functions used would be more complex. On the other hand, a situation can be foreseen where functions for computing the origins of the bases directly in the global coordinate system would be less complex than computing them locally (i.e., when there is no dimensional relation to the reference bases).

When a ring base is created, its initial orientation is the orientation of its reference base. The initial orientation of each ring base $B_{Ri}$ is thus the same as is the orientation of its reference backbone base $C_i$. This situation is shown in FIG. 18.

At step S330, function selector 72 selects one or more functions for additional rotation of the ring bases.

This will be described for the present example with reference to FIG. 19a.

Figure 19A:
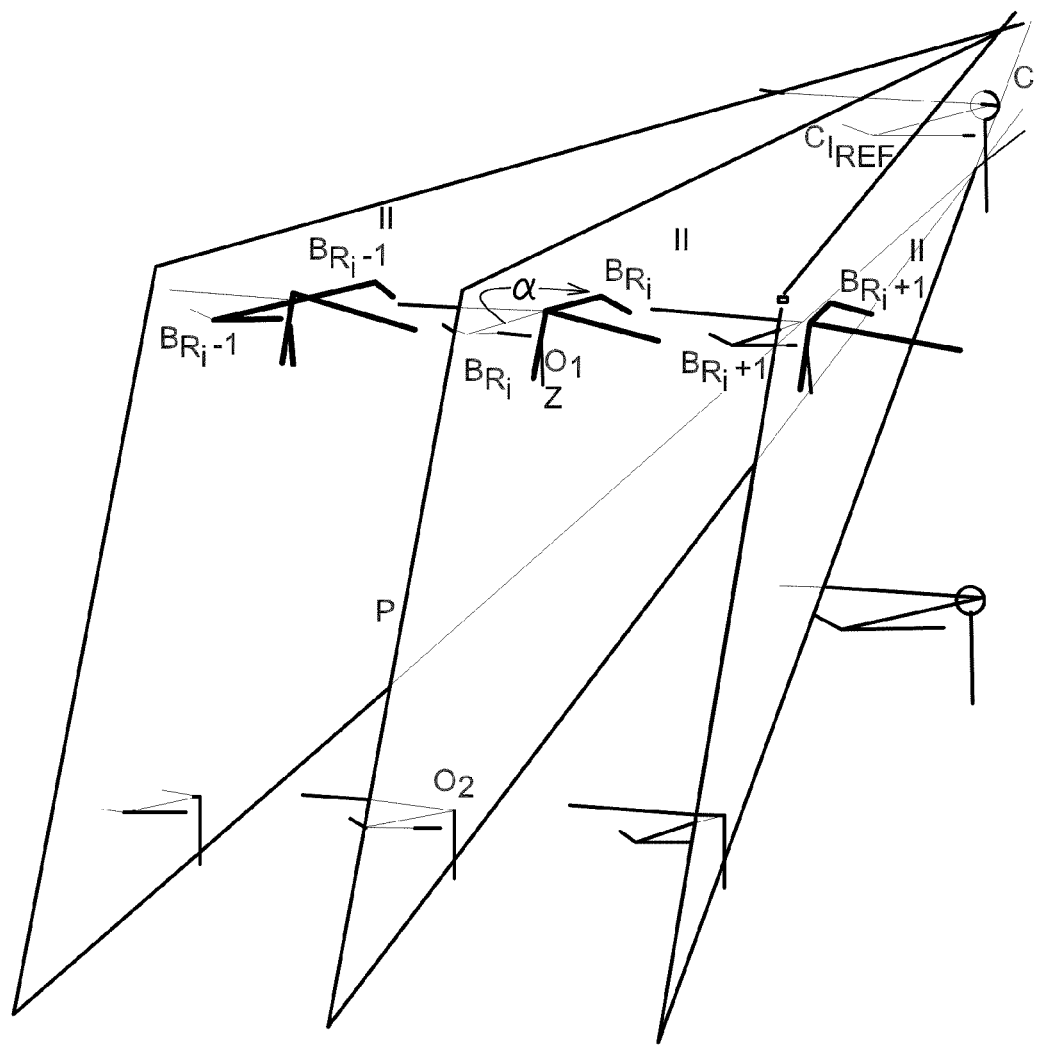

Referring to FIG. 19a, a function is selected to rotate the Z-axis of each ring base so that the Z-axis points to the origin of the ring base on the next ring which is expressed with the following relation on the ring base indices:

I=index of ring base $B_{Ri}$
$I_{TO}$=index of ring base on the next ring=I+number of bases per ring This is achieved by applying following transformation $TR_i$ on the ring base $B_{Ri}$.

$O_1$=origin of ring base $B_{Ri}$
Z=Z-axis vector of base $B_{Ri}$
$O_2$=origin of ring base $B_R[I_{TO}]$
C=origin of reference backbone base $C[I_{ref}]$
P=plane from three points $O_1$, $O_2$, C (order of points is important for direction of plane's normal vector)
$TR_i$=TransformationVectorToVector[$O_1$, $O_1$+Z, $O_2$]

$B_{Ri}'=TR_i \cdot B_{Ri}$

Another condition in the present example is that the X-axis of each ring base $B_{Ri}$ should lie in the plane P that goes through the origins $O_1$, $O_2$ and C (that is, the origins of ring base $B_{Ri}$, ring base $B_{Ri}[I_{TO}]$ and reference backbone base $C[I_{ref}]$). This assures that the X-axis of the ring base points in the general direction of the origin of its reference base. Since the Z-axis of base $B_{Ri}'$ already lies on this plane (it has been defined as the direction from origin $O_1$ to $O_2$), the only thing required is to rotate base $B_{Ri}'$ around its Z-axis in such a way that its X-axis snaps to the plane P. The amount of rotation $R_i$ needed is calculated from the directed angle $\alpha$ between the X-axis of base $B_{Ri}'$ and the plane P.

$X_{BRi}'$=direction of X-axis of base $B_{Ri}'$
$Z_{BRi}'$=direction of Z-axis of base $B_{Ri}'$ $$\alpha = \text{AngleBetween}[X_{BRi}',(Z_{BRi}' \times \text{NormalVector}[P])]$$

As used herein, the directed angle between two vectors is defined as follows: In general two non-parallel vectors $v_1$ and $v_2$ fully define a plane. If the normal vector of this plane is defined as a cross product of vectors $v_1$ and $v_2$ ($n=v_1 \times v_2$), the directed angle is then the angle when travelling from vector $v_1$ to vector $v_2$ around normal n in a counter-clockwise direction. (This means that the directed angle is not necessarily the smallest angle between two vectors.)

$R_i$=RotationAroundAxis$[Z_{BRi}', \alpha]$ $$B_{Ri}'' = R_i B_{Ri}'$$

Figure 19B:
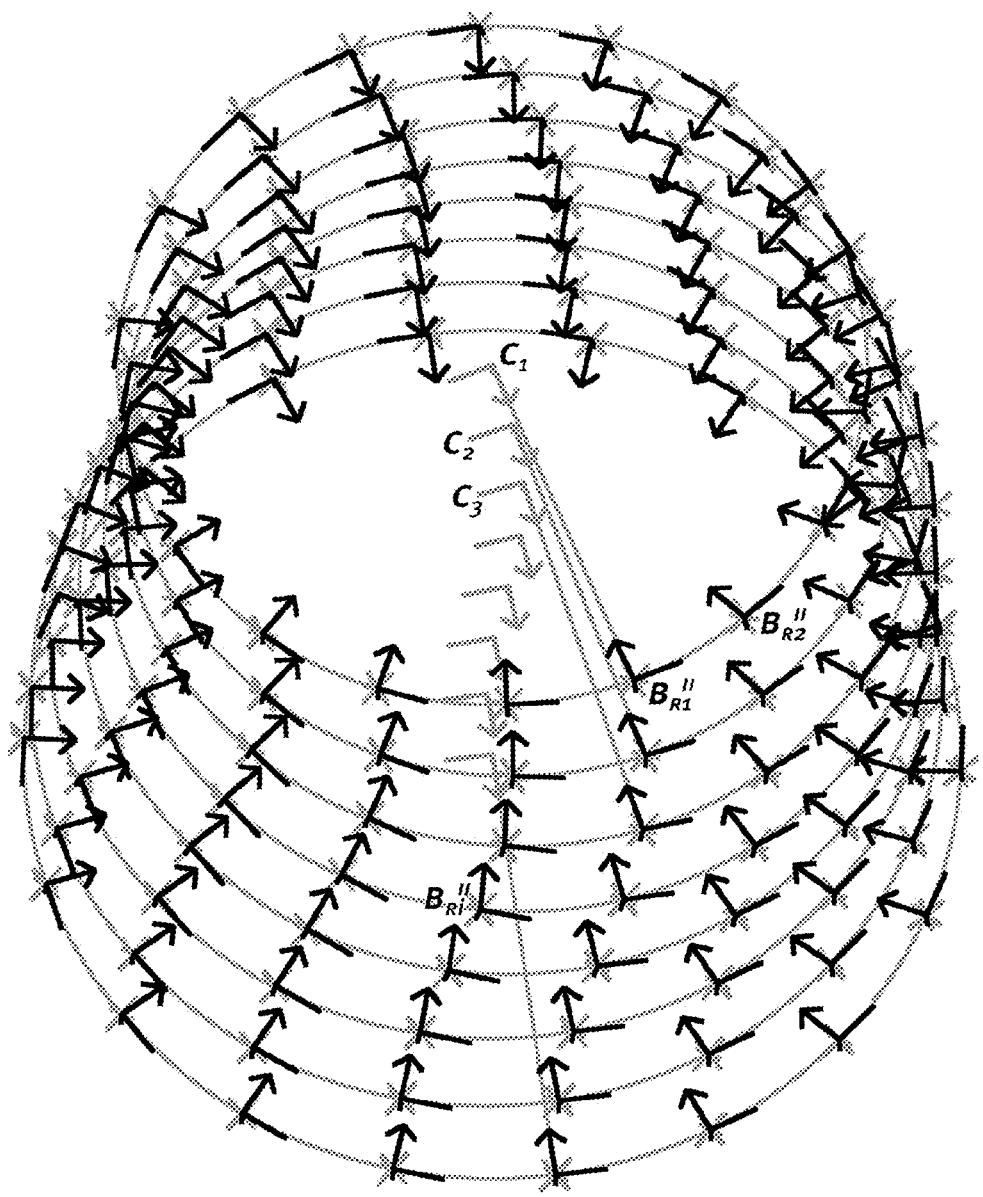

FIG. 19b shows the final ring bases $B_{Ri}''$ after applying transformation $TR_i$ and rotation $R_i$.

Step S400

At step S400, graph manager 80 inserts the ring bases generated at step S300 into the model graph and records different attributes and connections for each ring base.

Figure 20:
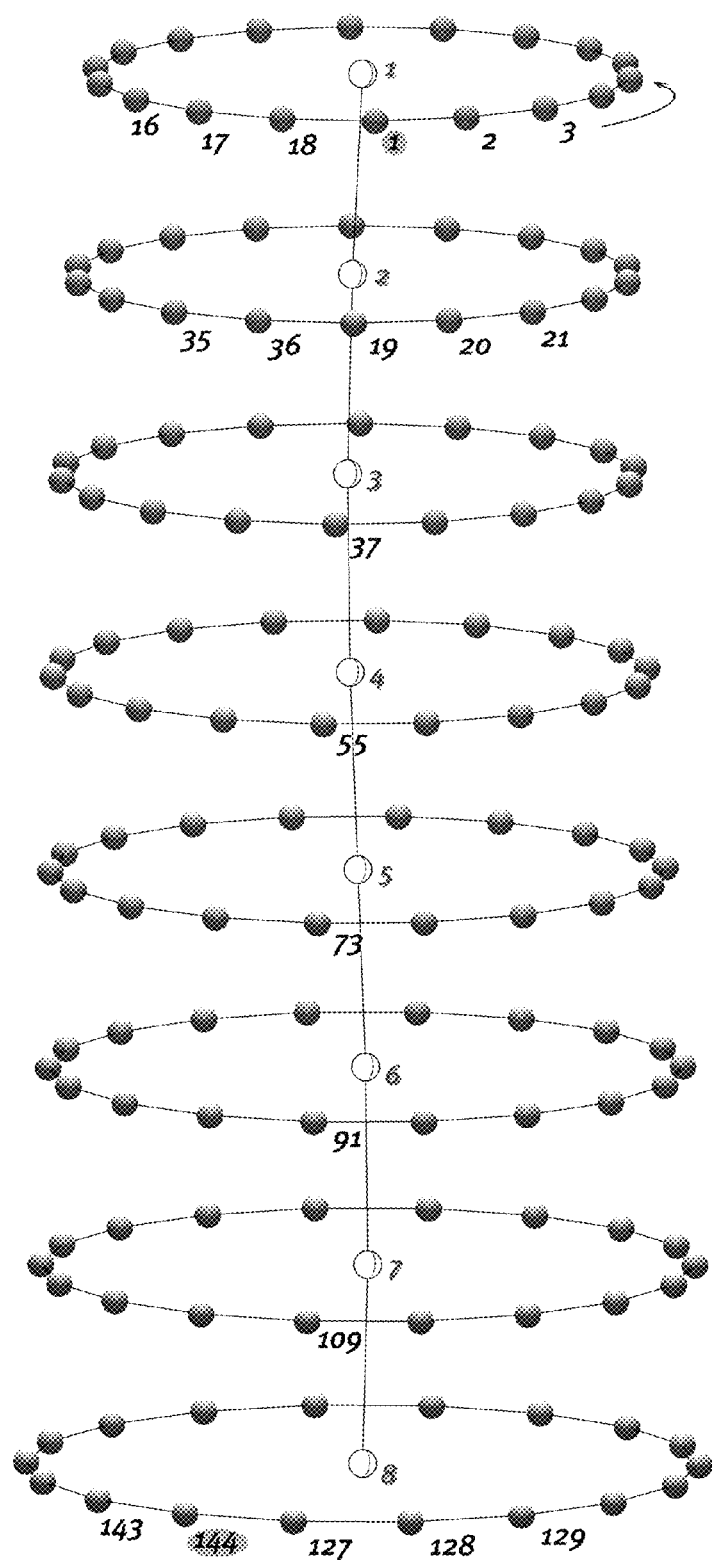
FIGS. 20, 21, 22, 23, 24 and 25 illustrate the addition of attributes and connections to the model graph during the processing at step S400 during the second round of processing.

There are 144 ring bases in the present example. Therefore, at step S420, 144 vertices are inserted into the model graph. FIG. 20 shows the model graph after the processing at step 420.

Automatic attributes are assigned to each vertex (base) by graph manager 80 at step S425. In this example, the automatic attributes are:
Generation: Rings
Index: 1-144
Name: base 1-base 144
Level: RINGS
Colour: 0 (white)

In the present example, at steps S430 and S435, an additional attribute called "Ring Number" is selected and assigned for each ring base. Ring bases are organized in rings. Within each ring, the ring bases are characterized by the fact that they have the same reference backbone base. Backbone bases are numbered from 1 onward and the index of each backbone base in the generation "backbone" can therefore be considered as a ring number.

Based upon the value of the attribute "ring number", the ring bases are partitioned into distinct non-overlapping groups (also called equivalence classes). They can be selected separately wherever a set of bases is needed throughout the generating procedure. For example, when reference coordinate systems are defined for a new generation of bases (step S215) or when content objects are inserted (step S500) or created (step S700) in some of the bases from the current generation of bases.

Additional attributes can be arbitrary, and thus their values may be defined through the use of functions. For the attribute "ring number", the function previously defined at step S215 in this round of processing is used, which is a function for calculating the index of the reference backbone base $I_{ref}$ from the index of ring bases.

Figure 21:
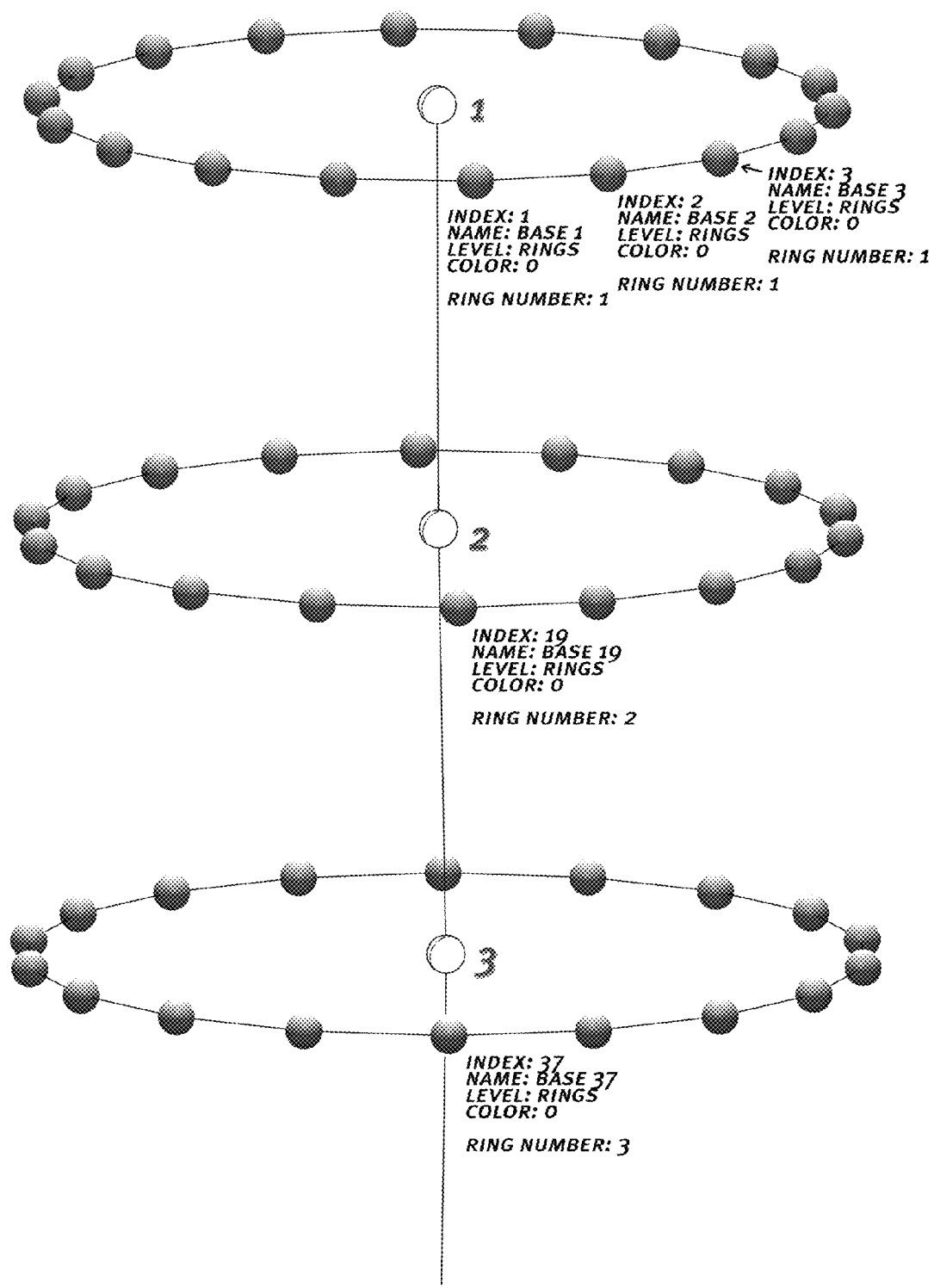

Part of the resulting model graph after assigning values for the additional attribute "ring number" is shown in FIG. 21.

Figure 22:
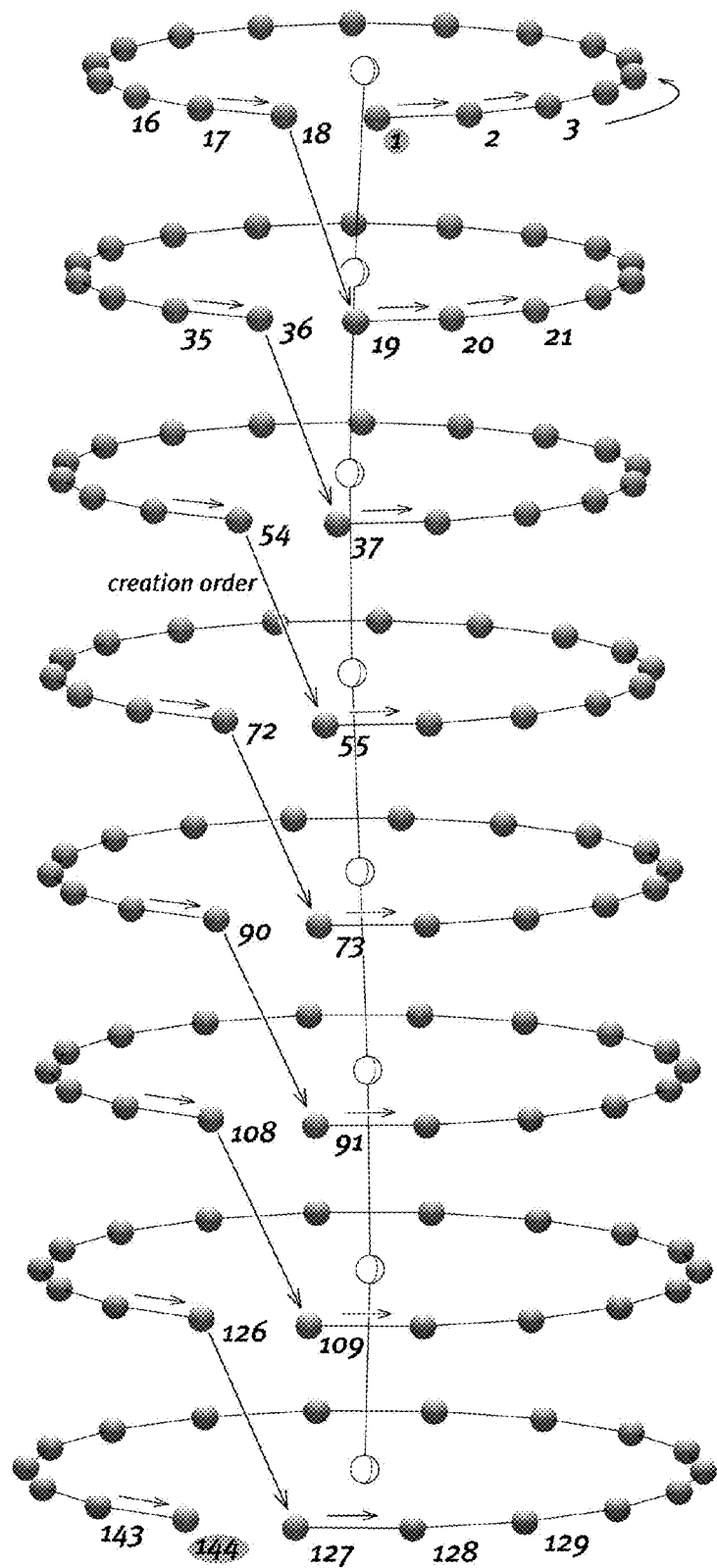

Referring again to FIG. 8, at step S440, graph manager 80 adds the automatic connection called "CREATION ORDER" between the vertices representing ring bases. As noted previously, this connection defines the order in which the vertices were created from first to last. The resulting model graph is shown in FIG. 22, in which the arrows show the creation order.

Additional intrageneration connections are selected and defined in steps 445 and S450. They facilitate the use of the ring bases as parameters in functions and procedures later on in the course of the example. In the present example, four additional connections are defined:

NEXT: Connects a ring base to the base adjacent to it on the right, that has an index number greater by 1, except for the last base on the ring which connects to the first base of the ring TO: Connects a ring base belonging to a ring (see below) to the analogue base on the next ring, that is, first base from ring to the first base from the next ring, second base to the second base from the next ring, and so on to the last base in a ring. Because of the order of creation of the ring bases, the index of the analogue ring base is defined as the index of the relevant ring base plus the number of bases per ring.

PREV: Reversed connection NEXT

FROM: Reversed connection TO

Ring is defined as a group of ring bases which have the same reference backbone base, that is they have the same value of the attribute "ring number", which is assigned in step S435 on this round of processing. "Next ring" is thus a group of ring bases with the consecutive value of attribute "ring number".

Functions for edges for these connections are:
n=total number of ring bases
m=number of bases per ring $$\text{Edges NEXT}=\{(I,\text{Quotient}[I-1,m]m+\text{Mod }[I,m]+1), \{i,1 \text{ to } n\}\}$$

$$\text{Edges TO}=\{(I,I+m),\{i,1 \text{ to } n-m\}\}$$

$$\text{Edges PREV}=\{(I, \text{Mod }[I-1, m]+m(\text{Quotient}[I-1, m]-\text{Sign}[\text{Mod }[I-1,m]]+1)), \{I,1 \text{ to } n\}\}$$

$$\text{Edges FROM}=\{(I,1-m),\{I,m+1 \text{ to } n\}\}$$

Figure 23:
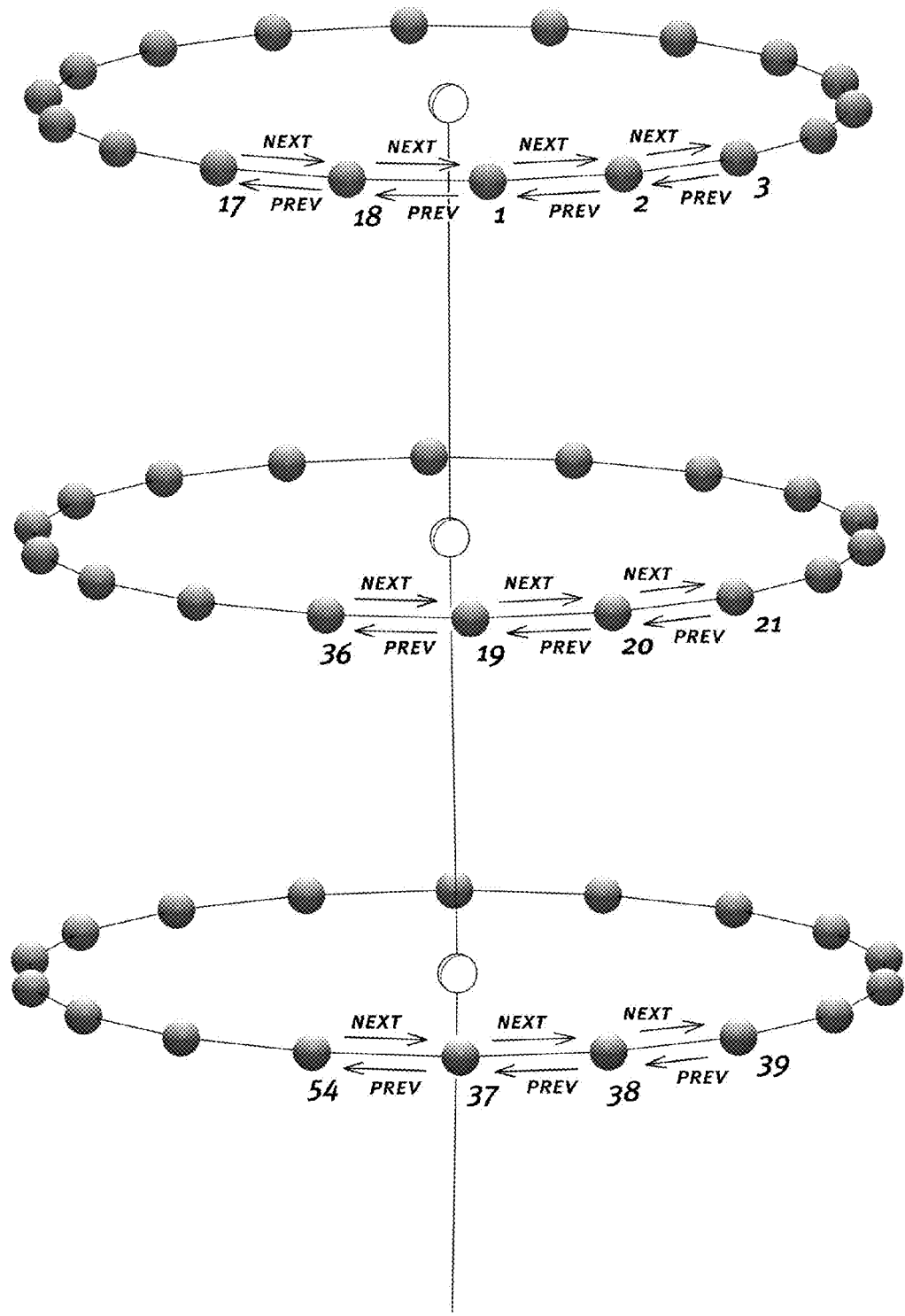
Figure 24:
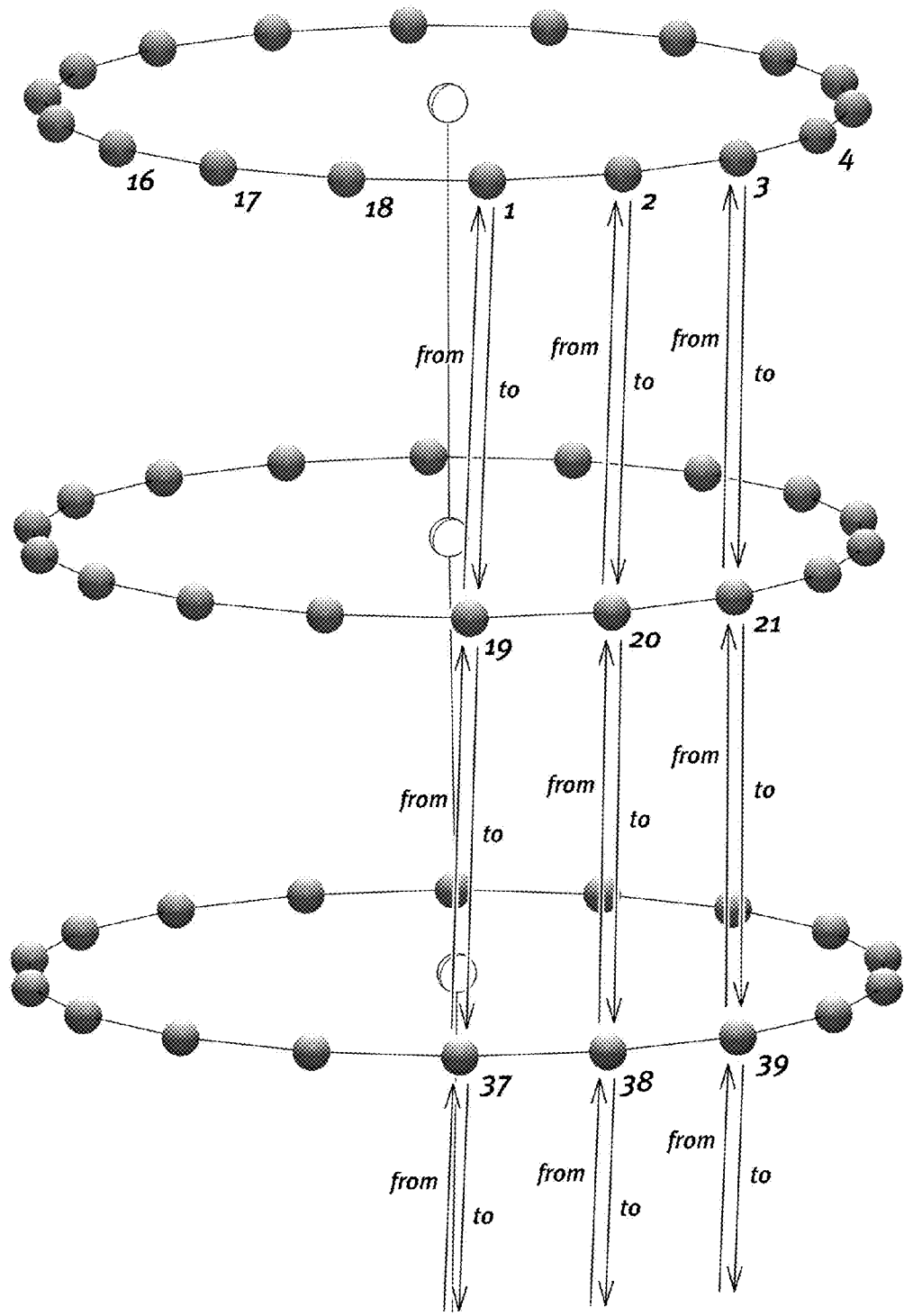

Indices of pairs are relative indices in the set of ring bases. Part of the resulting model graph is shown in FIG. 23 (showing the connections "NEXT" and "PREV") and FIG. 24 (showing the connections "TO" and "FROM").

At step S455, graph manager 80 adds automatic intergeneration connections. An intergeneration connection is a connection that connects bases in different generations (a new base generated in the current round of processing and an existing base generated in a previous round of processing). In this example, a connection called "SUBBASES" is added automatically from each backbone base to every ring base that counts this backbone base as its reference base. The formula for edges is:

$I_{ref}[I]$=index of reference backbone base computed by formula from previous step S215

$$\text{Edges SUBBASES}=\{(I_{ref}[I], I), \{I, 1 \text{ to } n\}\}$$

Figure 25:
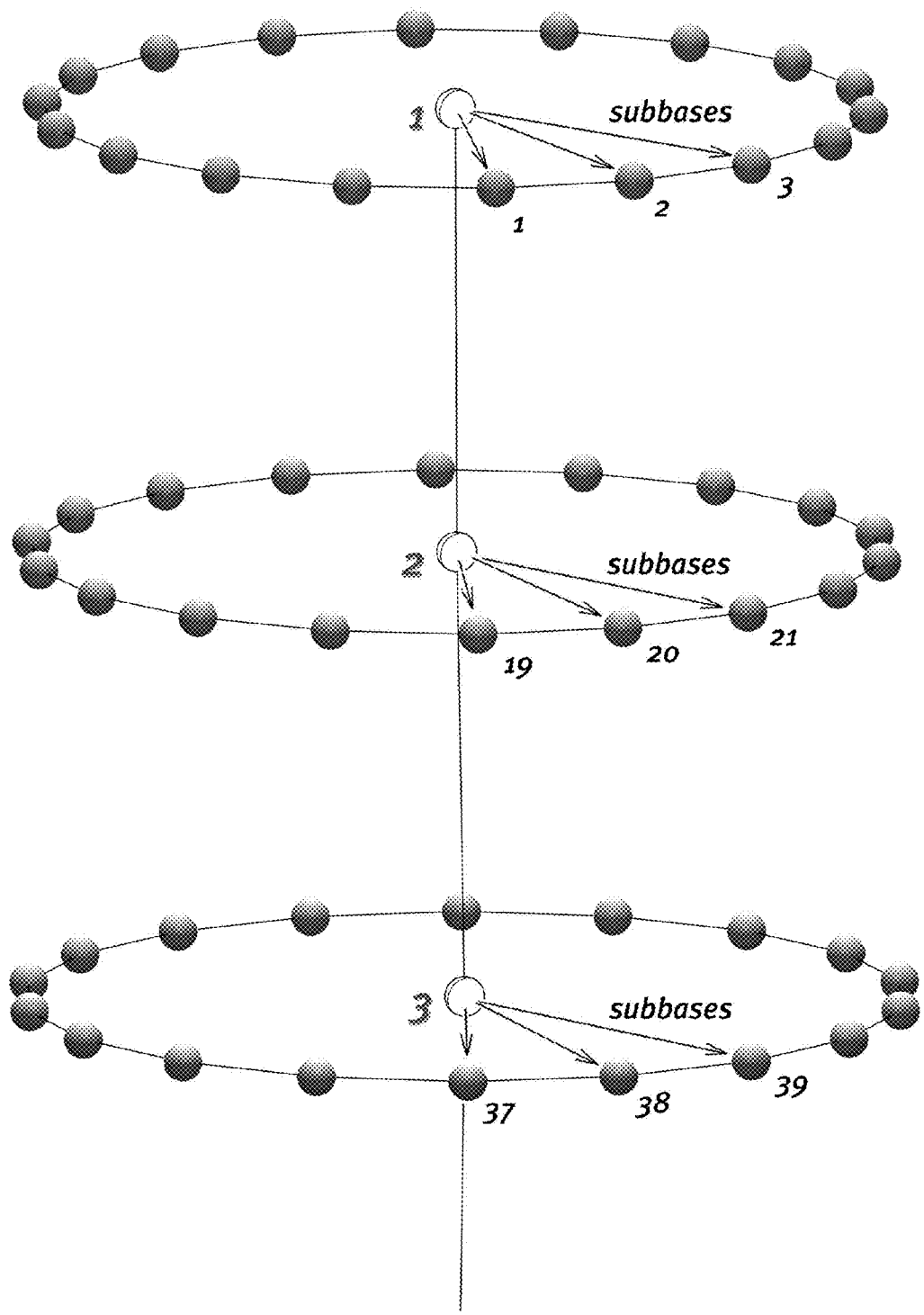

The first index in a pair refers to the backbone bases and the second index refers to the ring bases. Part of the resulting model graph is shown in FIG. 25.

In the present example, there are no additional intergeneration connections for ring bases, and so the processing at steps S460 and S465 is omitted.

At the end of this step, the model is in a consistent state; therefore its data can be exported to other systems for various purposes, as described previously.

Step S500

Figure 26A:
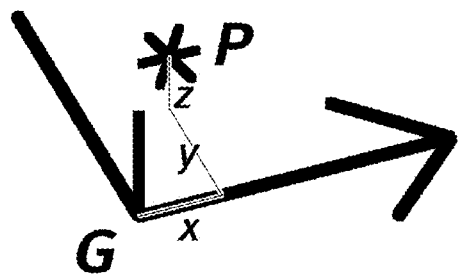
FIGS. 26a and 26b show an example to illustrate the processing performed at step S500 to insert content objects into the ring bases during the second round of processing.

At step S500 in the present example, content generator 90 inserts a content object into each ring base generated at step S300. More particularly, in this example, a point P is inserted into each ring base in the same position relative to the ring base's origin as its position to the global coordinate system G. This relationship is shown in FIG. 26a.

Point P is the same for each ring base, and comprises an example of a primary content object. In this example, the point's coordinates {x, y, z} are defined by the user to be: P={0.4, 0.65, 0.3}.

It should be noted that, although the content object (point P) in this example is inserted into every ring base, this need not be the case, and instead the content object may be omitted from one or more ring bases. Similarly, although the content object inserted into each ring base is the same content object in this example, different content objects could be inserted into different ring bases. For example, each ring (that is, a group of ring bases with the same value of the attribute "ring number") can have a different point $P_r$, as its content object. In this case 8 (equal to the umber of backbone bases) different content objects (points $P_r$) could be added to the ring bases, each point $P_r$, added only to the ring bases which have the value of the attribute "ring number" equal to r.

Figure 9:
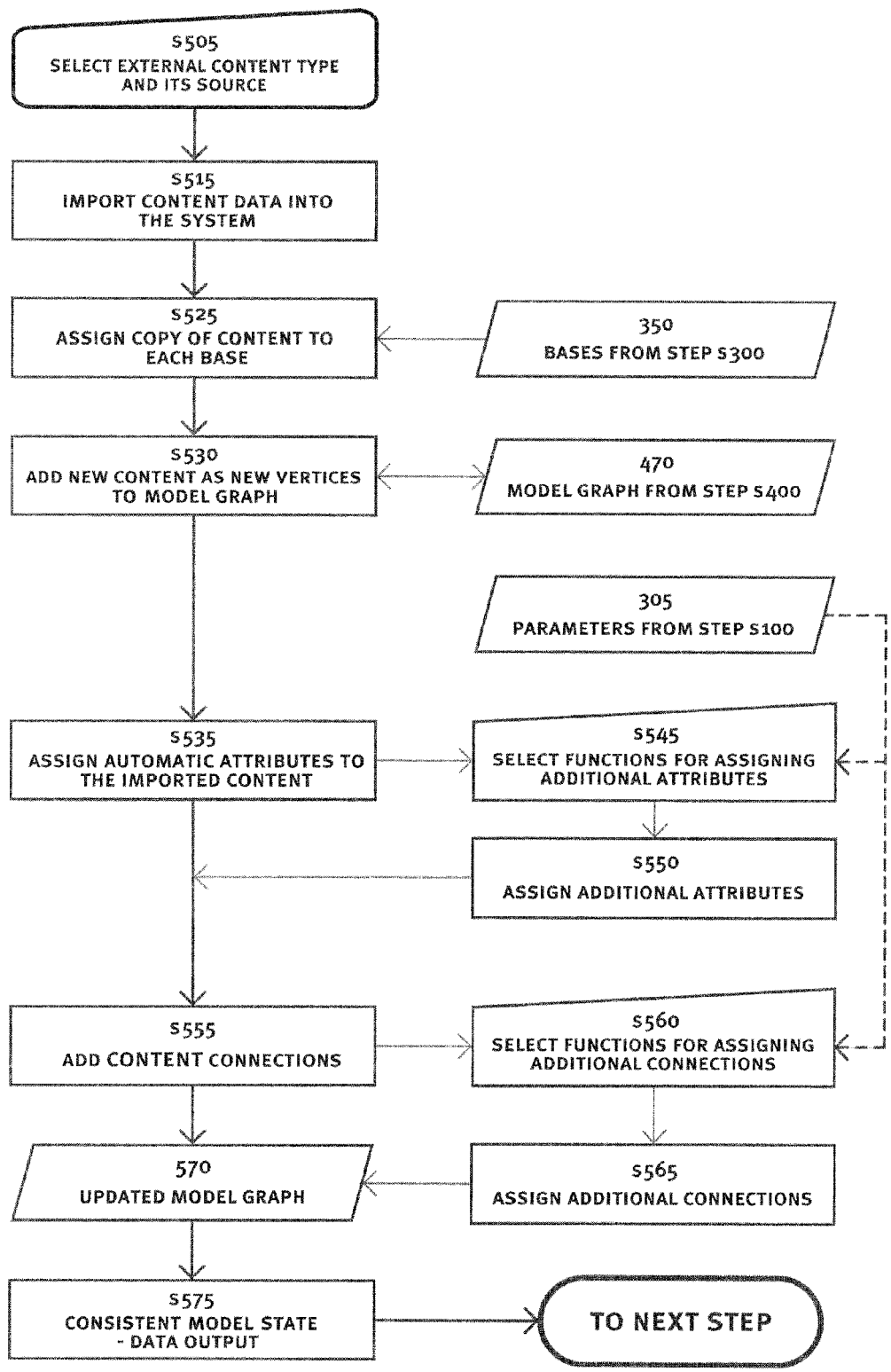
FIG. 9 shows the processing operations performed at step S500 in FIG. 4.

FIG. 9 shows the processing operations performed by content generator 90 at step S500.

Referring to FIG. 9, at step S505, content importer 92 selects the external content object to be imported and its source. In this embodiment, these processes are performed in accordance with user instructions (although they could be performed automatically by computation).

At step S515, content importer 92 imports the selected content object into the system, and assigns a copy of the content object (in this case point P) to each ring base generated at step S300.

Figure 26B:
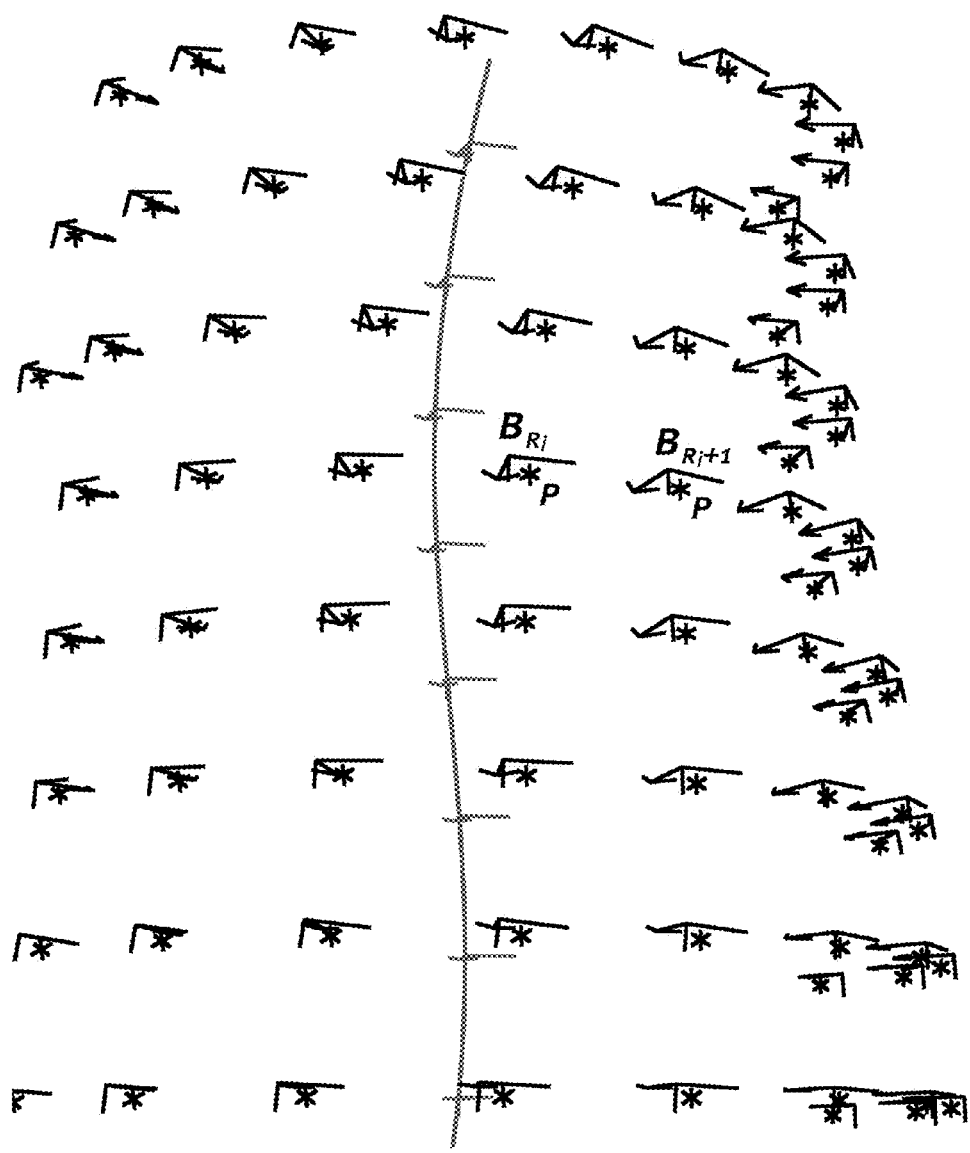

The points P are the first content objects in the model of the present example. Their type is POINT and their data consist of x, y and z coordinates. Each ring base $B_{Ri}$ gets its own copy of point P. This is shown in FIG. 26b.

Figure 27:
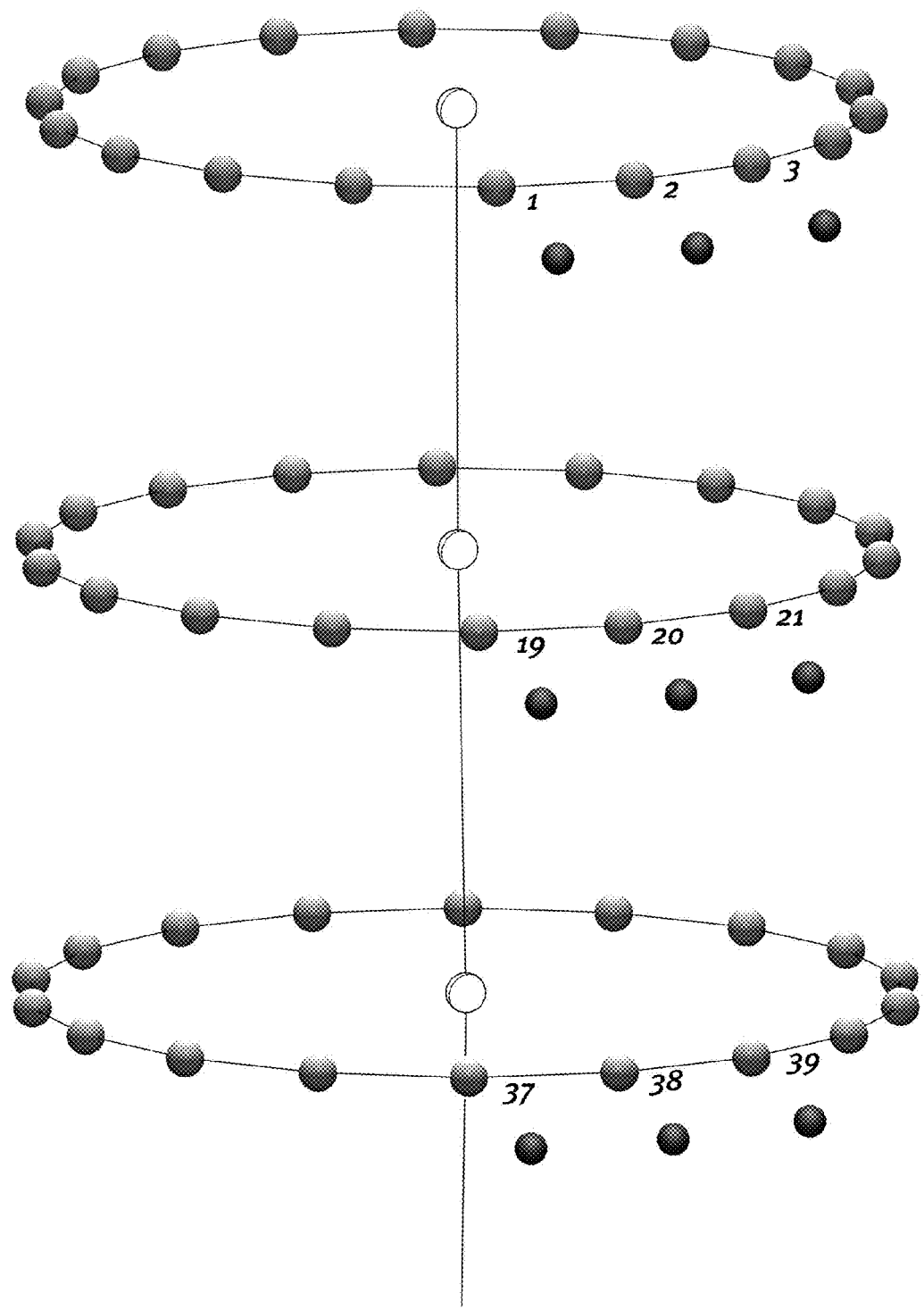
FIGS. 27, 28 and 29 illustrate the addition of attributes and connections to the model graph for the content objects added at step S500.

At step S530, graph manager 80 adds each content object assigned at step S525 as a new vertex to the model graph. This is performed in a similar way to the addition of a vertex for each base at step S420 (described previously). FIG. 27 shows a part of the model graph after step S530.

At step S535, graph manager 80 assigns the following automatic attributes to each vertex in the model graph representing a point P:
  Index: 1-144
  Name: bpoint
  Level: BPOINT
  Colour: 0 (white)

The combination of the attributes "index" and "name" (or the combination "index" and "level") comprise a unique content object identifier, from which each content object can be uniquely identified.

Figure 28:
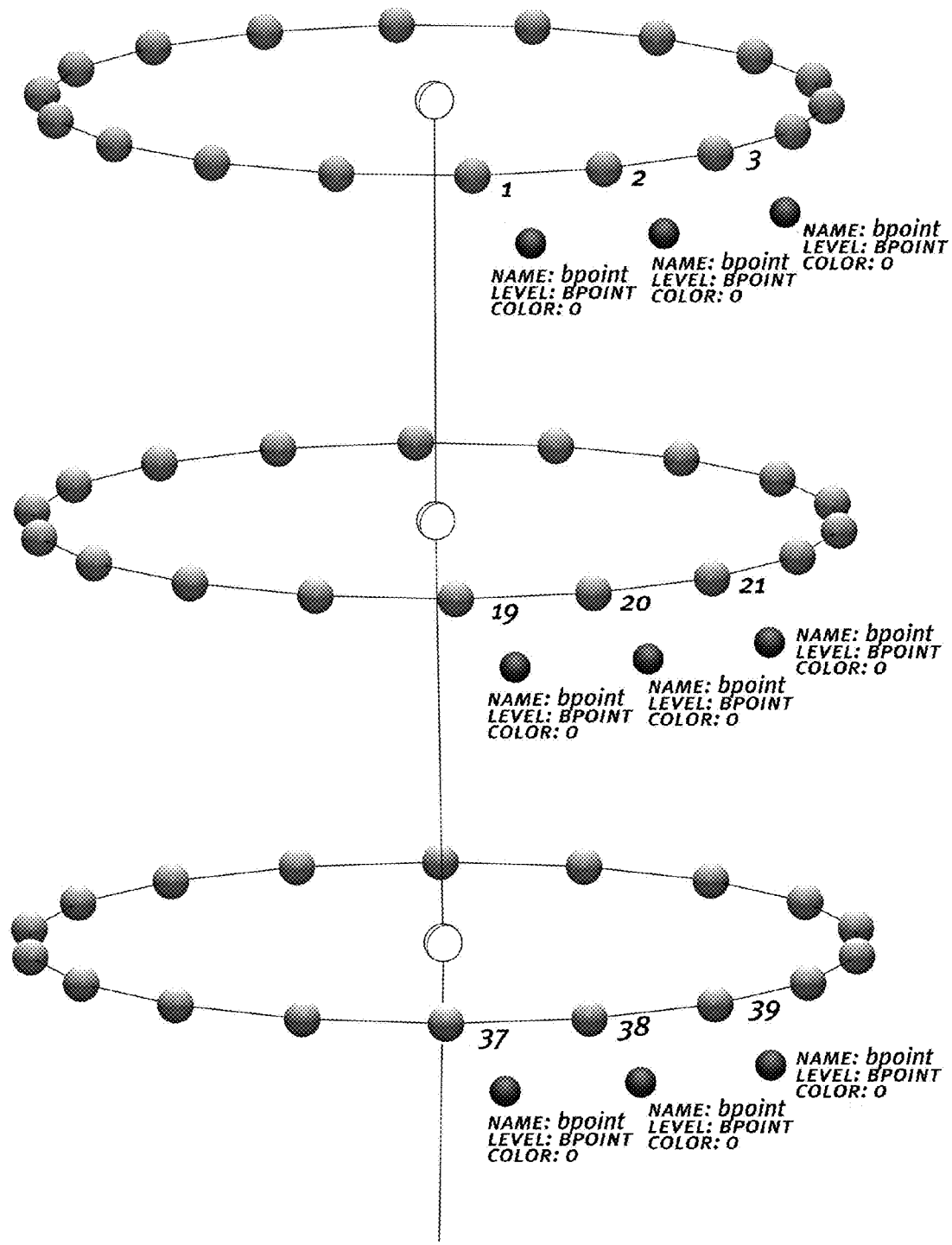

FIG. 28 shows part of the model graph after step S535.

There are no additional attributes for the points P in the present example, and so steps S545 and S550 are omitted on this round of processing.

Figure 29:
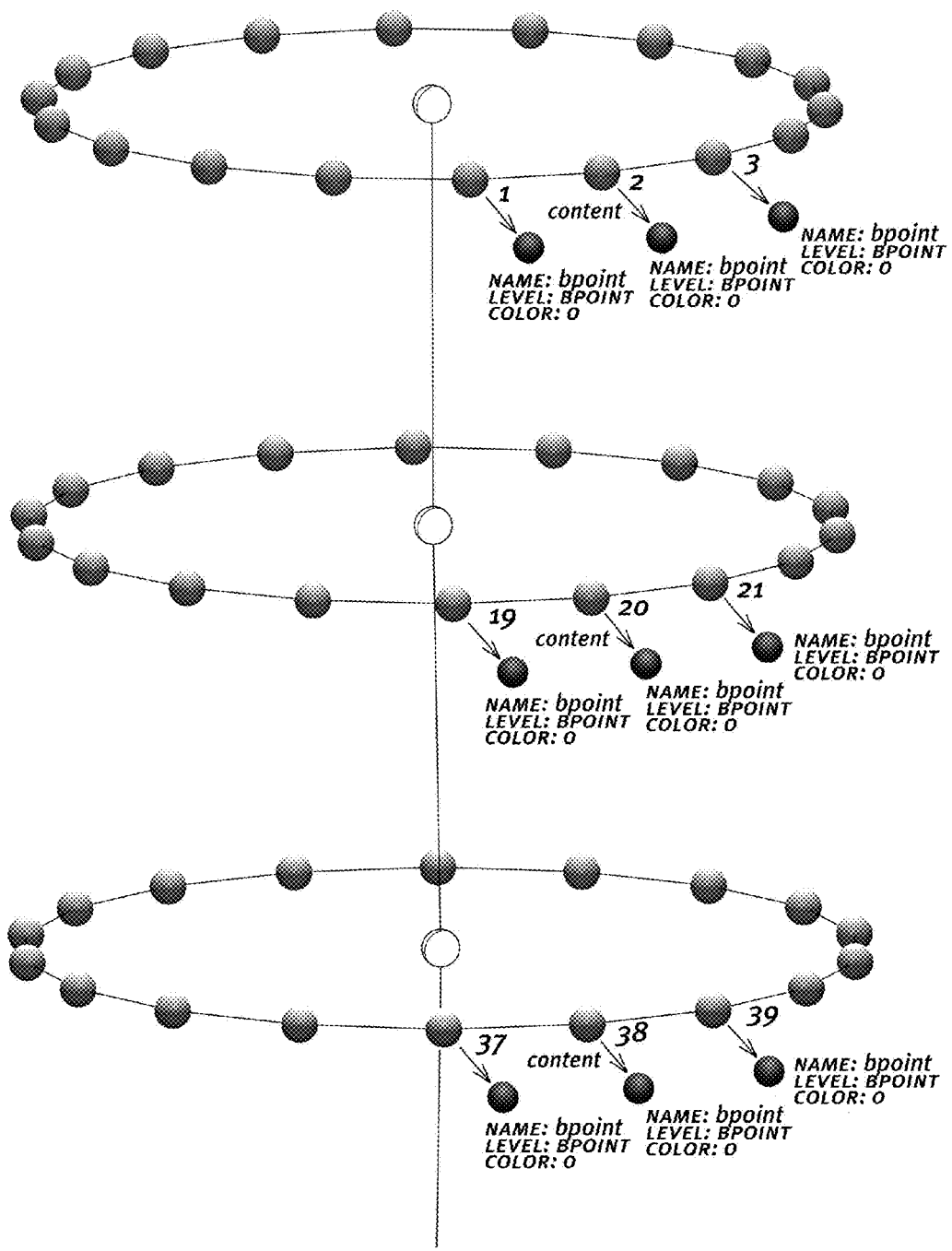

At step S555, graph manager 80 adds CONTENT connections to the model graph for the content objects assigned at step S525 to generate an updated model graph 570. More particularly, each point P has a reference ring base. The automatic connection called "CONTENT" is added to the model graph to show this relation for each ring base and its point. Part of the resulting model graph is shown in FIG. 29.

In the present example, there are no additional connections for the points P, and so steps S560 and S565 are omitted on this round of processing.

At the end of step S500, the model is in a consistent state, and therefore at step S575 its data can be exported to other systems for various purposes, as described previously.

Step S600

In the present example, no additional transformations are needed for the ring bases or their content objects (points P).

Accordingly, no processing is required at step S600, and therefore this step is omitted on this round of processing.

Step S700

At step S700, content generator 90 creates new content objects for the model using one or more mathematical operations.

Figure 11:
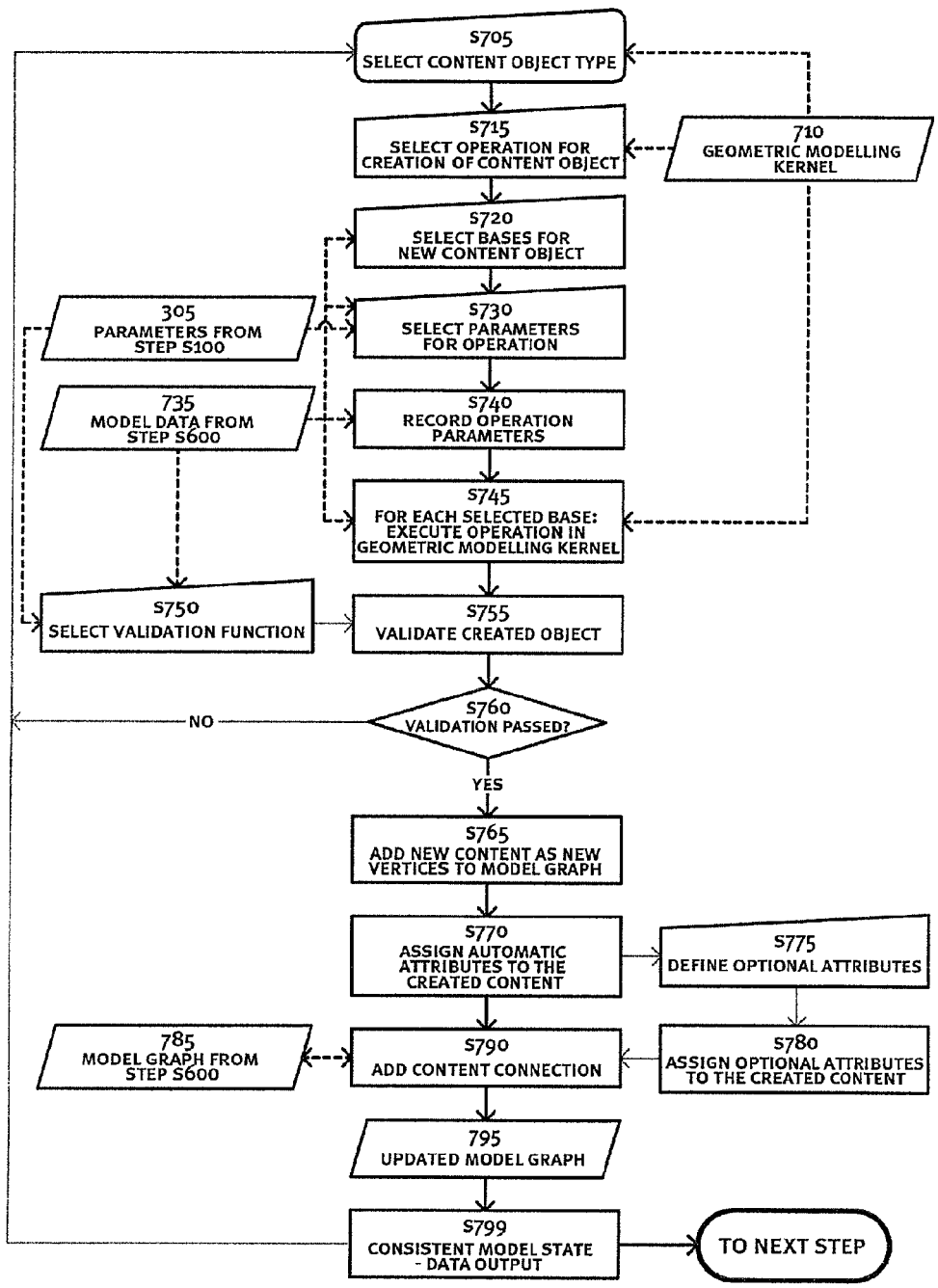
FIG. 11 shows the processing operations performed at step S700 in FIG. 4.

FIG. 11 shows the processing operations performed by content generator 90 at step S700.

In the present example, a solid block (mesh) is inserted into each ring base. To accomplish this, auxiliary objects are created. Six planes are sufficient to fully bound a solid block of the proposed shape, and a line is calculated to define two of the planes. Each content object is created in every ring base according to the same procedure.

The procedure for creating the content objects starts with the creation of the line, then the planes and finally the solid block. Although in reality steps S705 to S799 are executed 8 times in sequence (a line, 6 planes and a mesh), the description of these steps is made for all of the created content objects together.

At step S705, content creator 94 selects the type of each new content object. In this embodiment, the selection is performed in accordance with user instructions (although it could be performed automatically). In this example, the object types are LINE, PLANE and MESH. Lines and planes are primary content objects, while mesh is in the category of solid content objects.

At steps S715, S720 and S730, content creator 94 selects operations for the creation of the content object, the bases in which the content object is to be generated and parameters for the creation operations, respectively, with the selected operation parameters being recorded at step S740. In this embodiment, these selections are performed in accordance with user instructions, although they could be performed automatically.

At step S745, content creator 94 executes the operations selected at step S715 in accordance with the bases and parameters selected at steps S720 and S730 to generate the same new content object(s) in all of the bases selected at step S720. For every new content object, the same generating procedure is executed in all of the selected bases. This assures that if a procedure for creation of a new content object is composed with actual data from a single base, it can be replicated without change to all the selected bases in the generation. The values of actual parameters may be different for every base, but their composition (number and types of parameters) is the same.

These processing operations will now be described in the context of the present example.

Functions for the creation and manipulation of lines and planes are defined directly in the programming language of the system of the present embodiment. For meshes, an external geometric modelling kernel is selected. In this example OpenCASCADE is used.

The following functions are used for the creation of the new content objects in this example:

| Object name: | Description of creation function: |
|---|---|
| Bisector | Angle bisector between two directions from a given point in space. |
| Left plane, Right plane | Oriented plane through line and point |
| Down plane, Top plane | Oriented plane through three points |
| Front plane | "Closest" oriented plane from 4 points (used method of least squares to calculate closest plane) |
| Back plane | Moved and inverted plane |
| White block | Mesh from oriented planes |

FIG. 30a shows the construction of an angle bisector L in ring base $B_{Ri}$. Line L lies in a plane defined by points O, $O_N$ and $O_P$ and bisects the angle between points OP-O-ON.

Point O=origin of ring base $B_{Ri}$

Point $O_N$=origin of ring base $B_{Ri}$→NEXT (=Origin of ring base $B_{Ri+1}$)

Point $O_P$=origin of ring base $B_{Ri}$→PREV (=Origin of ring base $B_{Ri-1}$)

Point $O_T$=origin of ring base $B_{Ri}$→TO (=Origin of ring base $B_{Ri+18}$)

Point $O_{NT}$=origin of ring base $B_{Ri}$→NEXT→TO (=Origin of ring base $B_{Ri+19}$)

Point $O_{PT}$=origin of ring base $B_{Ri}$→PREV→TO (=Origin of ring base $B_{Ri+17}$)

As an aside, it should be noted that the following notation is used herein: $O_{end}$=<$O_{start}$>→<edge 1>[→<edge 2>→ . . . → <edge N>[{<attribute value>}]] shows selection of object $O_{end}$ by following the connections in the model graph from object $O_{start}$ to the object to which connection <edge 1> points, from there to the object to which connection <edge 2> points, and so on to the last object to which connection <edge N> points. Since many connections (e.g., "SUBBASES", "CONTENT") can have more than one value on the same object, a qualifier (<attribute value>) has to be specified to select a particular object. In the previous example notation, $B_{Ri}$→NEXT points to an object which can be selected by following connection NEXT from object (base) $B_{Ri}$. Since this connection has only one value, no qualifiers are needed. From the definition of the connection NEXT in step 400, the object at the end of it is ring base $B_{Ri+1}$.

FIGS. 30b, 30c and 30d show the construction of a plane from 4 points using 3 different subsets of 3 defining points. With four points (O, $O_N$, $O_{NT}$, $O_T$) and one of them fixed (O), only three possible combinations of three different points are possible: (O, $O_N$, $O_{NT}$), (O, $O_N$, $O_T$) and (O, $O_T$, $O_{NT}$). For each triplet, a different plane can be constructed. These three different planes are depicted in FIGS. 30b, 30c and 30d, respectively.

Figure 31B:
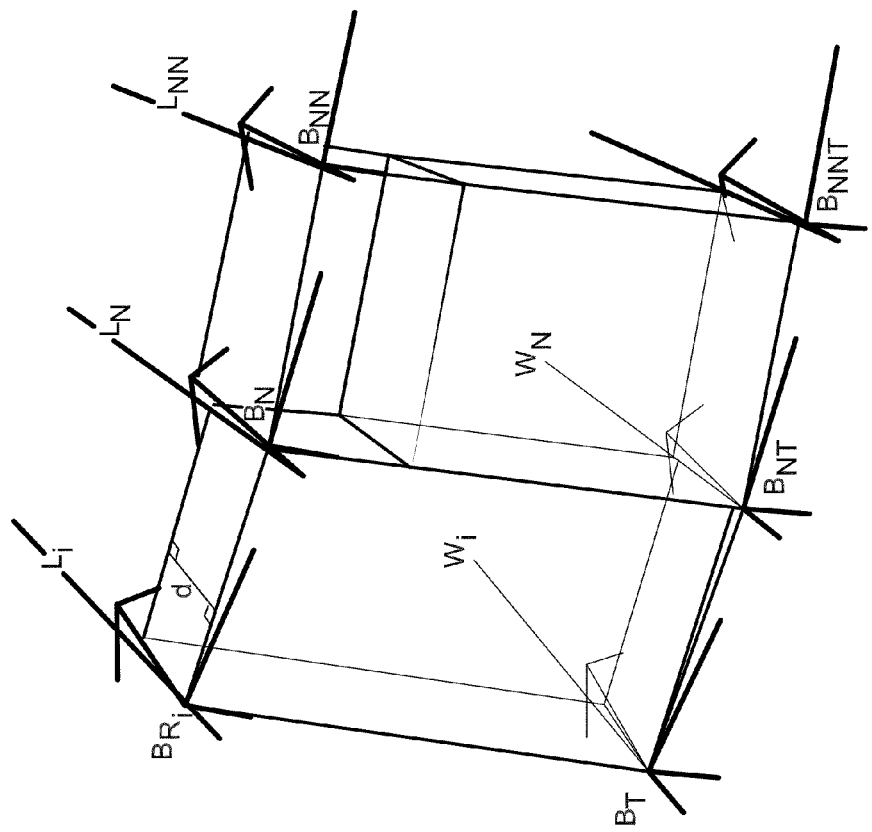
Figure 31A:
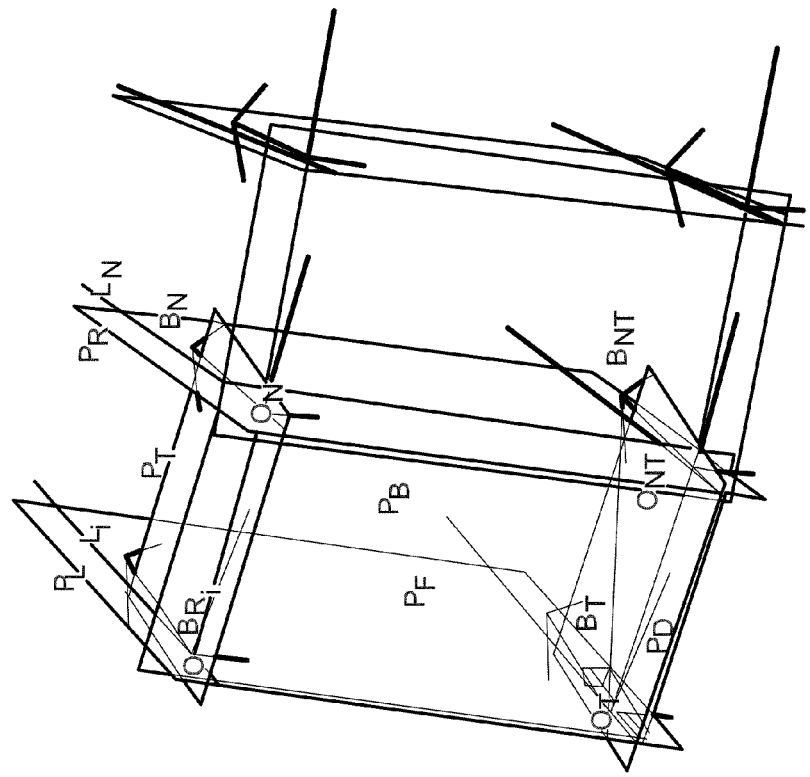

FIGS. 31a and 31b show created content objects in two consecutive ring bases. The labels used in these figures depict the same objects as the labels in FIGS. 30a-30d with the following additions:

Base $B_N$=ring base $B_{Ri}$→NEXT
Base $B_{NN}$=ring base $B_{Ri}$→NEXT→NEXT
Base $B_T$=ring base $B_{Ri}$TO
Base $B_{NT}$=ring base $B_{Ri}$→NEXT→TO
Base $B_{NNT}$=ring base $B_{Ri}$→NEXT→NEXT→TO
Base $B_P$=ring base $B_{Ri}$→PREV
Base $B_{PT}$=ring base $B_{Ri}$→PREV→TO
Line $L_i$=angle bisector in ring base $B_{Ri}$
Line $L_N$=angle bisector in ring base $B_N$
Line $L_{NN}$=angle bisector in ring base $B_{NN}$
Plane $P_L$=plane from line $L_i$ and point $O_T$
Plane $P_R$=plane from line $L_N$ and point $O_{NT}$
Plane Pp=plane from points $O_{PT}$, $O_T$ and $O_{NT}$
Plane $P_T$=plane from points $O_P$, O and $O_N$
Plane $P_F$=plane from points O, $O_N$ and $O_T$
Plane $P_B$=inverted plane $P_F$ moved for distance d
d=depth of white blocks $W_i$
Solid block $W_i$=mesh in ring base $B_{Ri}$
Solid block $W_N$=mesh in ring base $B_N$ Lines $L_i$, $L_N$ and $L_{NN}$ are constructed by the procedure illustrated in FIG. 30a in bases $B_{Ri}$, $B_N$ and $B_{NN}$ respectively.

Plane $P_L$ is constructed from line $L_i$ and point $O_T$. Line $L_i$ is represented with two points; therefore the plane can be constructed from a line and an additional point. The plane's normal vector lies in the same halfspace as the point $O_P$.

The example procedure above for creating planes shows the importance of attributes and connection data stored in the model graph. Using only an arithmetic function on the indices of the ring bases would return incorrect ring bases for parameters for the first and the last base on each ring. All of the parameters (points needed for construction of a plane) are actually origins of ring bases. But for the procedure to have appropriate origins of ring bases for parameters for each ring base in which new content objects (planes) are created, the connections NEXT, PREV and TO must be used. The connections NEXT and PREV encode the information about neighbouring ring bases of the relevant ring base on the same ring, while the connection TO represents information about the analogue ring base from the next group of ring bases.

Plane $P_R$ is constructed from line $L_N$ and point $O_{NT}$. The plane's normal vector lies in the same halfspace as the point $O_{NN}$.

Plane $P_R$ is constructed from three points $O_{PT}$, $O_T$ and $O_{NT}$. The plane's normal vector lies in the opposite halfspace as the point O.

Plane $P_T$ is constructed from three points $O_P$, O and $O_N$. The plane's normal vector lies in the opposite halfspace as the point $O_T$.

Plane $P_F$ is constructed from three points O, $O_N$ and $O_T$. The plane's normal vector lies in the opposite halfspace as the point O+X-axis [$B_{Ri}$].

Plane $P_B$ is inverted plane $P_F$, moved for distance d in the direction of the normal vector of plane $P_B$.

$P_B$=MovePlane [InvertPlane [$P_F$], d]

Solid block $W_i$ is a mesh constructed from planes $P_L$, $P_R$, $P_D$, $P_T$, $P_F$, $P_B$. Each plane divides a space into two halfspaces and one of them can be considered full. By convention, the halfspace in which the normal vector of the plane points is considered empty, the other half as solid. Solid block $W_i$ is then constructed as an intersection of six planes. The normal vectors of the six bounding planes are oriented in such a way that they point outwards of the resulting solid block.

From the above, it will be understood that each content object is generated in accordance with a procedure comprising a series of steps using at least one mathematical function. Furthermore, the procedure for the generation of each content object is dependent upon a plurality of ring bases (even though the content object is defined in the local coordinate system of only one base). Accordingly, because the arrangement of ring bases varies throughout the model (because the ring bases were defined so that they vary in accordance with the identity of the backbone base to which they belong), then the content objects also vary throughout the model in accordance with the variations of the ring bases. However, it should be noted that the present embodiment does not provide a separate definition of each content object in order to achieve this variation—instead, a single definition is provided using at least one mathematical function and a plurality of bases. If the designer subsequently changes the arrangement of bases, then the system will automatically regenerate the content objects in accordance with the definition using the new arrangement of bases and the mathematical function(s) for the definition of the content objects. As a result, the system adapts the content objects to any change in the bases.

In the present example, new content objects are not created in all ring bases. More particularly, the definition of planes and white block depends on the data of the ring bases from two consecutive rings. However, each base on the last ring has no TO connection, meaning that there are no more ring bases. Accordingly, for bases on this ring (ring number 8), no new content objects are created.

FIG. 31b shows the final solid blocks $W_i$ and $W_N$, belonging to ring bases $B_{Ri}$ and $B_N$ respectively. Block $W_N$ is rendered in cross-section.

In the present embodiment, as well as geometric data, content objects also keep information on object type, selected creation function(s) and references to the bases and/or objects that serve as parameters for the creation function(s). For example, the object "White block" Wi stores following non-geometric data:
   Object type: Mesh
   Geometric modelling kernel: OpenCASCADE
   Creation function: Mesh from oriented planes (from Open-CASCADE)
   Pointers to reference objects: Base $B_{Ri}$
      Planes $P_L$, $P_R$, $P_D$, $P_T$, $P_F$, $P_B$
   Values of reference parameters: Numeric parameter d Representation of a content object with operation and references to parameter objects for an operation enables the system to keep track of the history of a content object. In addition, the system can reevaluate the object anytime, possibly with altered source object parameters.

After the creation of each content object, its validity is checked by content creator 94 at steps S750 and S755. This processing is performed in this embodiment because not all combinations of input data can produce valid objects. For example, a line is defined with two distinct points. If the points are the same, then the line is not defined properly, it is not valid, and cannot be used in other operations. Each type of object has its own set of criteria that must be satisfied for successful validation. Simple objects like points, lines, planes, can be easily checked. More complex ones like meshes and other solid objects may need special functions to be properly checked. In this embodiment, these functions are provided by the geometric modelling kernel used for computing the solid objects and are executed automatically (that is, the creation function fails if the resulting object is not properly formed). In the event that a validation function is not provided automatically, the present embodiment allows for a validation function to be selected by content creator 94 at step S750 in accordance with user instructions.

In this example, the following validation checks are performed:
   Line: check for points not to be coincident (line vector must be non-zero)
   Plane: check for points not to be collinear (normal vector must be non-zero)
   Mesh: validated implicitly by geometric modelling kernel that performs the creation function After it is determined at step S760 that a created content object has been validated, graph manager 80 adds the object as a new vertex to the model graph at step S765.

Figure 32:
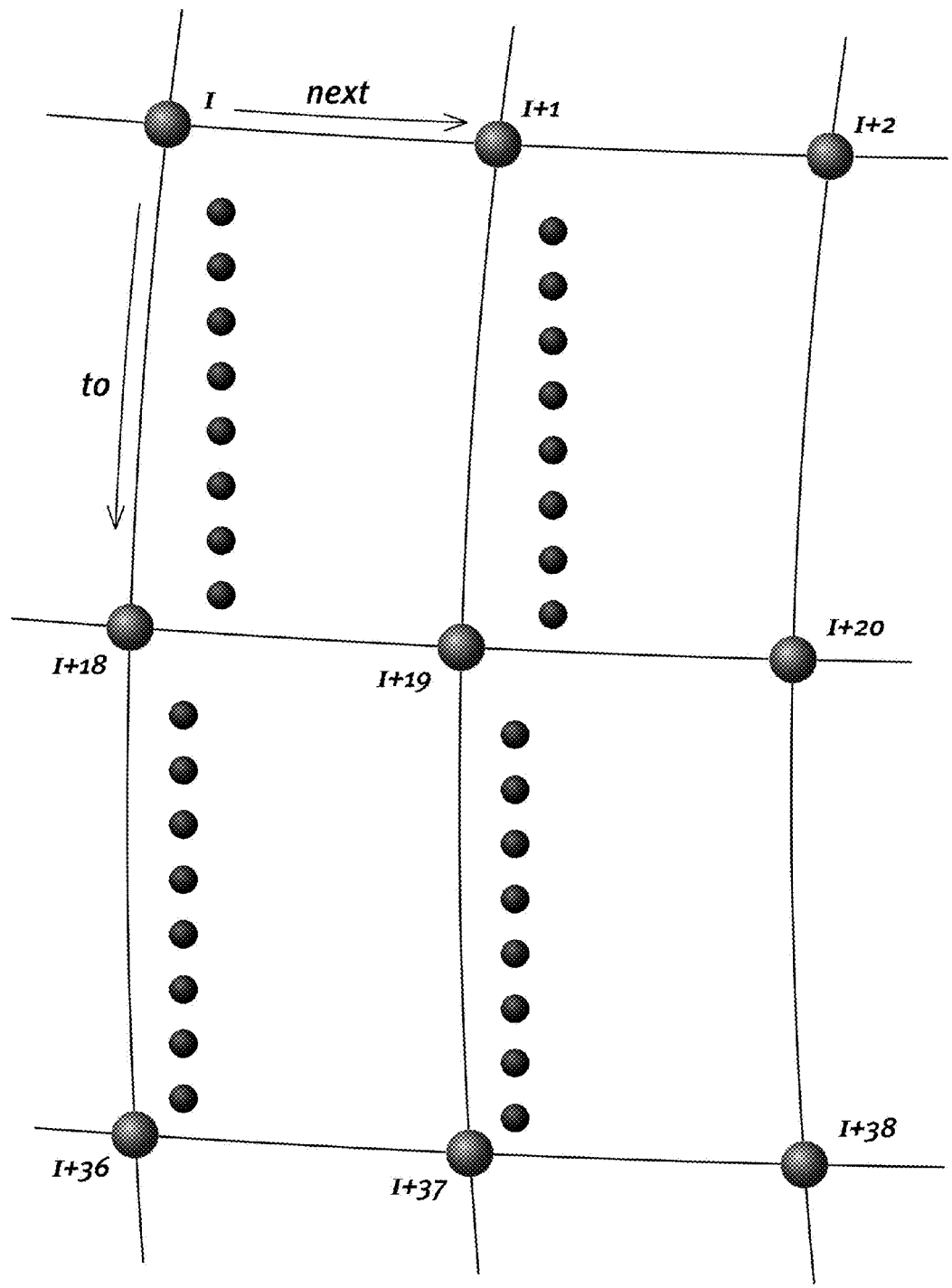
FIGS. 32, 33 and 34 illustrate the addition of attributes and connections to the model graph for the content objects created at step S700 in the second round of processing.

In the present example, for each ring base, 8 new vertices are inserted into the model graph. FIG. 32 shows part of the model graph with new vertices for the content objects in ring bases with indices I, I+1 and I+18.

At step S770, graph manager 80 assigns automatic attributes to each new vertex in the model graph representing a new content object. In the present embodiment, the automatic attributes assigned by graph manager 80 to a content object comprise:

| Index | Name | Level | Colour |
|-------|------|-------|--------|
| I | Bisector | BISECTOR | 0 |
| I | Left plane | PL-LEFT | 0 |
| I | Right plane | PL-RIGHT | 0 |
| I | Down plane | PL-DOWN | 0 |
| I | Top plane | PL-TOP | 0 |
| I | Front plane | PL-FRONT | 0 |
| I | Back plane | PL-BACK | 0 |
| I | White block | BLOCK | 0 |

At step S775, graph manager 80 selects any additional attributes to be added for a content object in accordance with user instructions, and at step S780, adds the additional attribute(s) to the model graph.

Figure 33:
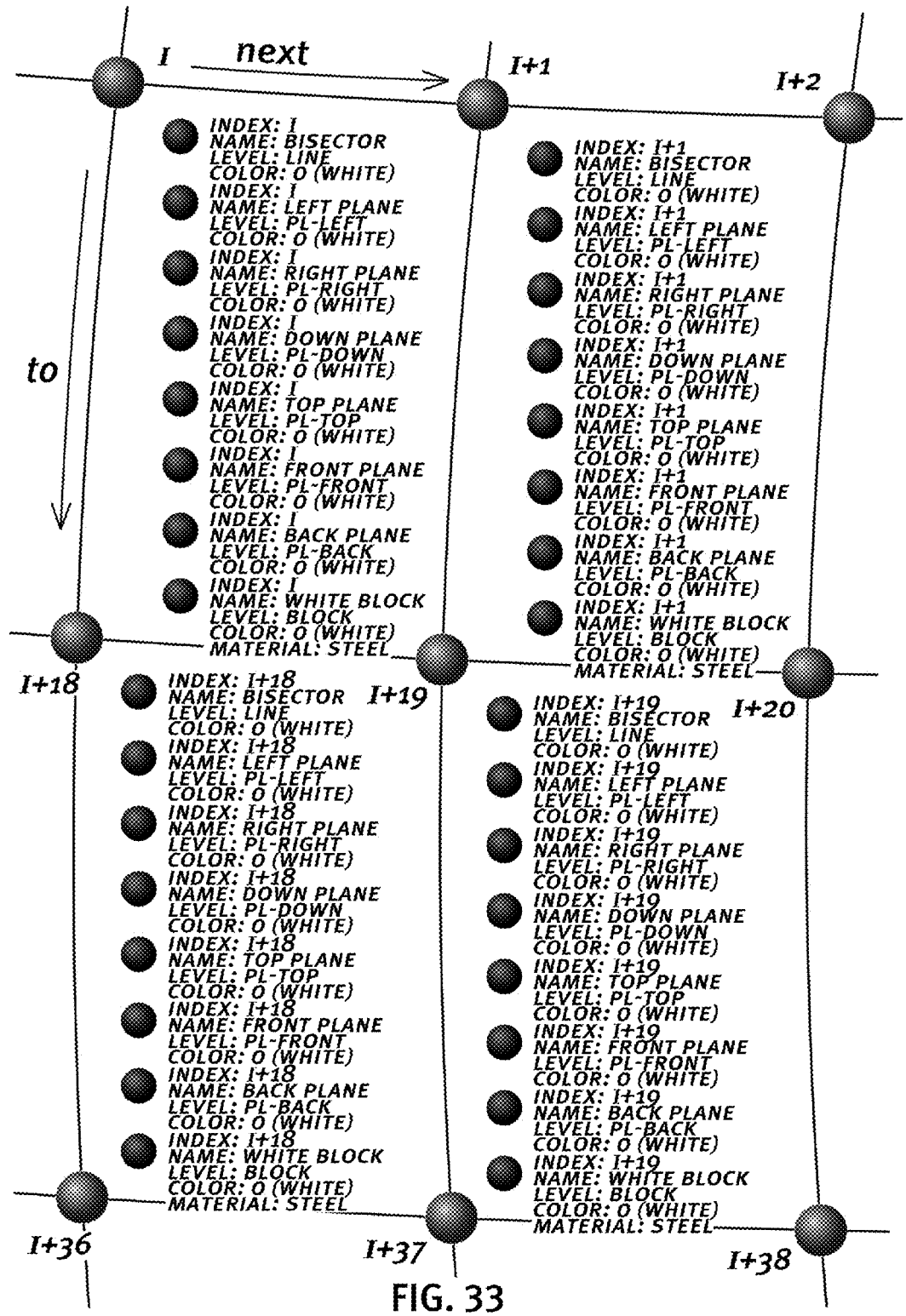

In the present example, an additional attribute called "Material" is selected and added for the object "White block". In this example, the attribute has the same value for all White blocks: STEEL FIG. 33 shows the same part of the model graph as FIG. 32 with the attributes added at steps S770 and S780 for the present example.

At step S790, graph manager 80 adds a CONTENT connection to the model graph for each new content object.

Figure 34:
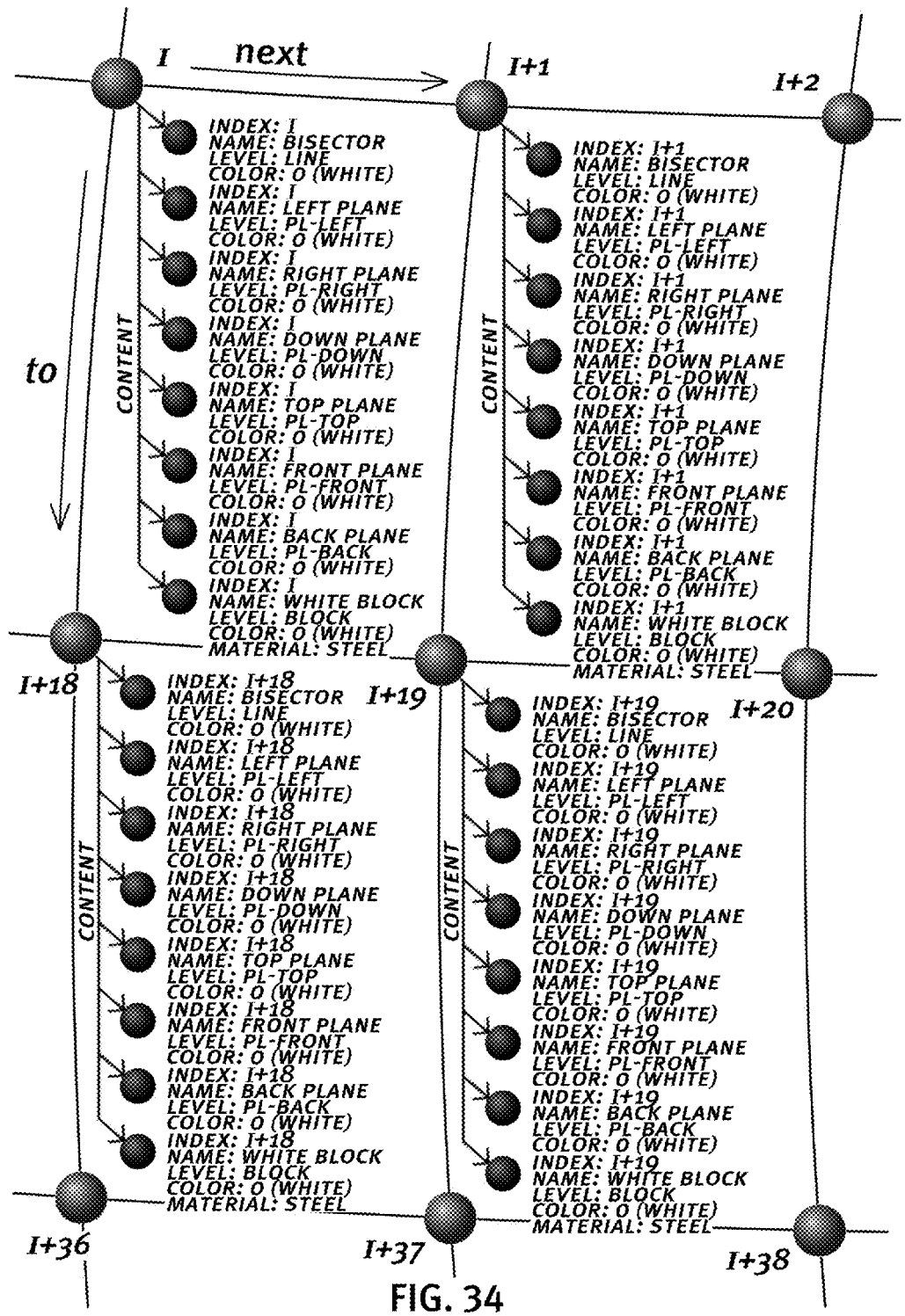

In the present example each new content object has a reference ring base. Accordingly, at step S790, the automatic connection called "CONTENT" is added to the model graph to show this relation between the reference ring base and the new content object. Part of the resulting model graph is shown in FIG. 34.

At the end of step S700, the model is in a consistent state, and therefore at step S799 its data can be exported to other systems for various purposes, as described previously.

Step S800

Step S800 is the last step in the generation of ring bases. In this step, sensor function executor 110 generates and executes one or more so-called sensor functions to test a property of the bases or content objects and to divide the bases or content objects into equivalence classes in dependence upon the results of this test.

In the present example, sensor function executor 110 classifies bases into two equivalence classes. As will be described later, the system subsequently generates content objects such that the content objects depend upon the equivalence class to which their reference base belongs.

Figure 12:
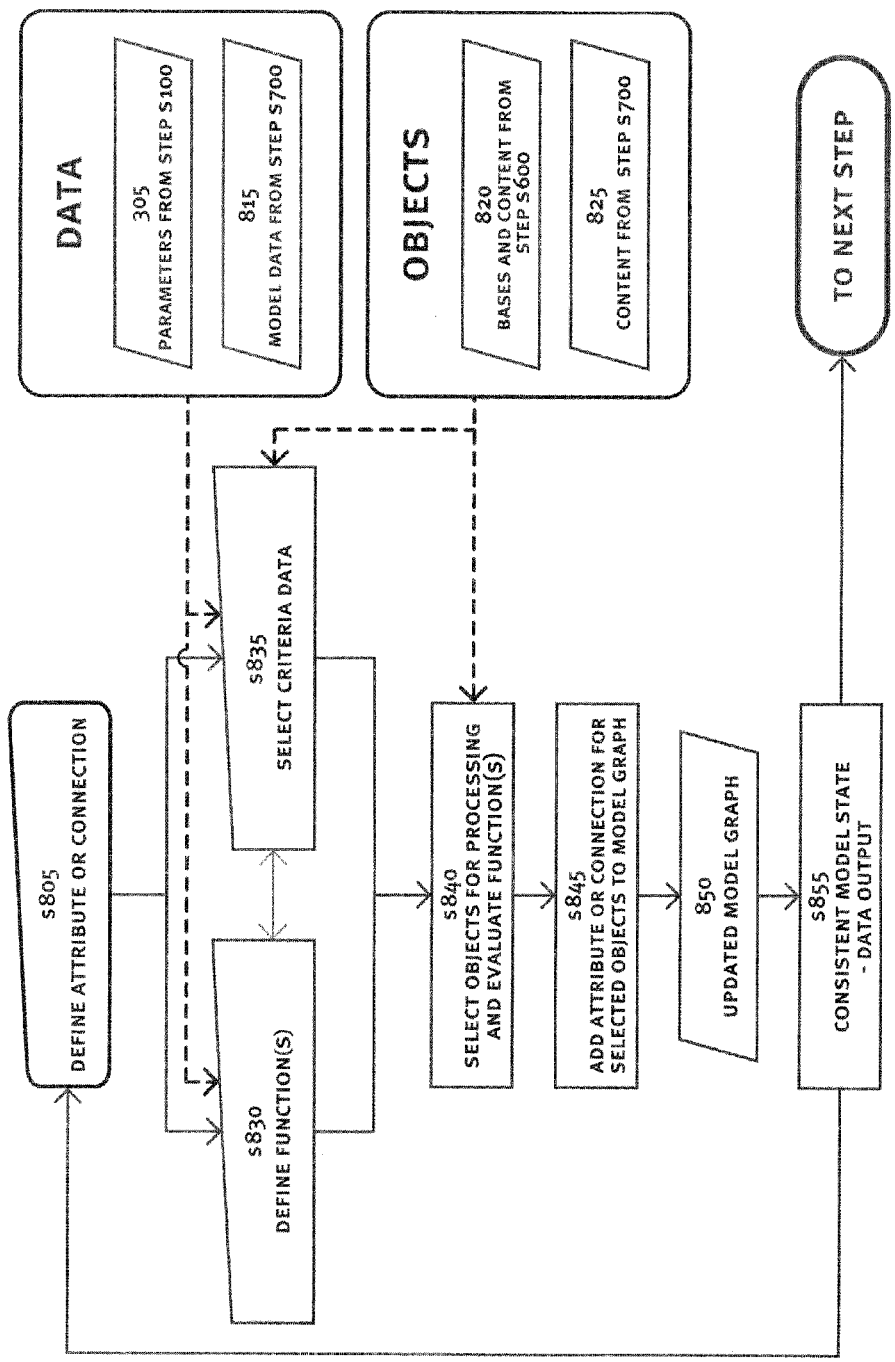
FIG. 12 shows the processing operations performed at step S800 in FIG. 4.

FIG. 12 shows the processing operations performed at step S800, together with the data inputs comprising parameters 305 from step s100 and model data 815 from step s700, and the objects input comprising bases and content 820 from step s600 and content 825 from step s700.

Referring to FIG. 12, at step S805, sensor function executor 110 defines one or more attribute(s) and/or one or more connection(s) on which a sensor function is to operate. More particularly, sensor function executor 110 may select an existing attribute or connection or instead may define a new attribute or connection.

In the present example, the new attribute "CURVATURE" is added to each ring base. This attribute may take one of two possible values, "+" and "−" (which is calculated later), such that bases with "+" CURVATURE fall within one equivalence class and bases with "−" CURVATURE fall within another equivalence class.

At step S830, sensor function executor 110 defines a sensor function, Sensor [I], to be used in calculating values of the attribute(s) and/or connection(s) defined at step S805. If an existing attribute or connection is selected at step S805 which already has stored values, then step S830 is omitted.

In the present example, the following sensor function Sensor [I] is defined:

Base C [$I_{ref}$[I]]=I-th ring base's reference backbone base.
Point $O_C$=Origin of backbone base C [$I_{ref}$[I]]
Base $B_{Ri}$=I-th ring base
Point $O_{Ri}$=Origin of base $B_{Ri}$
Point $O_F$=Origin of base $B_{Ri}$→FROM (=Origin of base $B_{Ri}$−18)
Point $O_T$=Origin of base $B_{Ri}$→TO (=Origin of base $B_{Ri+18}$)
Plane PL1=PlaneFrom3Points[$O_F$, $O_T$, $O_C$]
Plane PL [I]=plane orthogonal to the plane PL1 with a normal vector pointing away from point $O_C$.
nrb=number of bases per ring
N=total number of ring bases
Sensor [I]=signed distance from plane PL[I], {I, nrb+1 to N−nrb}

At step S835, sensor function executor 110 selects criteria data to be applied to values computed using the sensor function Sensor [I] in order to divide the bases/content objects into equivalence classes.

In this example, the following criteria data are selected:

$$\text{CURVATURE } [I] = \begin{cases} -, & \text{Sensor}[I] < 0 \\ +, & \text{Sensor}[I] \geq 0 \end{cases}$$

Broadly speaking, the sensor function Sensor [I] and the criteria data define values of the attribute CURVATURE which represent the curvature of the surface of the model in the vicinity of a ring base. If the curvature in the vertical direction in the immediate vicinity of a ring base is convex, then the CURVATURE value is "+" for that ring base. On the other hand if the curvature is concave, the value is "−".

At step S840, sensor function executor 110 selects objects to which the sensor function Sensor [I] and criteria data are to be applied.

In the present example, the sensor function is well defined only for the ring bases on rings 2 to 7. This is because the ring bases from the first ring (ring number 1) have no FROM connection and the ring bases from the last ring (ring number 8) have no TO connection. The values of the sensor function for ring bases on the last ring are not needed because there are no "white blocks" content objects in them. On the other hand, the ring bases from the first ring should be classified and therefore the sensor function should return an appropriate value for them. To achieve this, in this example, the curvature of the ring bases from the second ring is "continued" to the bases on the first ring:

Sensor [I]=Sensor [I+18], {I, 1, nrb}

After, selecting the objects for processing, sensor function executor 110 applies the sensor function Sensor [I] to the selected objects and determines the value of the attribute CURVATURE for each object in accordance with the sensor function value and the criteria data selected at step S835.

Thus, in the present example, application of the sensor function Sensor [I] and the criteria data above divides the ring bases into two equivalence classes—that is, ring base having "+" CURVATURE and ring bases having "−" CURVATURE.

Figure 35A:
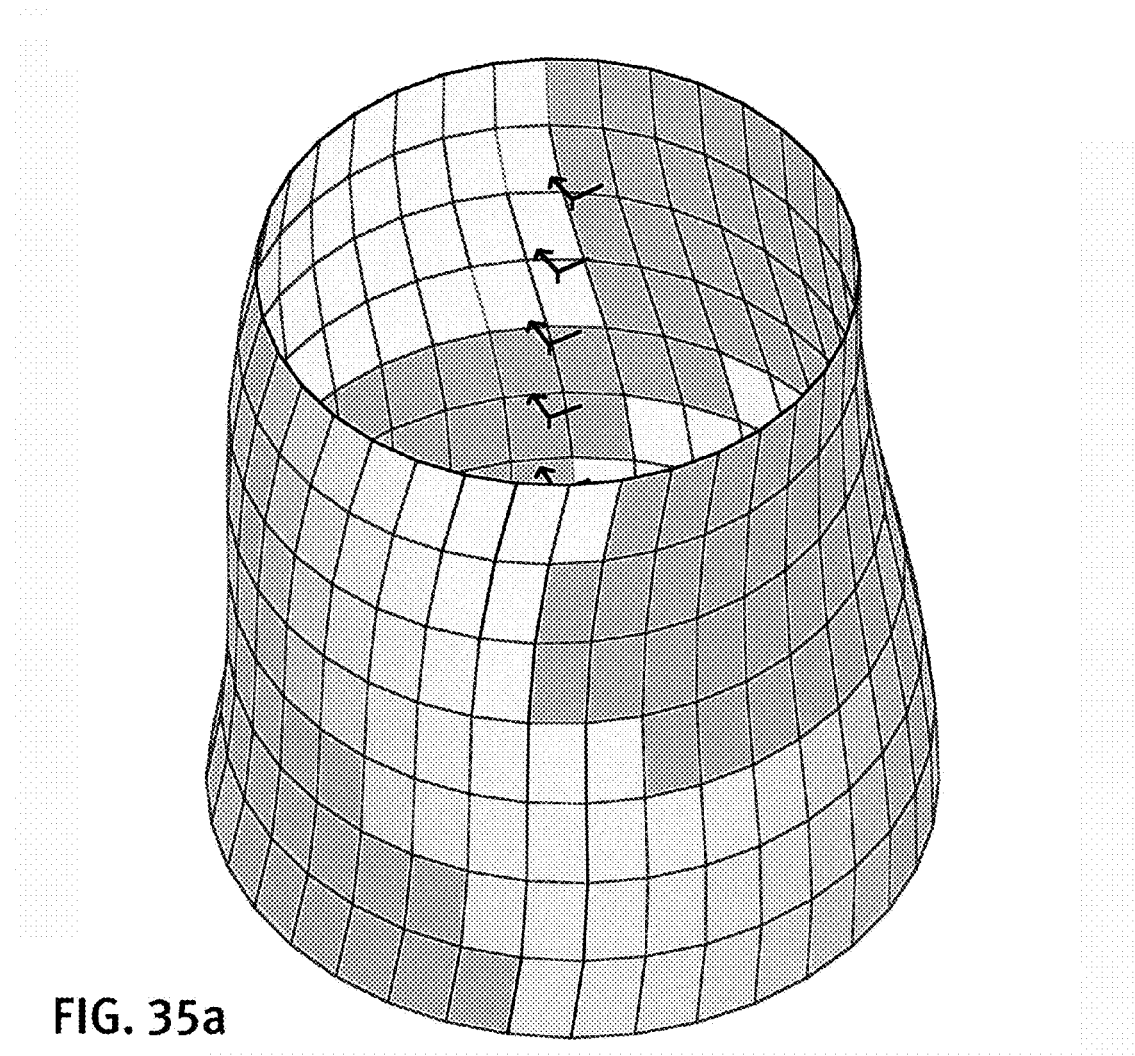
FIGS. 35a, 35b and 35c show the result of applying a sensor function at step S800 in the second round of processing to divide bases into two separate equivalence classes.
Figure 35B:
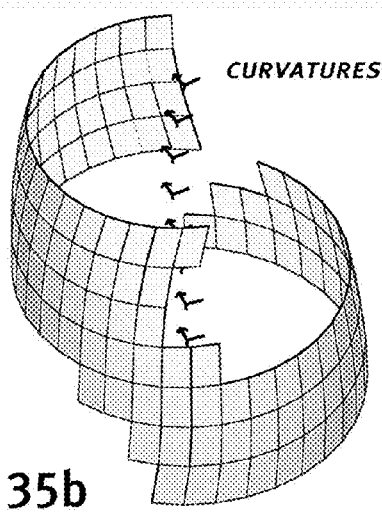
Figure 35C:
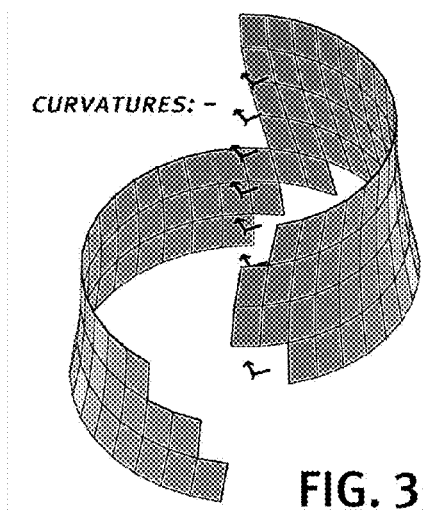

FIGS. 35a, 35b and 35c show the distribution of these two equivalence classes over the model of the present example. To better see the difference between the convex and concave curvatures, the white blocks generated in step 700 are shaded differently according to the value of attribute "CURVATURE". FIGS. 35b and 35c show only blocks in ring bases having a value of the attribute CURVATURE "+" and "−" respectively.

At step S845, graph manager 80 adds the attribute(s) and calculated value(s) therefor to the model graph to generate an updated model graph 850.

Figure 36:
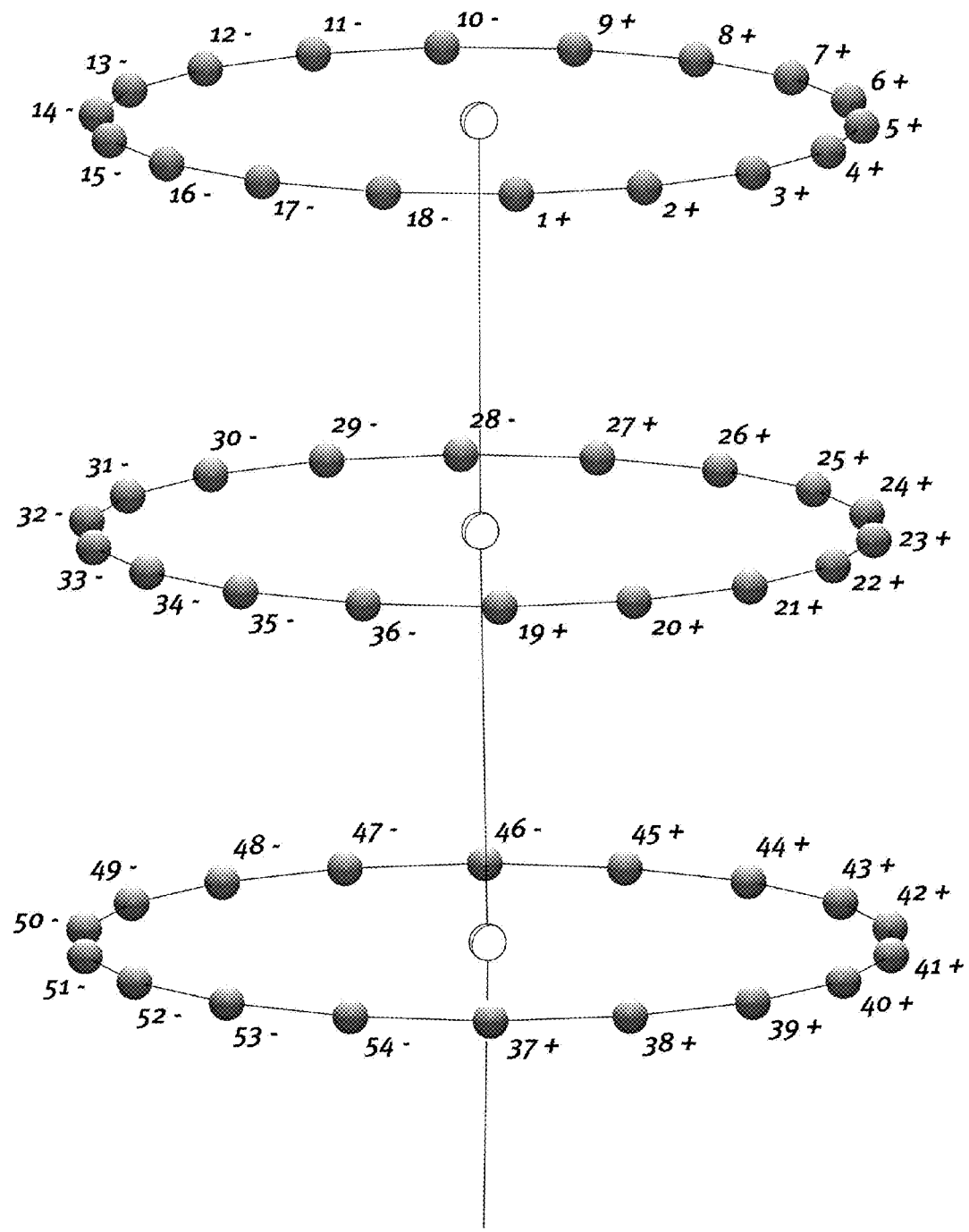
FIG. 36 illustrates the addition of an attribute to the model graph defining the equivalence class of each ring base determined at step S800 in the second round of processing.

FIG. 36 shows part of the model graph with the values of the attribute "CURVATURE" assigned to the vertices representing ring bases.

At the end of this processing, the generator is in a consistent state, and therefore its data can be exported to other systems for various purposes at step S855, as described previously.

Step S900

The generation of ring bases is the second generation of bases in the example model. The generation of centre bases comes next, and therefore processing returns to step S100 for another round of processing to add these bases.

Third Round of Processing: Generating Centre Bases (Third Generation Bases) with Content The third and last generation of bases in the present example is a generation of centre bases. As will be explained in more detail below, each ring base on all but the last ring serves as a reference base for a single centre base.

Step S100

At step S110 parameter definer 50 defines the number of bases for this generation of bases in accordance with instructions from the user.

In the present example, the number of centre bases is equal to the total number of ring bases minus the number of ring bases on the last ring, that is 144-18=126 bases:

Total number of centre bases=total number of ring bases−number of bases per ring=126

The number of bases is the only initial global parameter for this generation of bases in the present example, and therefore the processing at step S115 is omitted.

Step S200

At step S215, reference object selector 60 selects reference bases for the new centre bases. In the present example, each of the ring bases with index 1 to 126 are chosen as a reference base for a single centre base.

At step S220, reference object selector 60 selects existing objects to be used for the definition of the centre bases.

For the creation of centre bases and then content objects in them, references to existing generations of bases and content objects are made. More particularly, at step S220 in the present example, the following sets of bases and content objects are selected:

Bases: ring bases
Content objects (all from ring bases): bpoint
  Left plane
  Right plane
  Top plane
  Down plane Step S300

At steps S300 base generator 70 constructs the centre bases.

First, the origins of the bases are computed at steps S315 and S320. More particularly, for the present example, the following procedure is selected for computation of the base origins:

For each centre base $C_i$, its reference ring base $B_{Ri}$ with neighbouring bases and their content objects are needed. Neighbouring bases are defined as bases following connections in the model graph labelled NEXT, TO and NEXT→TO from base $B_{Ri}$.

Base $B_{Ri}$=reference base
Point $O_{Ri}$=origin of base $B_{Ri}$
Point $P_N=B_{Ri}$→NEXT→CONTENT {Name: bpoint}
Point $P_{NT}=B_{Ri}$→NEXT→TO→CONTENT {Name: bpoint}
Point $O_T$=Origin of base $B_{Ri}$→TO The origin O of the I-th centre base $C_i$ is computed as the arithmetic mean of points $O_{Ri}$, $P_N$, $P_{NT}$ and $O_T$:

$$O=(O_{Ri}+P_N+P_{NT}+O_T)/4$$

As a result, the origin O of each centre base is dependent upon two existing bases (the origins $O_{Ri}$ and OT belonging to these bases) and two existing content objects (the points $P_N$ and $P_{NT}$). The origin O of each centre base is therefore an object that is dependent upon bases and content objects from different groups of ring bases. More particularly, the origins $O_{Ri}$ and OT are each from different (consecutive) rings (groups of bases based upon the value of the attribute "ring number"). Similarly, the points $P_N$ and $P_{NT}$ are also each contained in ring bases from consecutive rings.

Figure 37A:
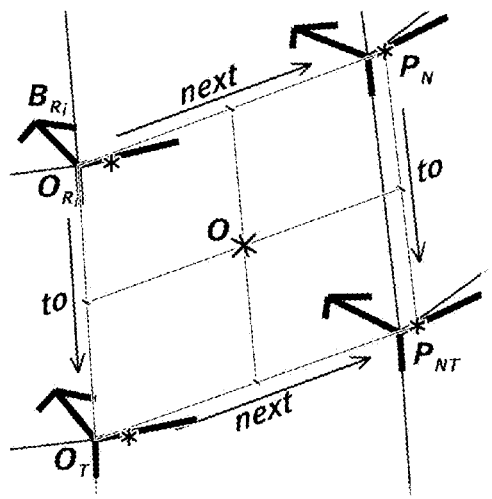
FIGS. 37a, 37b, 37c, 37d and 38 show an example to illustrate the generation of centre bases at step S300 in the third round of processing.

FIG. 37a shows points from the definition above.

Figure 37B:
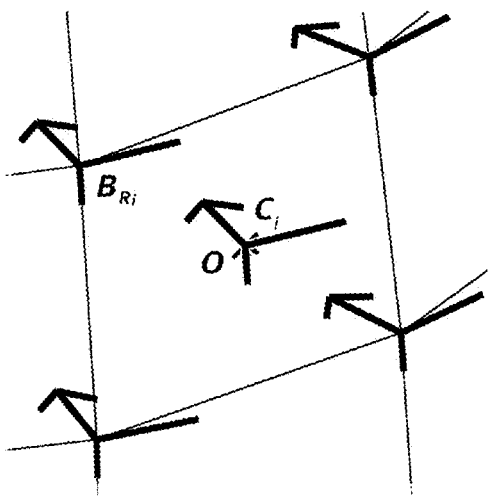

The initial orientation of centre base $C_i$ is the same as the orientation of its reference ring base $B_{Ri}$. This situation is shown in FIG. 37b.

Figure 37C:
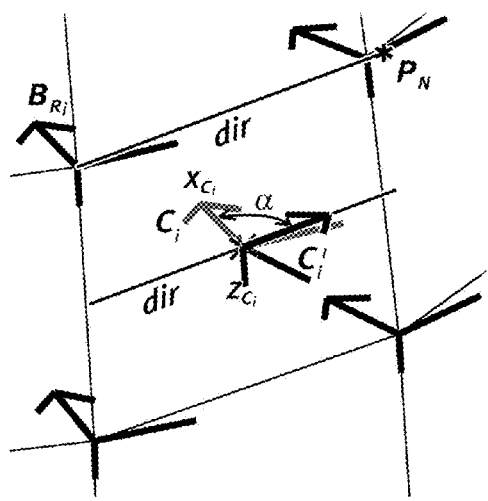
Figure 37D:
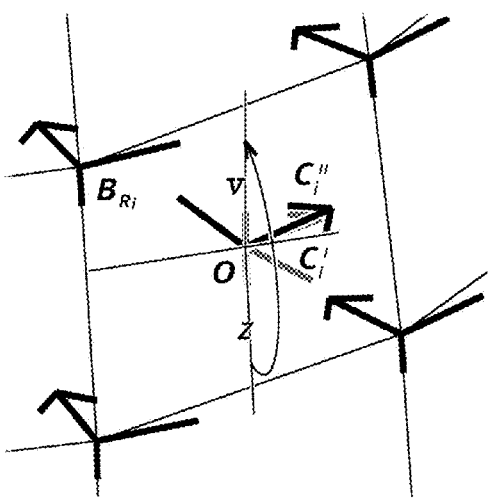

To define the final orientation of centre base $C_i$, additional rotations are computed at steps S330 and S335. Firstly, functions for these rotations are defined at step 330. FIGS. 37c and 37d show the designer's intent for the orientation of the centre bases in the present example.

Referring to FIG. 37c, a first rotation rotates the X-axis of the centre base $C_i$ around its Z-axis in such a way that it points in the direction of a vector from point $O_{Ri}$ to point $P_N$. The functions for this rotation are therefore:

$X_{Ci}$=direction of X-axis of base $C_i$
$Z_{Ci}$=direction of Z-axis of base $C_i$
dir=vector $P_N$–$O_{Ri}$
α=AngleBetween $[X_{Ci}, dir]$
$R_i$=RotationAroundAxis $[Z_{Ci, \beta}]$ The rotation $R_i$ is applied locally, that is, only on the rotation part of base $C_i$.

$C_i$=Base$[T_{Ci}, R_{Ci}]$
$C_i'$=Base$[T_{Ci}, R_i, R_{Ci}]$

A second rotation orients the Z-axis of the centre base $C_i$ vertically, as shown in FIG. 37d. This rotation is given by:

O=origin of centre base
Z=Z-axis vector of base
v={0, 0, 1}
$TR_i$=TransformationVectorToVector$[0, 0+Z, O+v]$ $$C_i''=TR_i \cdot C_i'$$

Figure 38:
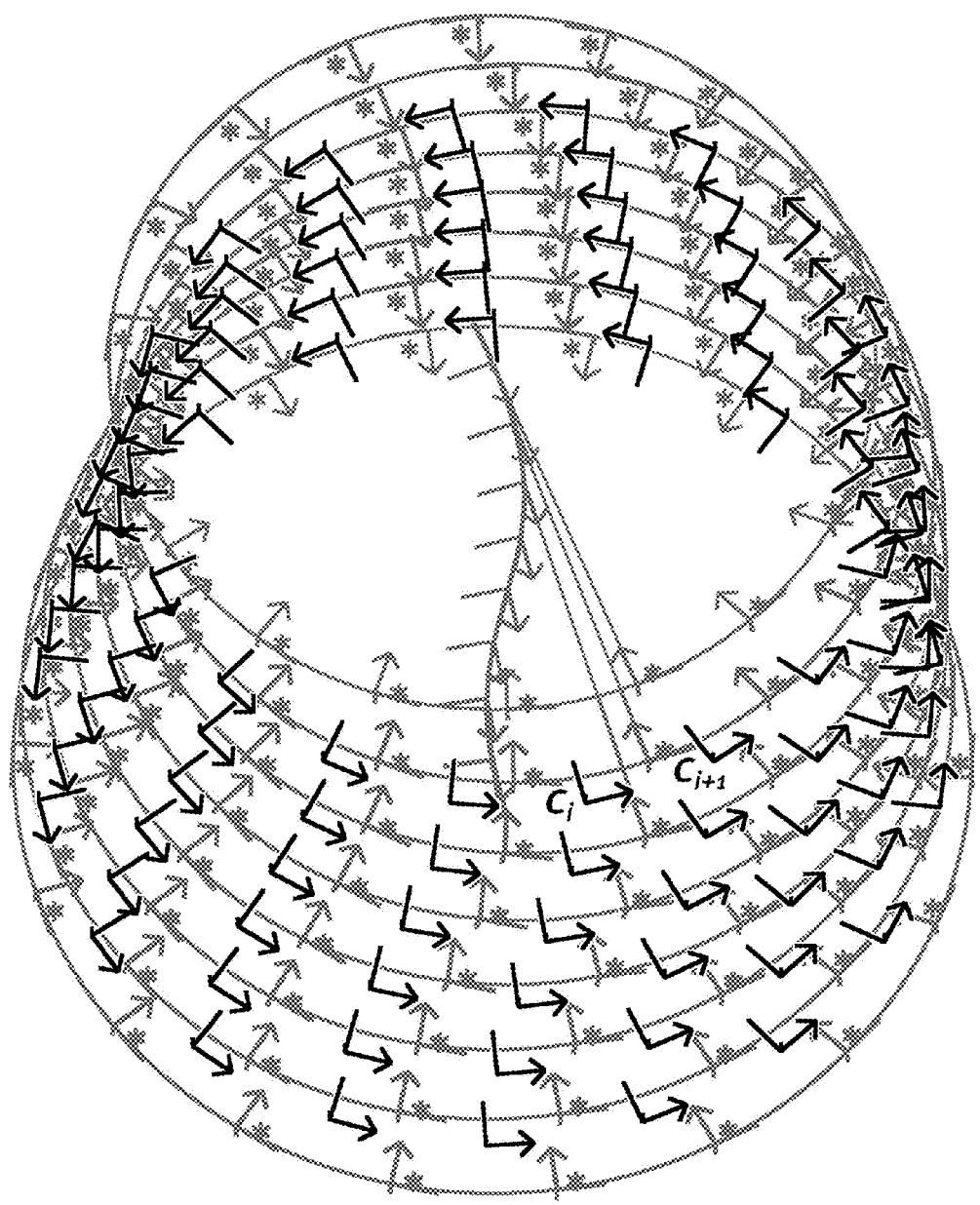

FIG. 38 shows final centre bases $C_i''$ after applying rotation $R_i$ and transformation $TR_i$.

Step S400

At Step S400, graph manager 80 inserts vertices representing the centre bases into the model graph.

Figures 39A, 39B:
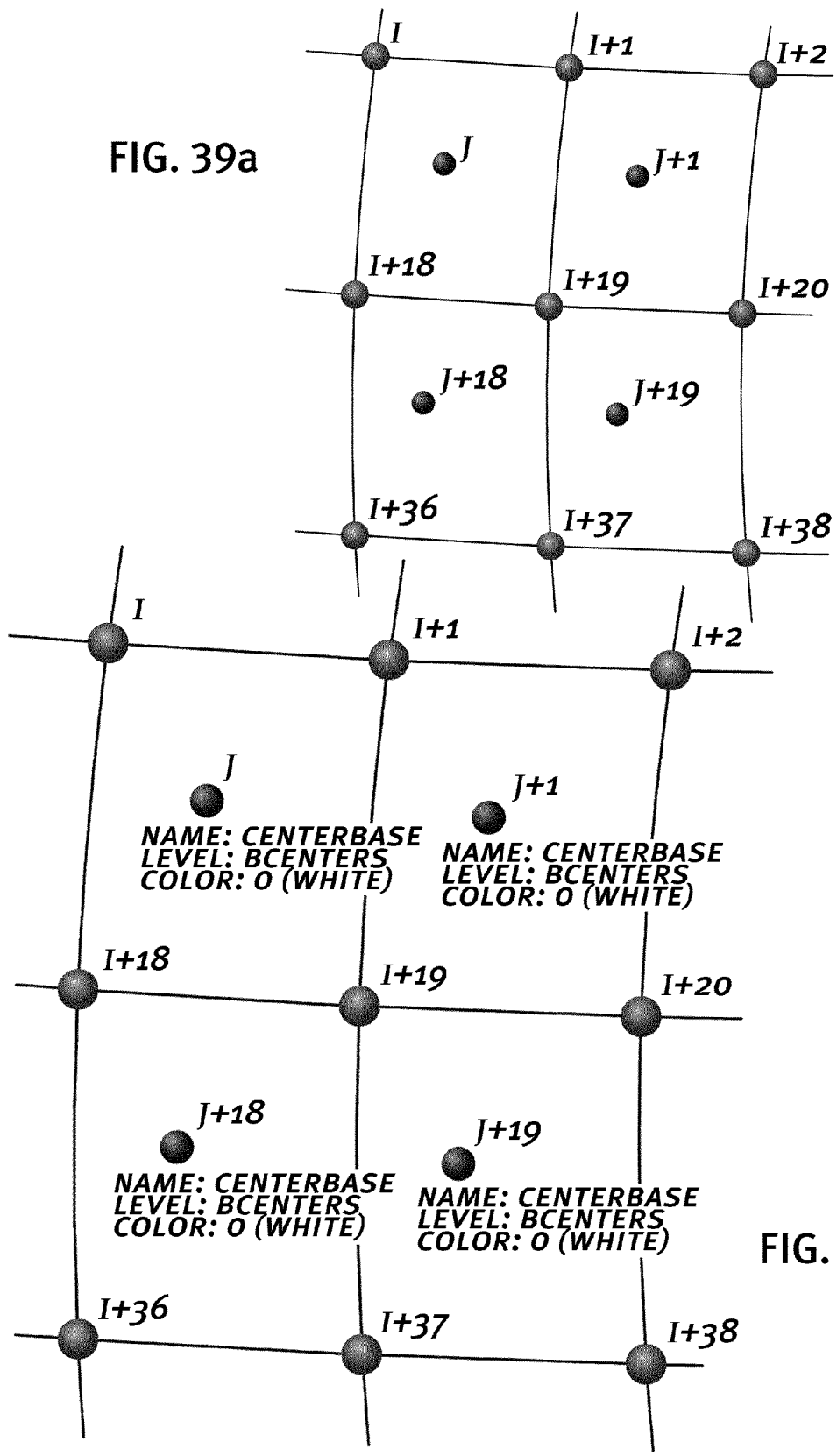
FIGS. 39a, 39b, 39c and 40 illustrate the addition of attributes and connections to the model graph for the centre bases created at step S300 in the third round of processing.

There are 126 centre bases in this example. Therefore, at step S420, 126 vertices are inserted into the model graph. FIG. 39a shows part of the model graph after the processing at step S420. New vertices for the centre bases are shown in the ring bases with indices I, I+1, I+18 and I+19. These centre bases have indices J, J+1, J+18 and J+19 respectively. Indices I and J run from 1 to number of centre bases.

At step S425, graph manager 80 assigns automatic attributes for the centre bases. In this example, the automatic attributes comprise:

Generation: Centers
Index: 1-126
Name: centerbase
Level: BCENTERS
Colour: 0 (white)

As before, the combination of the attributes "Generation" and "Index" comprise a unique identifier for each centre base.

FIG. 39b shows the same part of the model graph as FIG. 39a with the automatic attributes added for the centre bases.

There are no additional attributes for the centre bases in the present example, and therefore the processing at steps S430 and S435 is omitted on this round of the processing.

Figure 40:
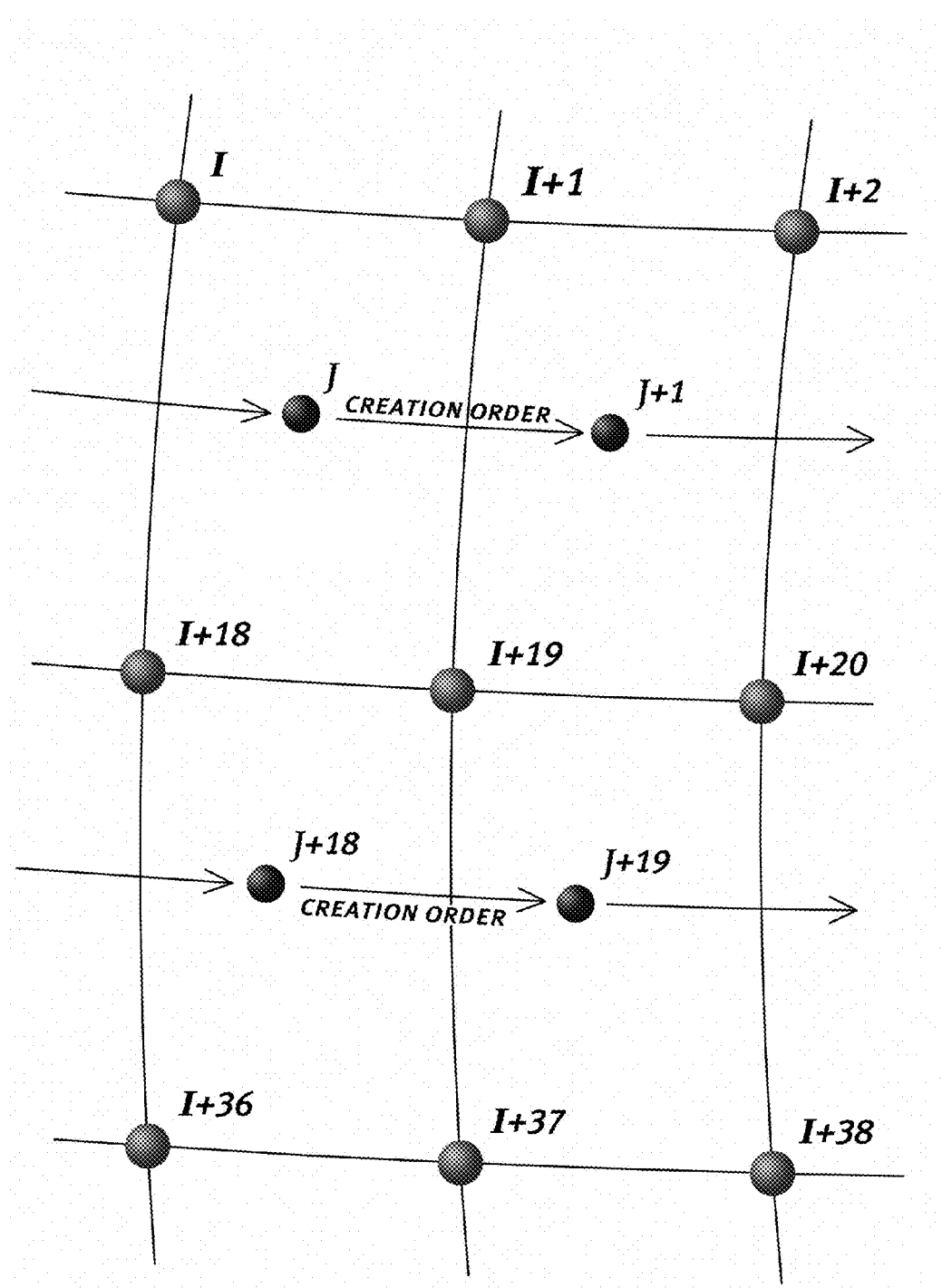

At step S440, graph manager 80 adds the automatic intrageneration connection "CREATION ORDER" (described previously) between the vertices of the model graph representing the centre bases. Part of the resulting model graph is shown in FIG. 40.

In the present example, there are no additional intrageneration connections between the centre bases, and therefore the processing at steps S445 and S450 is omitted on this round of the processing.

At step S445, graph manager 80 adds automatic intergeneration connections. In the present example, the connection called "SUBBASES" is added automatically from each ring base to the centre base that has this ring base as its reference base. The formula for edges is:

index of reference ring base I=1 to total number of centre bases
index of centre base J[I]=I
Edges SUBBASES={(I, J [I]), {i, 1 to total number of centre bases}}

Figure 39C:
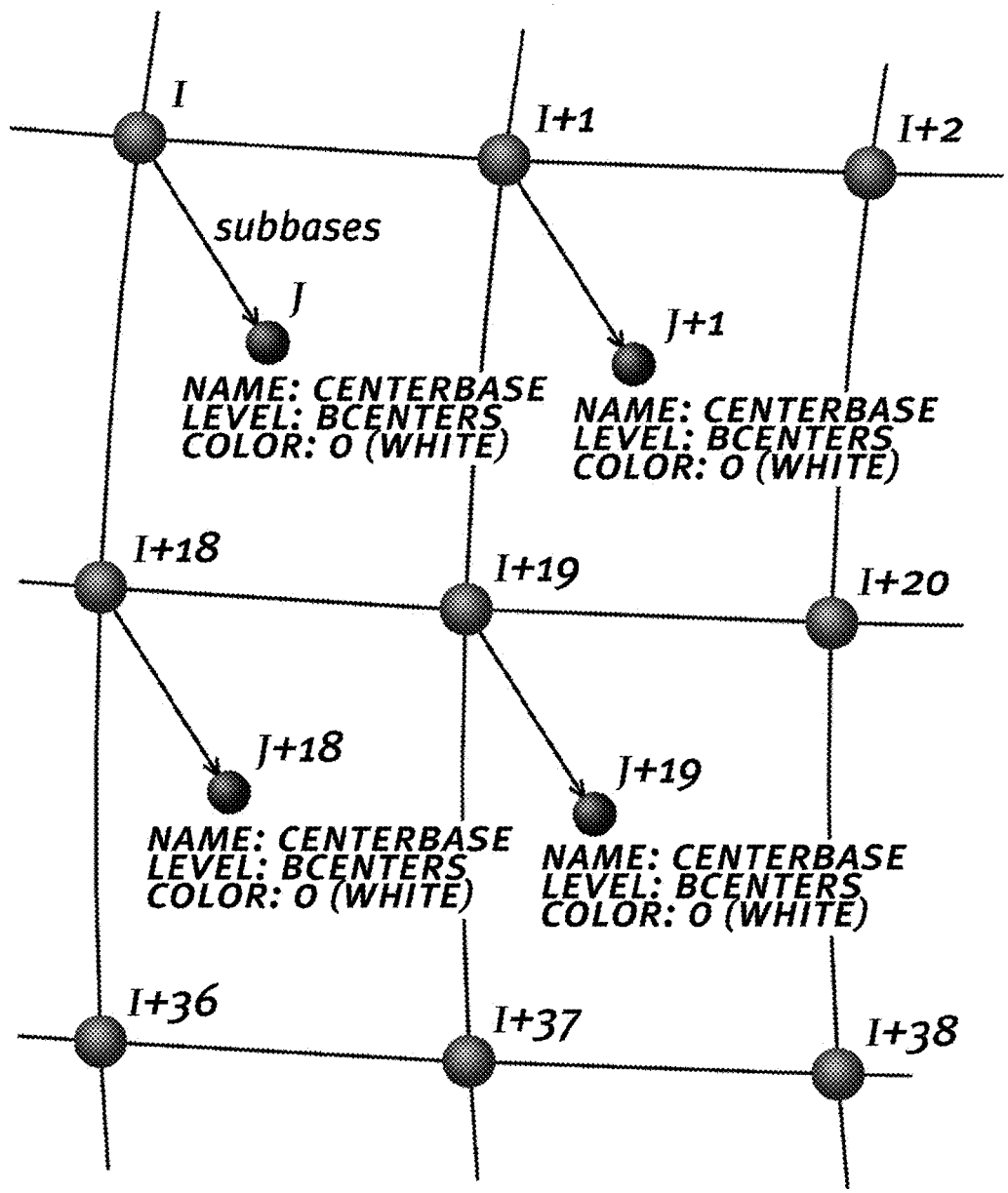

The first index in a pair refers to the ring bases and the second index refers to the centre bases. Part of the resulting model graph is shown in FIG. 39c.

In the present example, there are no additional intergeneration connections for the centre bases, and therefore the processing at steps S460 and S465 is omitted on this round of the processing.

At the end of this step, the generator is in a consistent state, and therefore its data can be exported to other systems for various purposes at step S475.

Step S500

At step S500, content generator 90 inserts content objects into each centre base generated at step S300. In the present example, an invariant polygon F and points $P_L$, $P_R$, $P_B$ and $P_T$ are inserted into each centre base at the same positions relative to the base's origin as their positions relative to the global coordinate system G. This relationship is shown in perspective view in FIG. 41a.

More particularly, in the present example, content importer 92 performs processing at steps S505, S515 and S525 to import the polygon F and the points $P_L$, $P_R$, $P_B$ and $P_T$ into the system and assign a copy of each imported polygon and point to each centre base.

Polygon F is a primary content object. In this example, the polygon is created in an outside CAD system and its coordinates are then transferred to the system through a plain ASCII file. The coordinates of its points are:

F={{−2.1, 0.0, −2.1}, {2.1, 0.0, −2.1}, {2.1, 0.0, 2.1}, {−2.1, 0.0, 2.1}}

Points $P_L$, $P_R$, $P_B$ and $P_T$ are also brought in the system from the outside CAD system in the present example. These content objects fall into the category of primary content objects, meaning that they can be changed subsequently by the system.

Their coordinates are:
$P_L$={−0.4, 0.0, 0.0}
$P_R$={0.4, 0.0, 0.0}
$P_B$={0.0, 0.0, −0.4}
$P_T$={0.0, 0.0, 0.4}

Each centre base $C_i$ gets its own copy of these content objects at step S525. This situation is shown in perspective view in FIG. 41b.

Figure 42A:
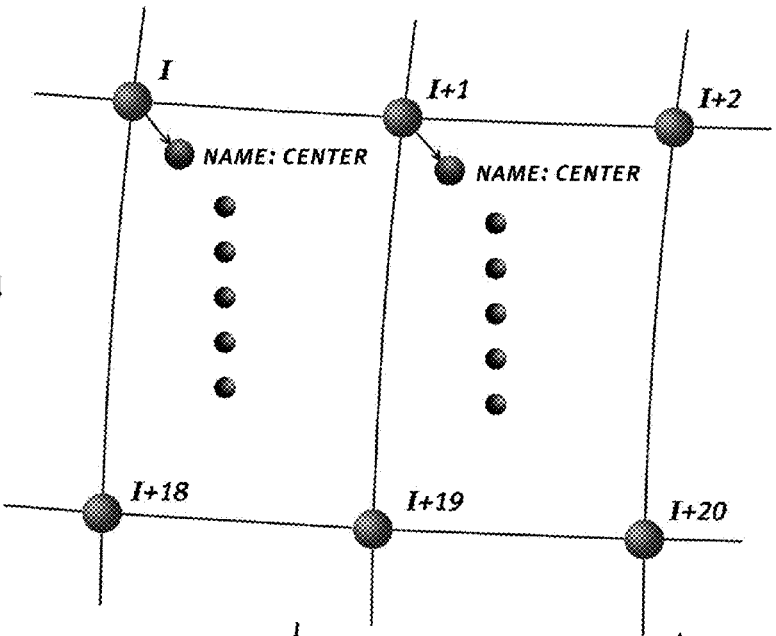
FIGS. 42a, 42b and 42c illustrate the addition of attributes and connections to the model graph for the content objects inserted at step S500 in the third round of processing.

At step S530, graph manager 80 inserts vertices corresponding to the new content objects into the model graph. For each added content object in each centre base, a new vertex is inserted into the model graph. This means that a total of 630 new vertices are added (126 centre bases times 5 content objects). FIG. 42a shows part of the model graph with added vertices.

At step S535, graph manager 80 assigns the following automatic attributes to each new vertex:

| Index | Name | Level | Colour |
|---|---|---|---|
| I | Invariant | INVARIANT | 0 |
| I | pleft | POUT | 0 |
| I | pright | POUT | 0 |
| I | pbottom | POUT | 0 |
| I | ptop | POUT | 0 |

Figure 42B:
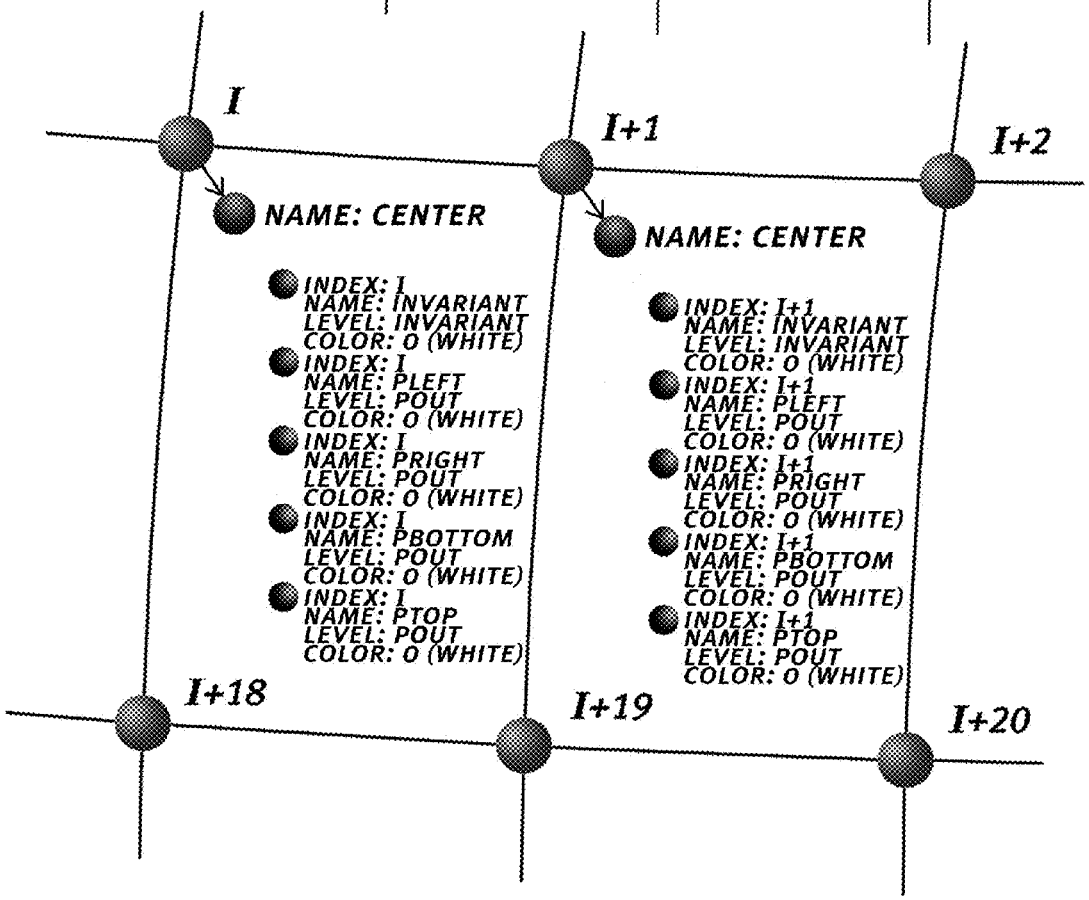

FIG. 42b shows the same part of the model graph as FIG. 42a with added automatic attributes for the content objects.

For the content objects imported in this step, there are no additional attributes in the present example. Accordingly, the processing at steps S545 and S550 is omitted.

At step S555, graph manager 80 assigns a CONTENT connection (as described previously) to each content object.

Figure 42C:
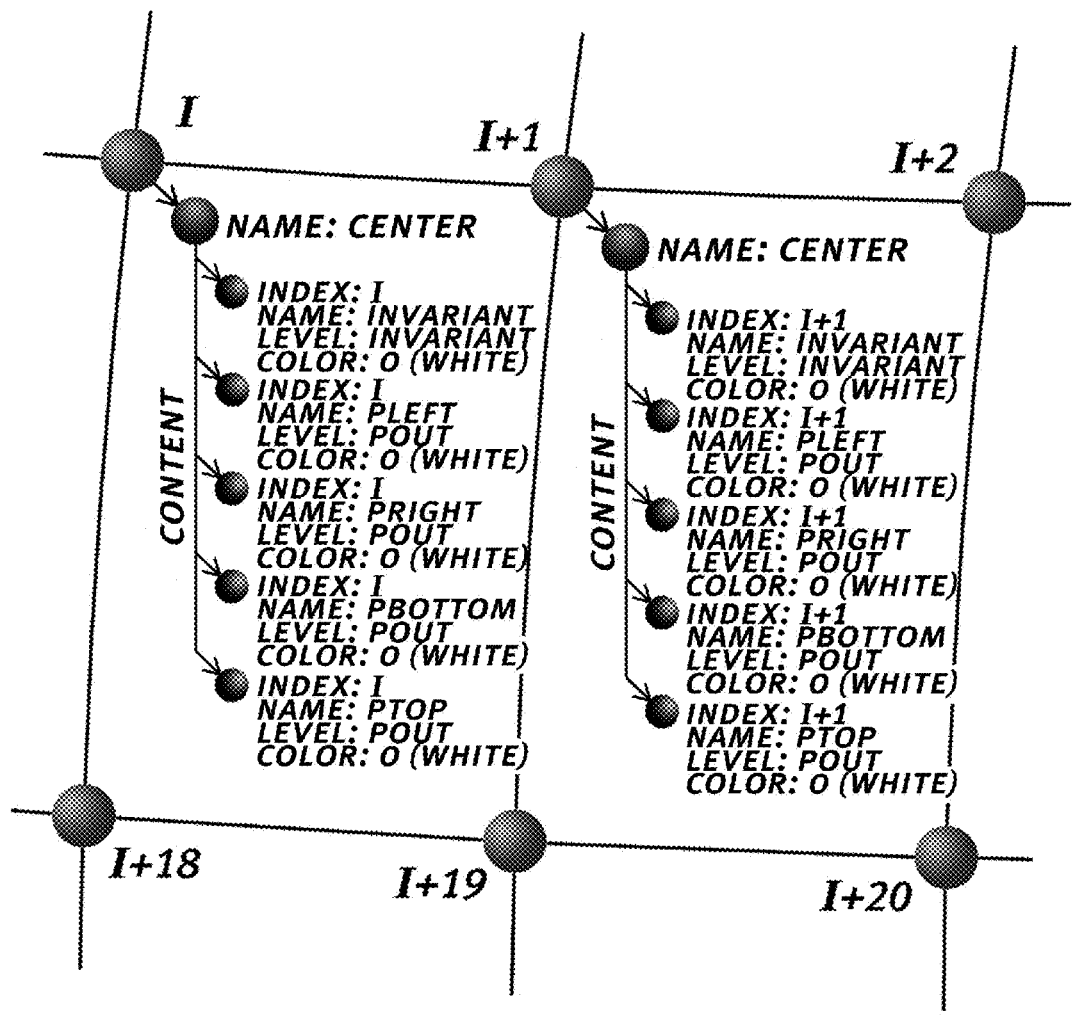

Each content object has a reference centre base. The automatic connection called "CONTENT" is added to the model graph to show this relationship between each centre base and each of the 5 imported content objects for that centre base. Part of the resulting model graph is shown in FIG. 42c.

In the present example, there are no additional connections for the content objects imported in this step, and therefore the processing at steps S560 and S565 is omitted on this round of processing.

At the end of this step, the model is in a consistent state, and therefore its data can be exported to other systems for various purposes at step S575.

Step S600

At step S600, transformation controller 100 applies additional transformations to the points $P_L$, $P_R$, $P_B$ and $P_T$ imported at step S500, while keeping the centre bases $C_i$ unchanged.

Figure 43A:
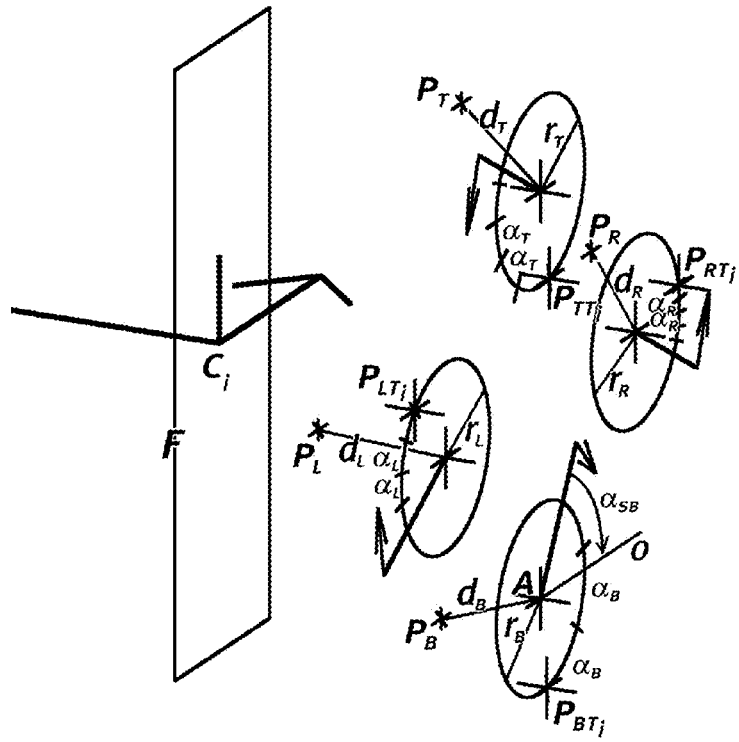
FIGS. 43a and 43b show an example to illustrate the transformation of content objects at step S600 in the third round of processing.

More particularly, transformation controller 110 selects functions for transforming each of the points $P_L$, $P_R$, $P_B$ and $P_T$ at step S640 and selects parameters for the functions at step S645 before applying transformations in accordance with the selected functions and parameters at step S650. In the present example, transformations for each point $P_L$, $P_R$, $P_B$ and $P_T$ are computed by functions dependent upon the index of the reference centre base for the point. The functions differ from point to point in parameters only. The definition of the transformation function will be explained with reference to FIG. 43a.

Consider a circle in an XZ plane (that is, the same plane as the added polygon F) with a centre A and radius r. Points on the circle can then be computed with a formula:

angle $\alpha_S$=start angle
angle $\alpha$=amount of rotation in one step $$P[I]=A+r\{\text{Cos }[\alpha_S{+}(I{-}1)\alpha], 0, \text{Sin }[\alpha_S{+}(I{-}1)\alpha]\}, I=1$$
to number of centre bases The parameters r, $\alpha_S$ and $\alpha$ are different for each point $P_L$, $P_R$, $P_B$ and $P_T$. The centre of circle A is computed from each point by adding a displacement vector d which is also different for each point.

The formulae selected at step S640 for computing the translation of each point are as follows:

Transformed point $P_{LTi}=P_L[I]d_Lr_L\{\text{Cos }[\alpha_{SL}+(I-1)\alpha_L], 0, \text{Sin }[\alpha_{SL}+(I-1)\alpha_L]\}$ Transformed point $P_{RTi}=P_R[I]d_Rr_R\{\text{Cos }[\alpha_{SR}+(I-1)\alpha_R], 0, \text{Sin }[\alpha_{SR}+(I-1)\alpha_R]\}$ Transformed point $P_{BTi}=P_B[I]d_Br_B\{\text{Cos }[\alpha_{SB}+(I-1)\alpha_B], 0, \text{Sin }[\alpha_{SB}+(I-1)\alpha_B]\}$ Transformed point $P_{TTi}=P_T[I]d_Tr_T\{\text{Cos }[\alpha_{ST}+(I-1)\alpha_T], 0, \text{Sin }[\alpha_{ST}+(I-1)\alpha_T]\}$ The parameters selected at step S635 are:

| Point | D | r | $\alpha_s$ | $\alpha$ |
|---|---|---|---|---|
| $P_L$ | {0, −2, 0} | 1.7 | 0° | 45° |
| $P_R$ | {0, −2, 0} | 1.7 | 0° | 45° |
| $P_B$ | {0, −2, 0} | 1.7 | 90° | 45° |
| $P_T$ | {0, −2, 0} | 1.7 | 90° | 45° |

Another transformation is carried out on polygon F and points $P_{LT}$, $P_{RT}$, $P_{BT}$ and $P_{TT}$, based on the value of the attribute "CURVATURE" (previously calculated at step S800 in the second round of the processing) of ring base $B_{Ri}$, which is a reference base for centre base $C_j$, which in turn holds these content objects. More particularly, if the CURVATURE value is "−", the transformation TM is carried out:

$B_{Rj}$=ring base for which value of attribute "CURVATURE" is "−"
$C_j$=centre base $B_{Rj}$→SUBBASES {centrebase}
TM=MirrorTransformationThroughPlane [PlaneXZ [$C_j$]]
mirrored polygon $F_j$=TM·F
mirrored point $P_{LTj}$=TM·$P_{LT}$
mirrored point $P_{RTj}$=TM·$P_{RT}$
mirrored point $P_{BTj}$=TM·$P_{BT}$
mirrored point $P_{TTj}$=TM·$P_{TT}$ As a result of applying the addition transformation in this way, the polygon F and points $P_{LT}$, $P_{RT}$, $P_{BT}$ and $P_{TT}$ have a final form which is different depending upon whether their reference ring base $B_{Ri}$ has a "+" ve CURVATURE or a "−" ve CURVATURE. In other words, the final form of the polygons and points (content objects) is dependent upon the equivalence class of their reference base previously determined at step S800 in the second round of processing.

Figure 43B:
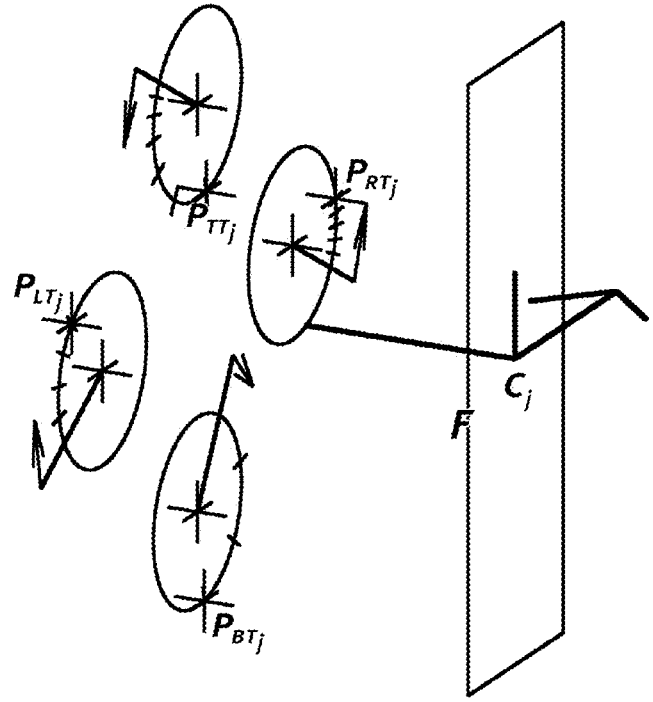

FIG. 43b shows the transformed and mirrored content objects in base $C_j$ after transform controller 100 has applied the transformations above at step S650.

Step S700

The next (and final) step in this round of the processing, and consequently in this example, is step S700. In this step, content generator 90 generates further content objects for the model.

In the present example, the content object to be added in this step is a solid block (mesh) inserted into each centre base. Six planes as auxiliary objects are used for its creation. This solid block is at the end trimmed with some of the planes created at step 700 during the second round of the processing (that is, the round to generate the ring bases). Each new content object is created in each centre base according to the same procedure.

The procedure for creating each new content object starts with the creation of planes, followed by the creation of a solid block, which is then trimmed with planes created during the processing of the second round. Although in reality steps S705 to S799 in FIG. 11 are executed 8 times in sequence (6 planes, and two meshes), the description of these steps will be made for all of the created content objects together. At the end of the creation of each content object (step S799), the model is in a consistent state, therefore its data can be exported to other systems for various purposes.

At step S705, content creator 94 selects the type of each new object. In this example, the object types for the new objects are PLANE and MESH.

At steps S715, S720 and S730, content creator 94 selects the operation(s) for the creation of each new content object, the bases in which the content object is to be generated, and parameters for the operation(s) respectively, with the parameters then being recorded at step S740.

In this example, the following functions are selected:

| Object name: | Description of creation function: |
| --- | --- |
| All planes | Oriented plane through three points |
| BIL | Mesh from oriented planes |
| BIL cut | Cut mesh with oriented plane |

The functions "Oriented plane through three points" and "Mesh from oriented planes" were described previously with reference to step S700 in the second round of processing. The function "Cut mesh with oriented plane" is a function that performs a difference operation between a solid object represented as a mesh and a solid halfspace defined with a plane.

For the creation of the auxiliary planes in centre base the following objects are needed.

polygon F
point $P_{LTi}$=transformed point $P_L$ from step S650
point $P_{RTi}$=transformed point $P_R$ from step S650
point $P_{BTi}$=transformed point $P_B$ from step S650
point $P_{TTi}$=transformed point $P_T$ from step S650

It should be noted that the positions of the points $P_{LTi}$, $P_{RTi}$, $P_{BTi}$ and $P_{TTi}$ were calculated at step S650 using a function dependent upon the index of the reference base in which the points lie. Accordingly, by using these points to generate content objects in this step, the content objects themselves are also dependent upon the reference base indexes.

Figure 44A:
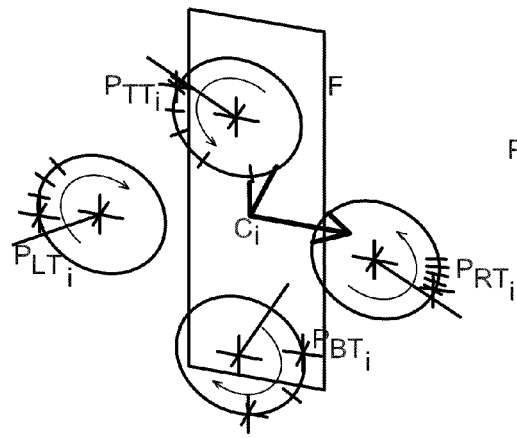
FIGS. 44a, 44b, 44c and 44d show an example to illustrate the generation of content objects at step S700 in the third round of processing.

These objects are shown in FIG. 44a. FIG. 44b shows the definition of the auxiliary planes L, R, D, T, P and B. All of them are defined by three points. The points $F_i$ represent the vertices of the polygon F.

Plane L is constructed from three points $P_{LTi}$, $F_1$ and $F_4$. The plane's normal vector lies in the opposite halfspace to the point $F_2$.

Plane R is constructed from three points $P_{RTi}$, $F_2$ and $F_3$. The plane's normal vector lies in the opposite halfspace to the point $F_1$.

Plane D is constructed from three points $P_{BTi}$, $F_1$ and $F_2$. The plane's normal vector lies in the opposite halfspace to the point $F_3$.

Plane T is constructed from three points $P_{TTi}$, $F_3$ and $F_4$. The plane's normal vector lies in the opposite halfspace to the point $F_1$.

Plane B is constructed from three points $F_1$, $F_2$ and $F_3$. The plane's normal vector lies in the opposite halfspace to the point $P_{LTi}$.

Plane P is constructed from three points $P_{LTi}$, $P_{BTi}$ and $P_{RTi}$. The plane's normal vector lies in the opposite halfspace to the point $F_1$.

Figure 44C:
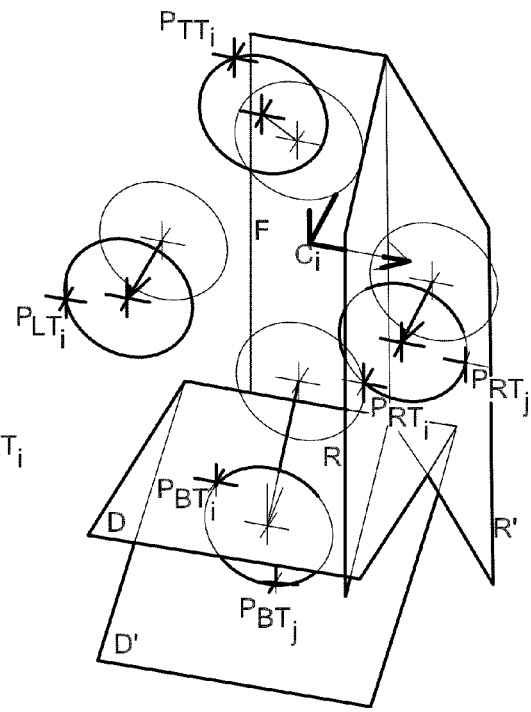
Figure 44B:
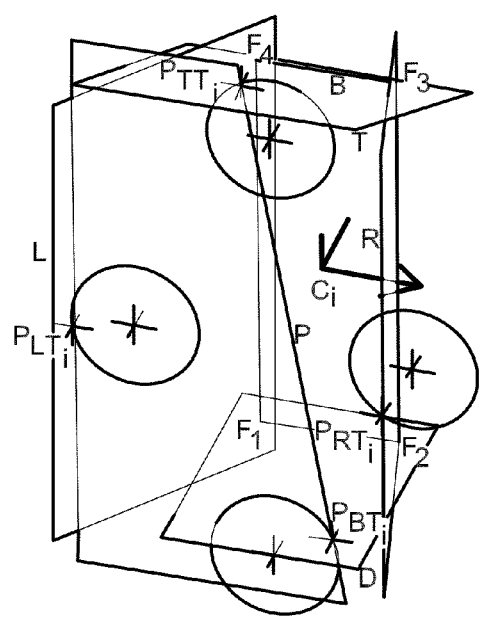

FIG. 44c shows different planes R versus R' and D versus D' constructed from different positions of points $P_{RTi}$ v. $P_{RTj}$ and $P_{BTi}$ v. $P_{BTj}$. Points $P_{RTj}$ and $P_{BTj}$ came from different centre bases $C_j$ and represent the change imposed by the transformation functions from step 600 when the index of centre base changes from i to j.

Figure 44D:
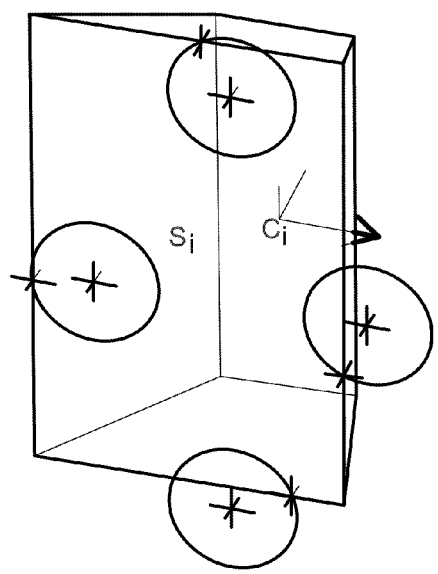

FIG. 44d shows the final solid block $S_i$, belonging to centre base $C_i$. Solid block $S_i$ is a mesh constructed from the intersection of the six planes L, R, D, T, P and B.

The last operation in this example trims the solid block Si with planes from ring base $B_{Ri}$, which is a reference base for centre base $C_i$, which in turn holds solid block Si.

Base $B_{Ri}$=reference ring base for centre base $C_i$
Base $C_i$=centre base $B_{Ri}$→SUBBASES{centrebase}
Plane $P_L$=plane $B_{Ri}$→CONTENT{Left plane}
Plane $P_R$=plane $B_{Ri}$→CONTENT{Right plane}
Plane $P_D$=plane $B_{Ri}$→CONTENT{Down plane}
Plane $P_T$=plane $B_{Ri}$→CONTENT{Top plane}
Solid block W=mesh $B_{Ri}$→CONTENT{White block}

The resulting solid block $S_C$ is constructed from solid $S_i$ by subtracting inverted planes $P_L$, $P_R$, $P_D$, $P_T$ from it. This step assures that the final solid block $S_C$ fits into the space bound by the solid block W, which was constructed at step S700 in the second round of processing. This assurance comes from the fact that the same planes are used in the construction of solid blocks W and $S_C$.

Figure 45A:
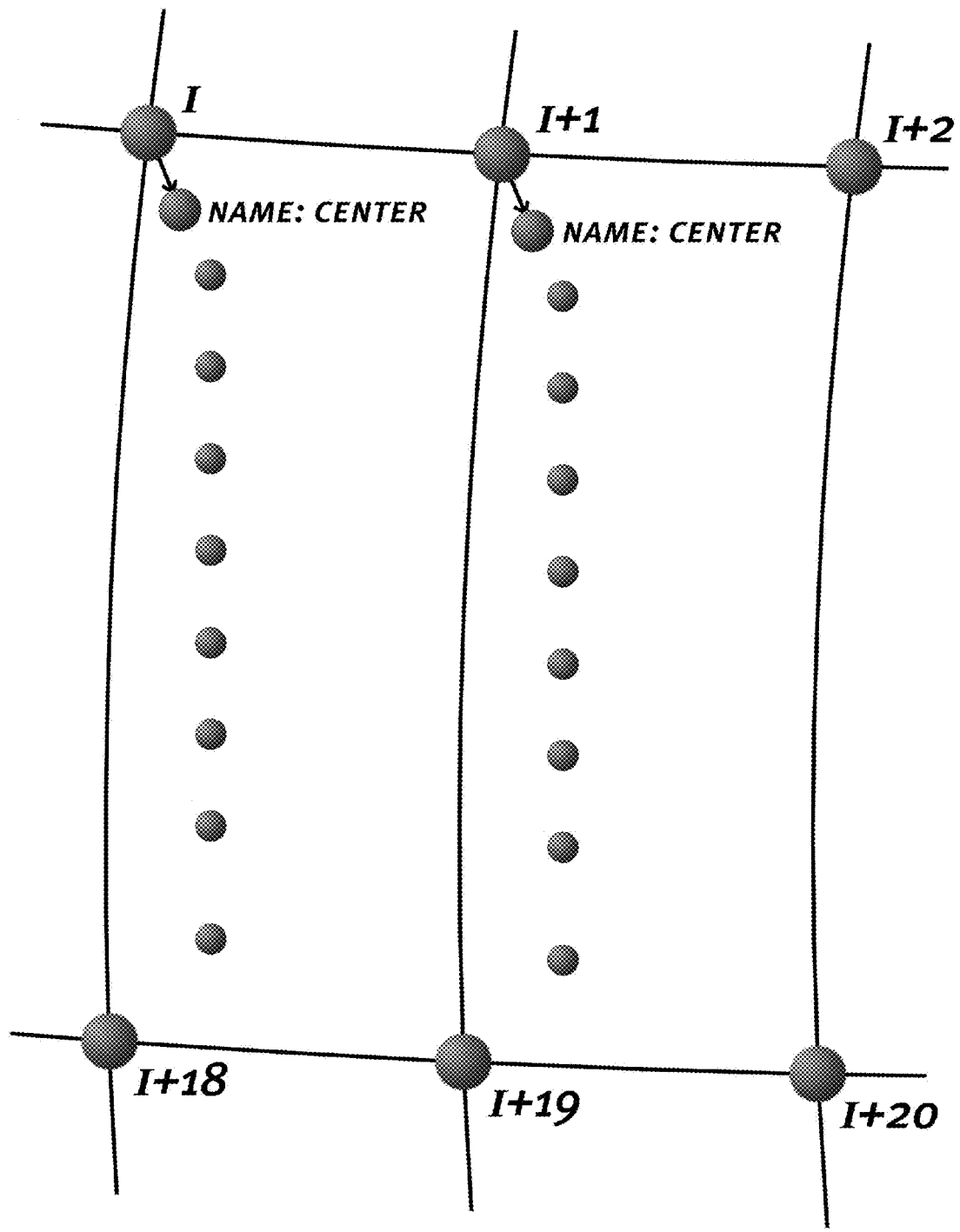
FIGS. 45a, 45b and 45c illustrate the addition of attributes and connections to the model graph for the content objects created at step S700 in the third round of processing.

After the creation of each object at step S745, its validity is checked at step S755. In this step of the present example, the following validation checks are performed:

Plane: check for points not to be collinear (normal vector must be non-zero)
Mesh: used implicitly by geometric modelling kernel that performs the creation function At step S765, graph manager 80 adds new vertices to the model graph corresponding to the new objects created at step S745. In the present example, for each centre base, 8 new vertices are inserted into the model graph. FIG. 45a shows part of the model graph with the new vertices for the content objects in two consecutive centre bases.

At step S770, graph manager 80 assigns the following automatic attributes to each vertex representing a new content object:

| Index | Name | Level | Colour |
| --- | --- | --- | --- |
| I | Left plane | BIL-LEFT | 0 |
| I | Right plane | BIL-RIGHT | 0 |
| I | Down plane | BIL-DOWN | 0 |
| I | Top plane | BIL-TOP | 0 |
| I | Front plane | BIL-FRONT | 0 |

-continued

| Index | Name | Level | Colour |
|-------|------|-------|--------|
| I | Back plane | BIL-BACK | 0 |
| I | BIL | BIL | 2 |
| I | BIL cut | BIL-CUT | 2 |

Figure 45B:
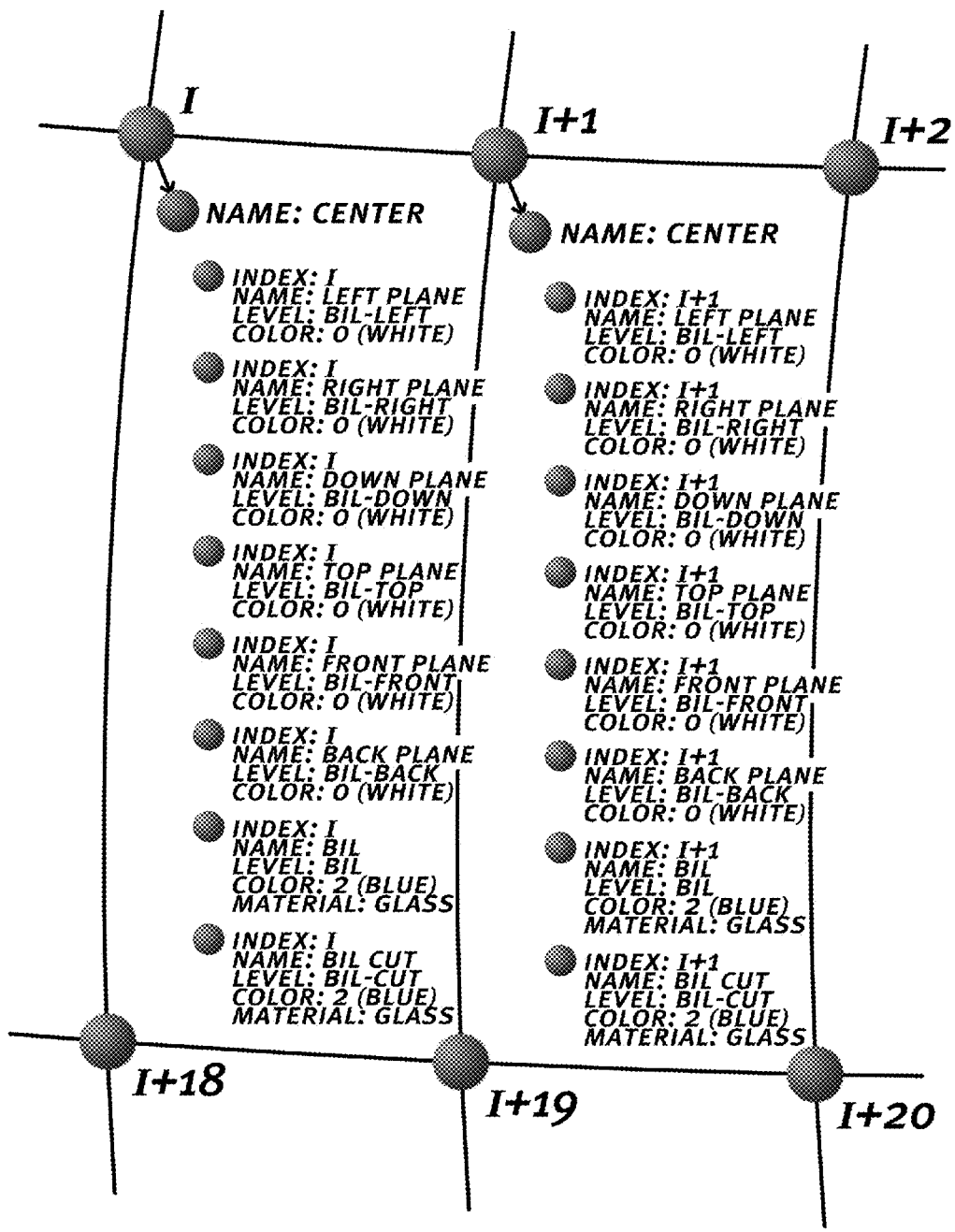

At steps S775 and S780, graph manager 80 assigns an additional attribute for the objects BIL and "BIL cut" called "Material". In the present example, this attribute has the same value for all objects: GLASS FIG. 45b shows the same part of the model graph as FIG. 45a with the attributes added for the content objects.

Figure 45C:
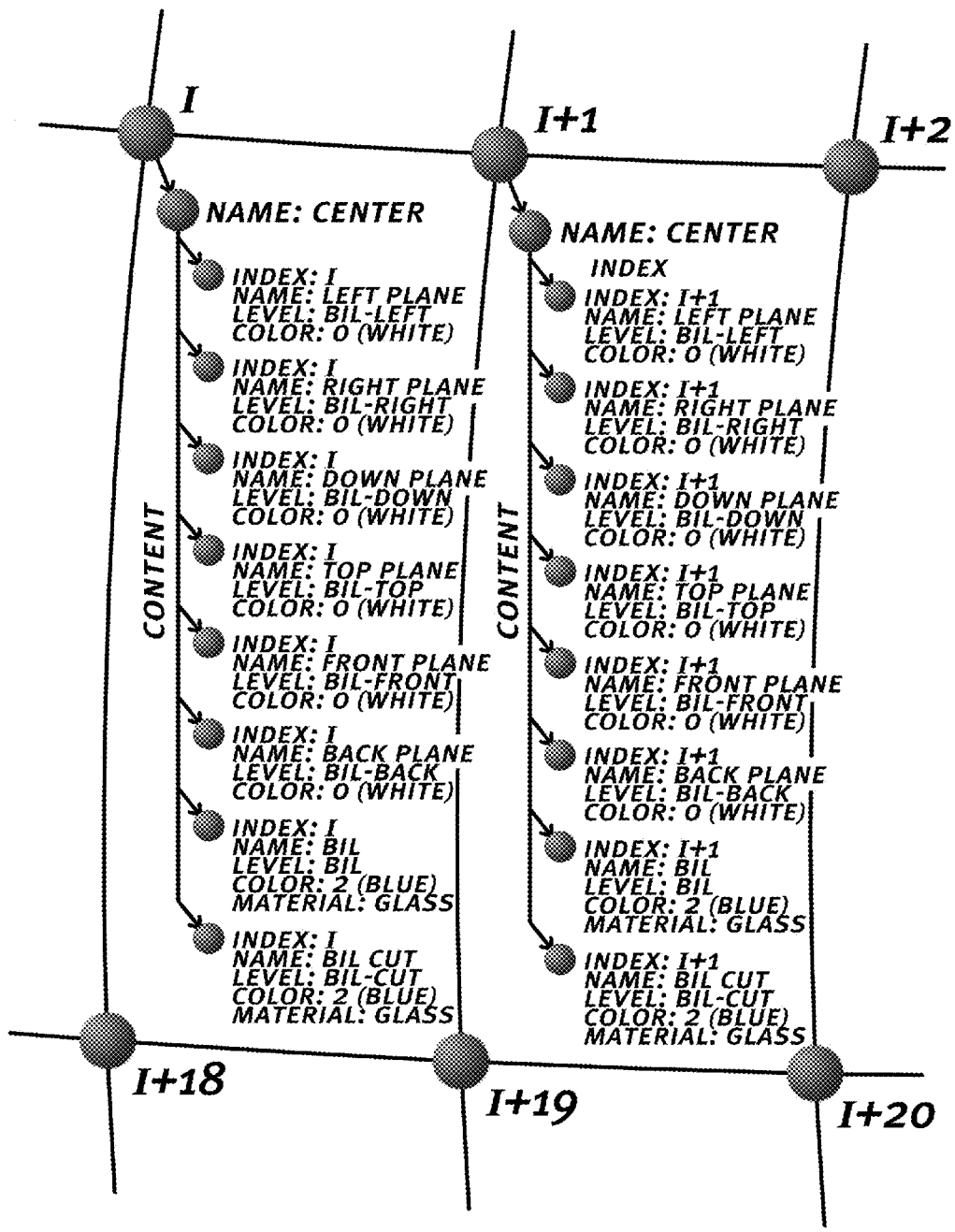

Each new content object has a reference centre base. At step S790, graph manager 80 adds the automatic connection called "CONTENT" to the model graph to show the relationship between each centre base and its new content object. Part of the resulting model graph is shown in FIG. 45c.

Step S800

In the present example, step S800 is not necessary in the current round of processing. This is because the content objects created at step S700 are the last objects constructed in the present example, and therefore no additional attributes or connections to bases or objects in the model are needed.

Step S900

The generation of the centre bases is the last generation of bases in this example.

Figure 46:
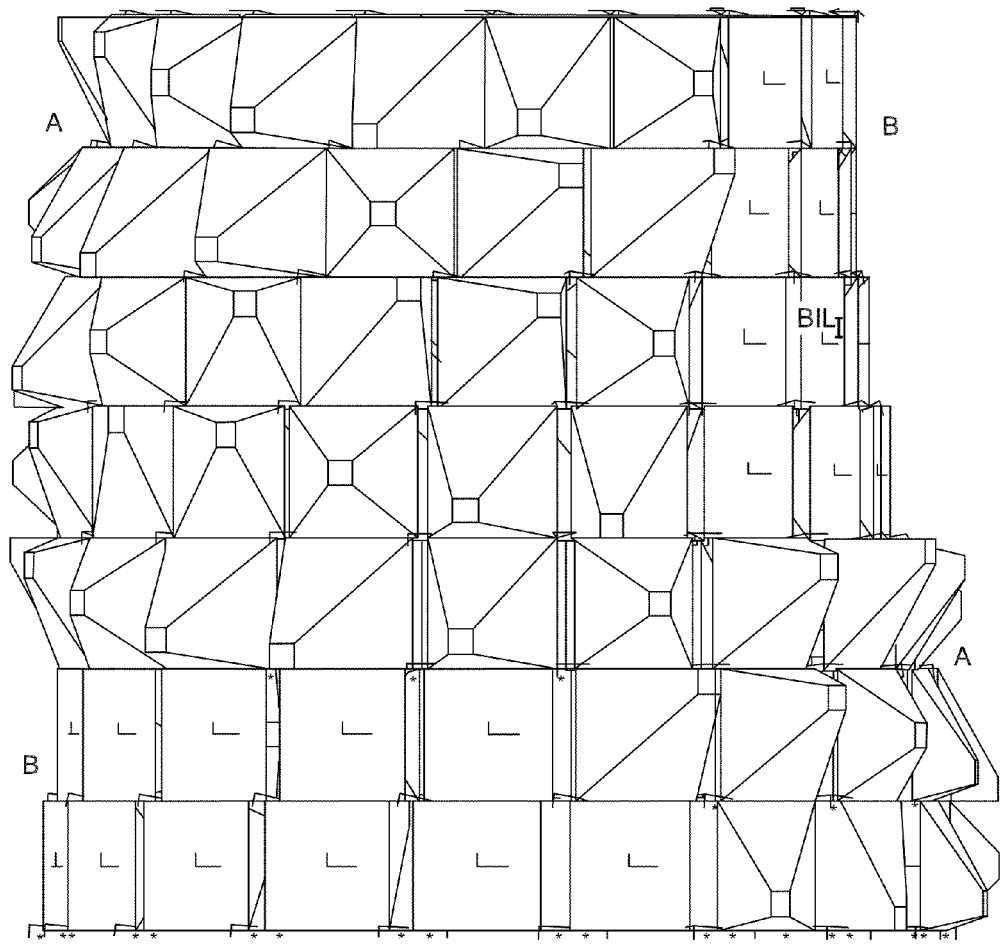
FIG. 46 shows the final design model for the illustrated example after completion of the three rounds of processing.

FIG. 46 shows the resulting model after completion of all of the steps in the three rounds of processing.

The ring bases, centre bases and solid objects named BIL are shown. The resulting model is clearly divided into two distinct regions A and B, which correspond to the partition of the ring bases into two equivalence classes based upon the attribute "CURVATURE" defined at step S800 in the second round of processing (refer to FIG. 35a). Region A is based on the ring bases with positive curvature and region B on the ring bases with negative curvature.

Objects in region A have their tips pointing outwards, while objects in region B have their tips pointing inward. On objects from region A, the relative position of their tips against the backplane of the object (made from polygon F; refer to the description of steps S500 and S700 in this round of processing) follow a distinct sinusoidal pattern. This effect is the result of the parameters used to position the points $P_{LT}$, $P_{RT}$, $P_{BT}$ and $P_{TT}$ (described at step S600 in the third round of processing and shown in FIGS. 43a and 43b).

The influence of the backbone bases can also be seen on the right edge of region B. If the backbone bases were vertically aligned on top of each other, the edge of the region B would be linear (albeit not vertical, because the radius of the ring bases also changes from ring to ring; increasing from 12 m on the top (first) ring to 15 m on the bottom (last) ring).

Amendment of Functions and Parameter Values

The present embodiment stores all of the mathematical functions, mathematical procedures and parameter values used to produce the bases and content objects in the model.

Furthermore, the embodiment allows the user to access the stored functions, procedures and parameter values, and to amend them to change the generated model.

In response to the user amending a function, procedure and/or parameter value, the system automatically regenerates the bases and/or content objects in accordance with the amendments and any unamended functions, procedures and parameter values. As a result, the effect of changes can be quickly seen by the user.

Some examples to illustrate amendments will now be described.

In a first example, the value of a parameter in the equations used to generate the backbone bases at step S300 in the first round of the processing is changed.

Changing parameters that govern the position and/or orientation of the backbone bases can have a major impact on the final model, since all of the bases created in later steps are dependent upon the backbone bases.

In this example the value of parameter F (defined with reference to step S300 in the description of the first round of processing) is changed from 0.75 to 3.0.

Figure 47:
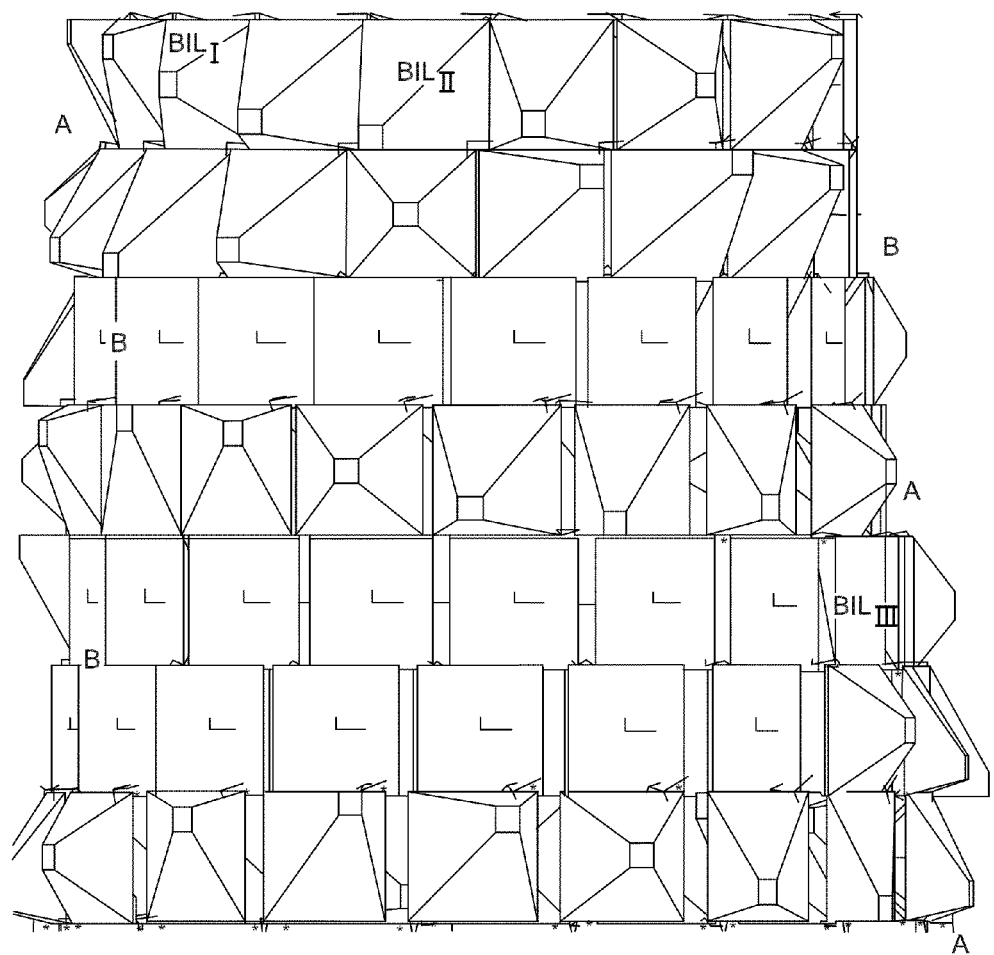
FIGS. 47, 48, 49 and 50 illustrate the effects on the final model of changing the parameter values and/or functions used to generate the bases and/or content objects in the model.

The result of this change is shown in FIG. 47.

Referring to FIG. 47, the centre bases and solid objects named BIL are shown. The main difference in the model produced by the parameter value change in this example is in the arrangement of regions A and B, which correspond to the equivalence classes based upon the attribute "CURVATURE". Rows 3, 5 and 7 from the top down are clearly different from the model shown in FIG. 46, and after thorough examination all of the other rows are also different, just not so obviously. For example, in FIG. 47, the top row of shown solid objects is moved slightly to the left in comparison to the top row in FIG. 46. The objects labelled $BIL_I$, $BIL_{II}$ and $BIL_{III}$ are used for comparison with further examples (described below).

By way of a second example, the values of four extra parameters are changed in addition to the value of parameter F already changed in example 1 above.

At step S600 in round 3 of the processing, the points $P_T$, $P_R$, $P_B$, $P_T$ inserted into the centre bases were transformed into points $P_{LT}$, $P_{RT}$, $P_{BT}$, $P_{TT}$ according to a set of parameters (for detailed description of the transformation see the description of step S600 in the third round of processing). In this second example, the value of the parameters $α_L$, $α_R$, $α_B$ and $α_T$ used to transform the points is changed from 45° to 120° (all of the parameters have the same value). The result of changing the parameters F, $α_L$, $α_R$, $α_B$ and $α_T$ in this way is shown in FIG. 48.

Figure 48:
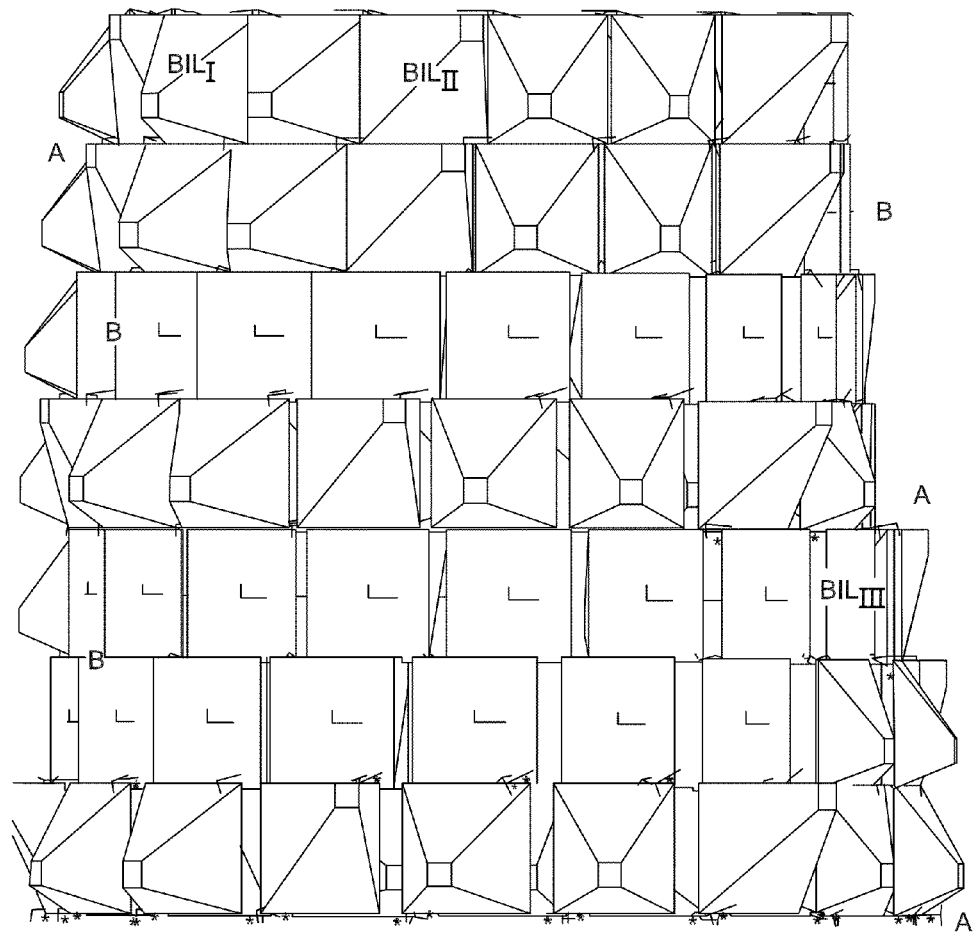

Referring to FIG. 48, the arrangement of regions A and B is the same as in FIG. 47. The difference is in the directions in which the tips of the solid objects named BIL point. More particularly, the objects labelled $BIL_I$, $BIL_{II}$ and $BIL_{III}$ in FIG. 48 have their tips pointing in the opposite direction to the objects with the same labels in FIG. 47. These objects are respectively created in the centre bases with the same indices in the model from example 1 and in the model from example 2 (object $BIL_I$ is created in a centre base with index I in both models; the analogue statement is true for objects $BIL_{II}$ and $BIL_{III}$).

In a third example, the values of 12 extra parameters are changed in addition to the value of parameter F already changed in example 1 above.

At step S600 in the third round of processing, the points $P_L$, $P_R$, $P_B$, $P_T$ inserted into the centre bases were transformed into points $P_{LT}$, $P_{RT}$, $P_{BT}$, $P_{TT}$ according to a set of parameters. In this third example, the values for these parameters are changed to:

| Point | D | r | $α_s$ | $α$ |
|-------|---|---|-------|-----|
| $P_L$ | {−0.35, −2, 0} | 1.0 | 0° | 22.5° |
| $P_R$ | {0.35, −2, 0} | 1.0 | 0° | 45° |
| $P_B$ | {0, −2, −0.35} | 1.0 | 90° | 90° |
| $P_T$ | {0, −2, 0.35} | 1.0 | 90° | 180° |

Figure 49:
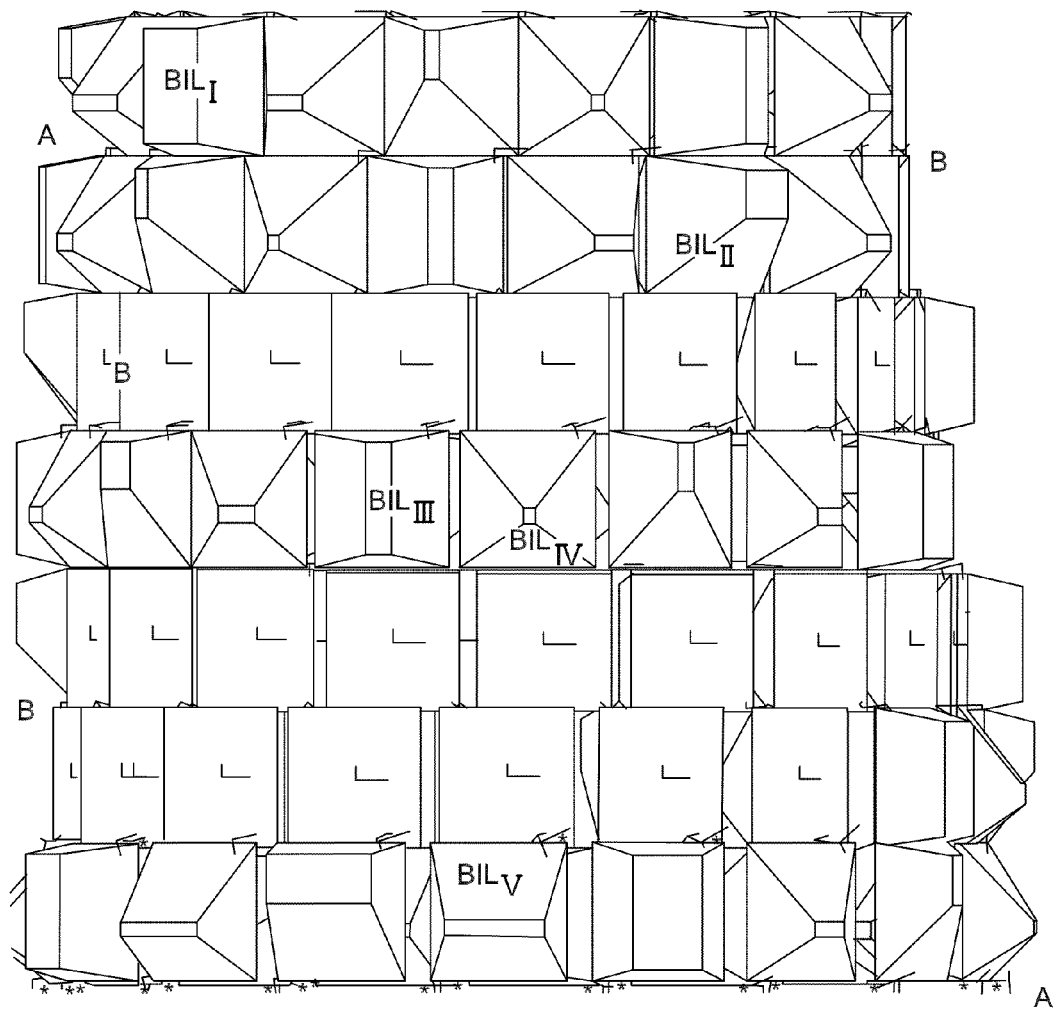

The result of changing the values for the parameters above is shown in FIG. 49.

Referring to FIG. 49, the arrangement of regions A and B is the same as in FIG. 47. The difference is in the size and directions in which the tips of the solid objects named BIL point. In addition, FIG. 49 shows that the objects labelled $BIL_I$, $BIL_{II}$, $BIL_{III}$, $BIL_{IV}$, and $BIL_V$ have tips of different shapes and sizes.

A fourth example will now be described, in which a function used to generate some of the bases is changed. More particularly, an example will be described in which the function R[I] used at step S300 in the second round of processing to calculate the radii of the circles upon which the ring bases lie is changed.

Instead of linear enlargement of radii from floor to floor, in this example, a more versatile function Sine is used to compute the radii of the ring bases. The radius of I-th ring base R[I] is adjusted by the value of the Sine function at each floor. The radii thus oscillate around the fixed radius $R_{fixed}$.

The function for the radii is changed to:

$$R[I] = R_{fixed} + \mathrm{Sin}\,[2*Pi*arg*(Iref[I]/1)/\mathrm{NumberOfBackboneBases}]$$

Values of parameters: NumberOfBackboneBases: 8
$R_{fixed}$: 12.00 m
arg: 1.25

The parameter "NumberOfBackboneBases" was defined at step S110 in the first round of processing (generation of backbone bases). The parameter "arg" defines the number of full sine waves produced from the top to bottom floors. In this example, one and a quarter waves are applied from top to bottom.

When the function R[I] is changed by the user, the system automatically reapplies the changed function and all previously defined functions and parameters to regenerate the model. In this way, the user can change some of the bases (the ring bases in the present example) and the system automatically regenerates all bases and content dependent thereon.

Figure 50:
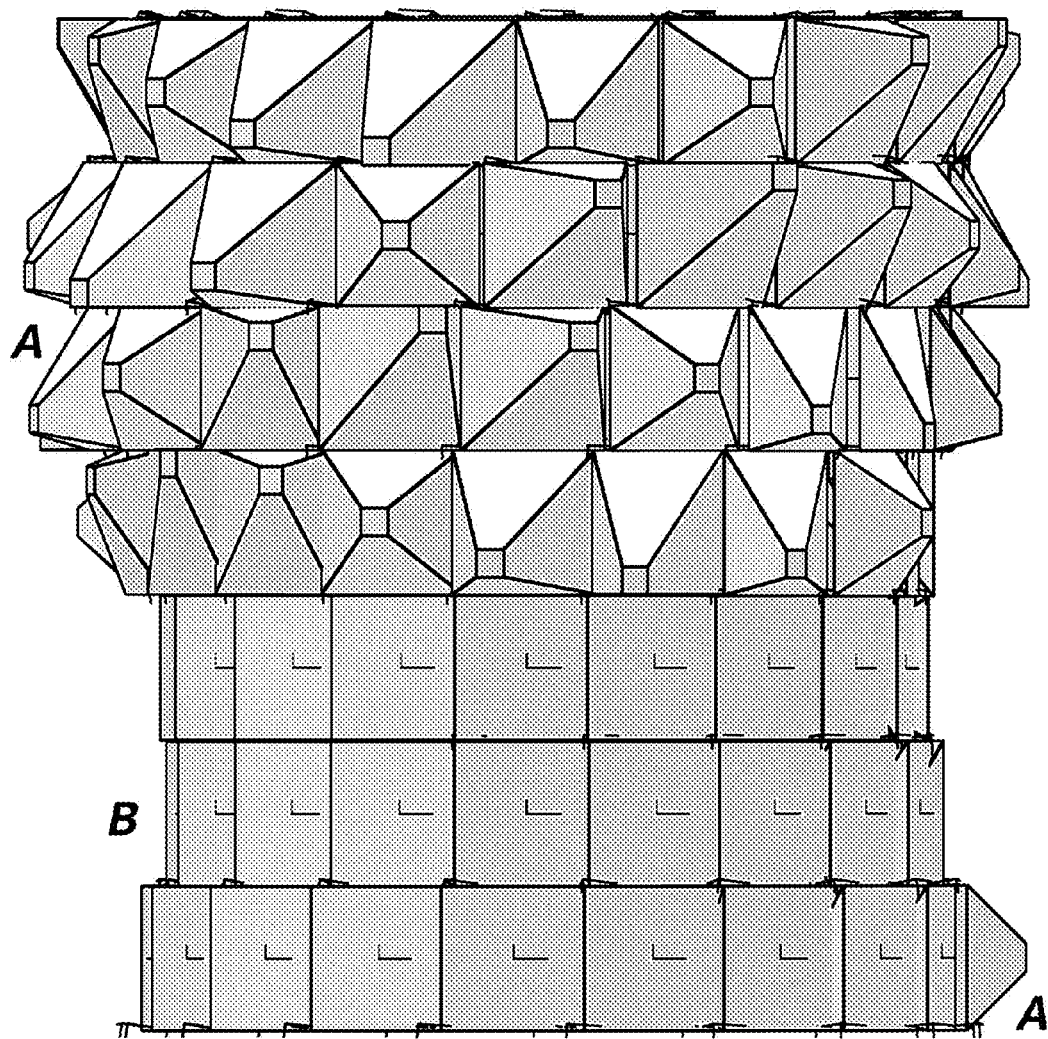

The result of changing the function for calculating the radii of the ring bases is shown in FIG. 50.

As in FIG. 46, the ring bases, centre bases and solid objects named BIL are shown. The main difference is in the arrangement of regions A and B, which correspond to the equivalence classes based upon the attribute "CURVATURE". The Sine function introduces a bulge in the upper part of the model and a valley in the lower part, and therefore the distribution of regions A and B is clearly different from FIG. 46. The influence of a quarter of the next sine wave can also be seen in the bottom right part of the figure. The reason why not all of the bottom line belongs to region B is the influence of the positions of the backbone bases.

Variation of Content Objects with Reference Base

In the example described previously, content objects were inserted into the bases such that the content object was the same for every base at the time of insertion. However, this need not be the case, and instead processing can be performed by the system to insert content objects so that a property of each content object (such as its position, orientation and/or shape) varies in accordance with the base into which the content object is inserted.

For example, at step S500 in the third round of processing, 5 content objects were inserted into each centre base. More particularly, four points $P_L$, $P_R$, $P_B$, $P_T$ and a polygon F were brought into the system from an outside source and a copy of each object was assigned to each centre base. As a result, polygon F was identical for each centre base.

However, the processing at step S500 may be performed instead so that a property of polygon F changes in dependence upon the centre base into which it is assigned.

An example will now be described in which processing is performed so that the shape of each polygon F changes in dependence upon the reference centre base of the polygon.

Figure 51A:
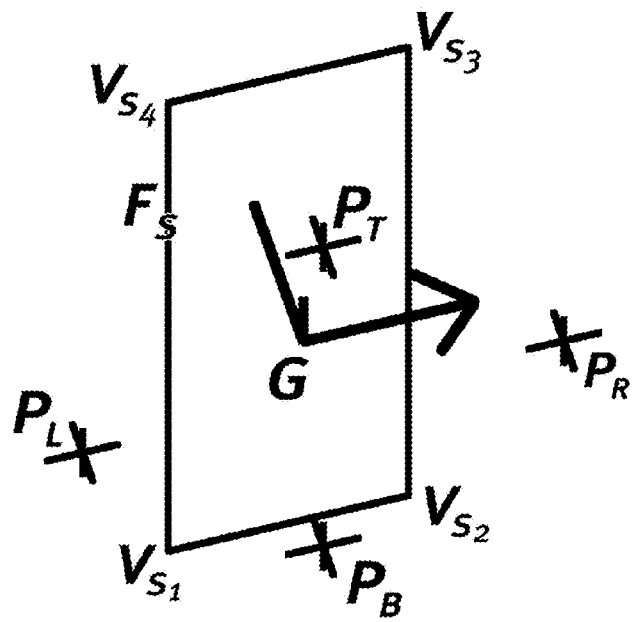
FIGS. 51a, 51b and 52 show an example to illustrate how the embodiment is operable to vary the shape of content objects in dependence upon the index of the reference base into which the content objects are inserted.
Figure 51B:
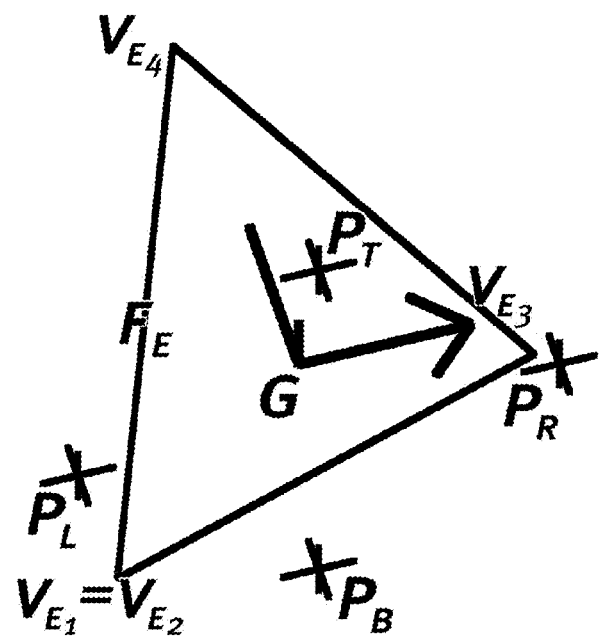

FIGS. 51a and 51b show the starting shape of the polygon $F_s$ and the ending shape of the polygon $F_E$, respectively. Also shown are points $P_T$, $P_R$, $P_E$, $P_T$, which are the same for each centre base. All objects are shown in the same position relative to the centre base's origin as their position to the global coordinate system G.

The coordinates of the vertices of the polygon are:
$F_s = \{\{-2.1, 0.0, -2.1\}, \{2.1, 0.0, -2.1\}, \{2.1, 0.0, 2.1\}, \{-2.1, 0.0, 2.1\}\}$
$F_E = \{\{-1.788, 0, -1.788\}, \{-1.788, 0, -1.788\}, \{2.442, 0, 0.654\}, \{-0.654, 0, 2.442\}\}$ The coordinates of the points $P_L$, $P_R$, $P_B$, $P_T$ are the same as those used at step S500 of the third round of processing.

Content importer 92 inserts starting polygon $F_s$ into the first centre base (i.e., into centre base with index 1 that belongs to the first ring base) and inserts ending polygon $F_E$ into the last centre base. All centre bases in between receive a differently shaped polygon $F_i$. These polygons are computed by content generator 90 by the use of a mapping function M:
I—i-th element=index of centre base
$V_S$—starting vertex
$V_E$—ending vertex
N—number of elements $$M[I, V_S, V_E, N] = V_S + I(V_E - V_S)/(N-1)$$

It will be seen from the above that the mapping function M is a function of the variable I, and that I is equal to both the number of the $i^{th}$ and also the index of the base into which the polygon is to be placed (as one polygon is placed in each base so there is a 1:1 relationship). As a result, each polygon is generated in accordance with the value of I of its containing base.

The vertices $V_{i1}$, $V_{i2}$, $V_{i3}$, $V_{i4}$ of the polygon $F_i$ are computed as follows:
$V_{s2}$, $V_{s3}$, $V_{s4}$—vertices of starting polygon $F_s$
$V_{E1}$, $V_{E2}$, $V_{E3}$, $V_{E4}$—vertices of ending polygon $F_E$
$N_{CB}$—total number of centre bases (see the description of step S100 for the $3^{rd}$ round of processing)

$$V_{ij} = M[i, V_{Sj}, V_{Ej}, N_{CB}]\{j=1,2,3,4\}$$

The mapping function M can be used for computation of intermediate objects for any pair of objects that can be represented solely by the same number of vertices.

Figure 52:
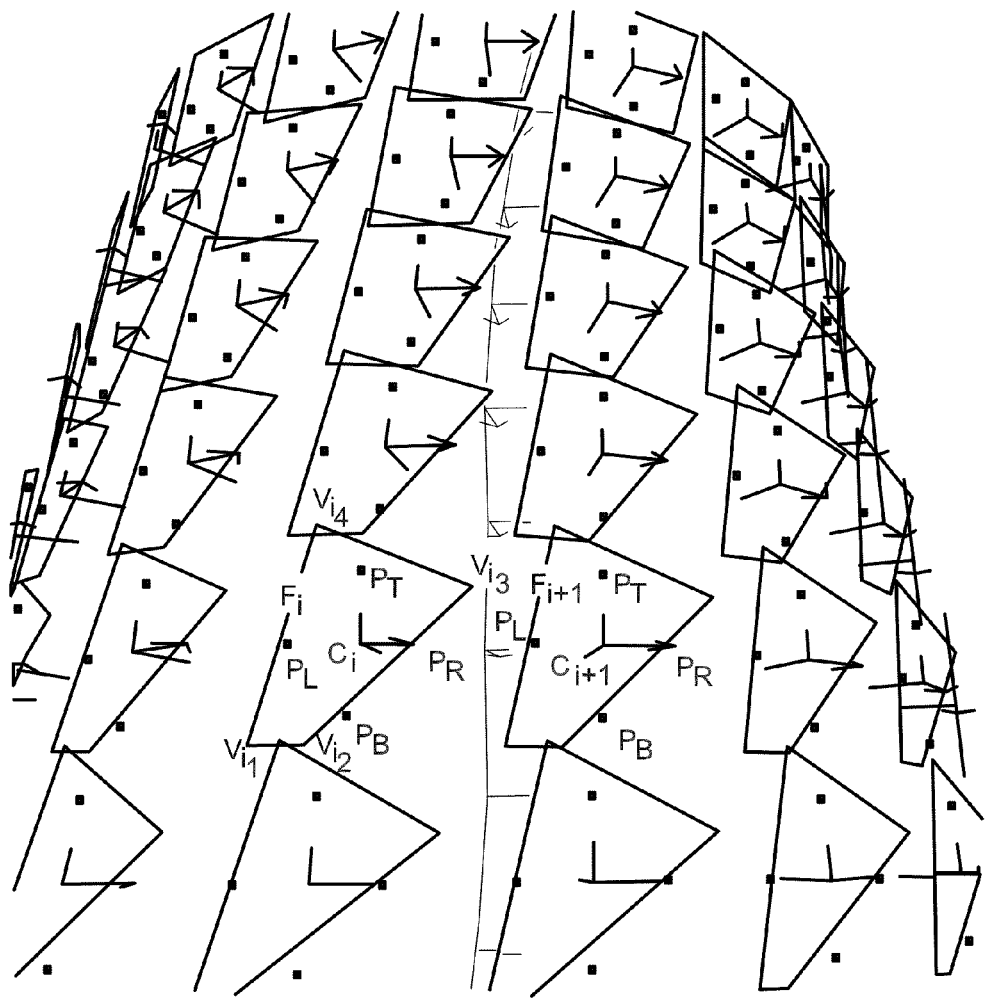

FIG. 52 shows polygons $F_i$ and points $P_L$, $P_R$, $P_B$, $P_T$ distributed to the centre bases Ci.

From this point on, the processing procedure for the generation of the model is the same as the procedure described previously. The only change is in the shape of polygon $F_i$ in each centre base $C_i$.

Figure 53:
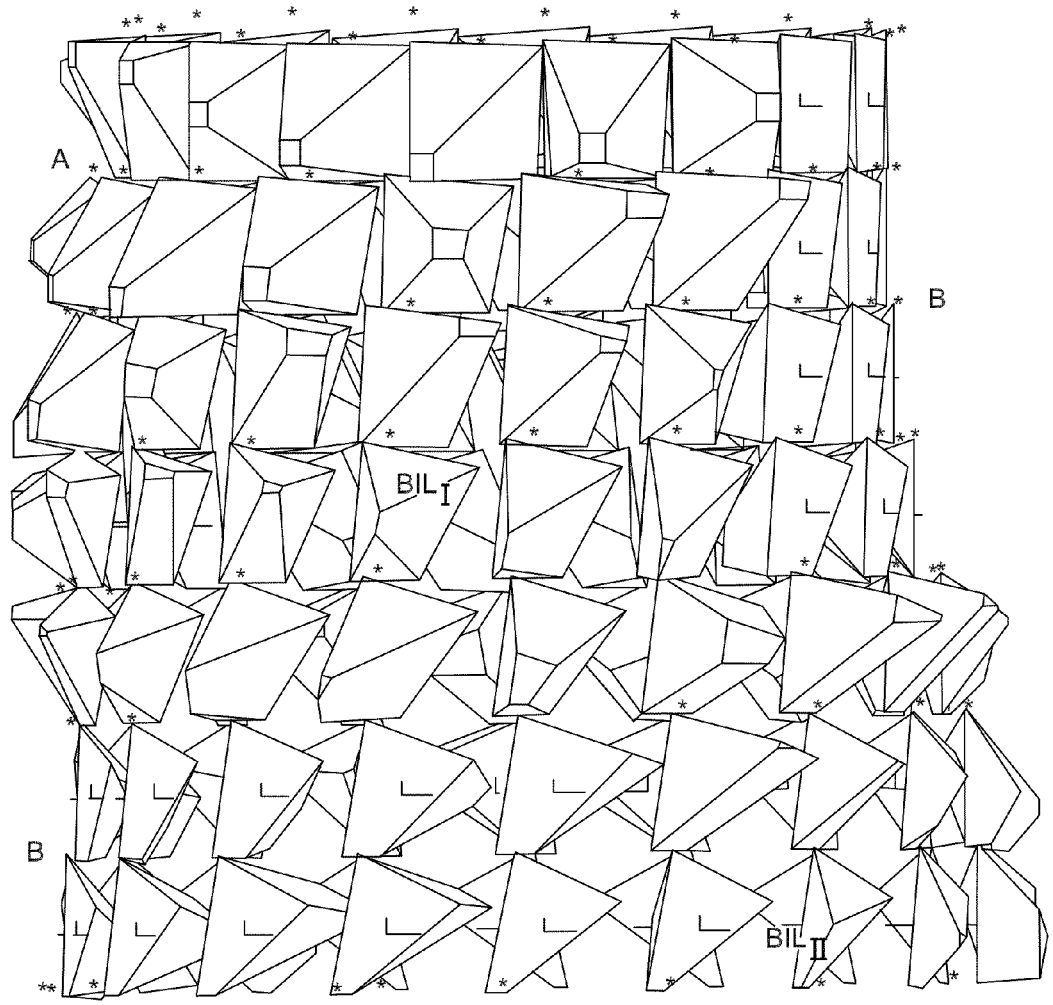
FIG. 53 shows the final model resulting from processing to vary the shape of content objects as illustrated in FIGS. 51a, 51b and 52.

The resulting model from this change is shown in FIG. 53, which corresponds to the view of the model from FIG. 46. The difference between the models shown in FIG. 53 and FIG. 46 is clear. Even on the top row, where the differences between the actual polygons F used for the creation of the solid objects BIL are small, the solid objects have already started to rotate. This rotation is brought about by the rotation of the top edge of polygon F.

The changing of the polygon F from rectangular to triangular shape also influences the slant of the side planes that govern the creation of solid objects (see the description of step S700 in the third round of processing). This change can be so big that the small front plane on the tip completely disappears and becomes an edge, like on objects $BIL_{II}$ and $BIL_{JJ}$.

On the other hand, the arrangement of regions A and B, which correspond to the equivalence classes based upon the attribute CURVATURE, is the same as in the model in FIG. 46.

Generating Content Objects so that they Fit The present embodiment provides facilities for a designer to use to ensure that content objects fit together without gaps and without encroaching upon each other (that is, two content objects do not occupy the same space).

More particularly, content creator 94 provides means for a user to define functions for the creation of a content object such that, as part of the creation, the right side of the content in a base and the left side of the content in the next base (or vice versa) are cut with the same plane.

As a result, encroachment of content objects can be eliminated because the cutting plane is shared between the content objects of neighbouring bases and therefore no solid object cut with this plane can encroach in the space intended for the other base and its content objects.

These features of the content creator 94 will now be illustrated with reference to the generation of a model using the same procedure as described previously, but with different values of some parameters. (Actually, the procedure for creating cut solid objects is already described in the example of step S700 in the third round of processing, where solid objects BIL are cut with planes created at step S700 in the second round of processing. The resulting trimmed solid object is named "BIL cut".)

Figure 54A:
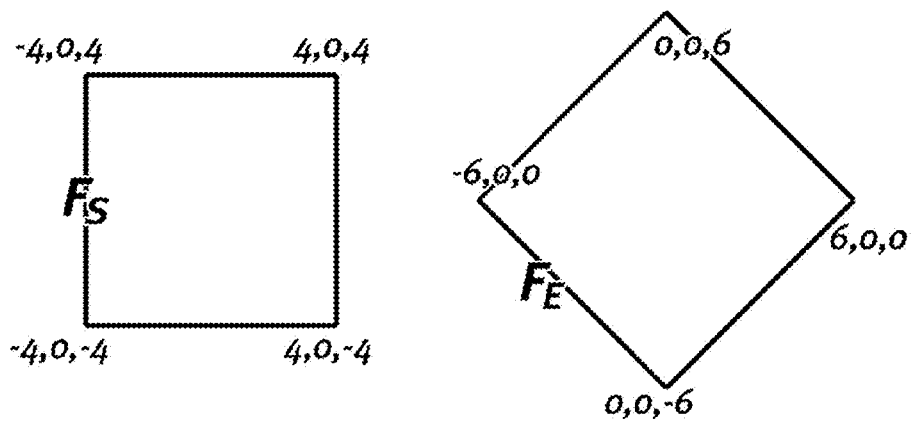
FIGS. 54a, 54b and 54c illustrate an example to show how the embodiment is operable to generate content objects so that they do not encroach.

In the section "Variation of Content Objects with Reference Base" above, the mapping function M is used to change the shape of polygon F. The same mapping function is used in this example, but the difference is in the start and end polygons $F_s$ and $F_E$ respectively. These polygons are shown in FIG. 54a and have vertex coordinates.

$F_s = \{\{-4.0, 0.0, -4.0\}, \{4.0, 0.0, -4.0\}, \{4.0, 0.0, 4.0\}, \{-4.0, 0.0, 4.0\}\}$ $F_E = \{\{0.0, 0.0, -6.0\}, \{6.0, 0.0, 0.0\}, \{0.0, 0.0, 6.0\}. \{-6.0, 0.0, 0.0\}\}$

The parameters that are also adjusted for this example govern the creation of the backbone bases (see step S300 in the first round of processing) and the transformation of points $P_L, P_R, P_B, P_T$ into points $P_{LT}, P_{RT}, P_{BT}, P_{TT}$ (see step S600 in the third round of processing).

The new values for these parameters are:
Parameter F: 3.0.

| Point | D | r | $\alpha_s$ | $\alpha$ |
|---|---|---|---|---|
| $P_L$ | {-0.35, -2, 0} | 0.5 | 0° | 22.5° |
| $P_R$ | {0.35, -2, 0} | 0.5 | 0° | 45° |
| $P_B$ | {0, -2, -0.35} | 0.5 | 90° | 90° |
| $P_T$ | {0, -2, 0.35} | 0.5 | 90° | 180° |

Figure 54B:
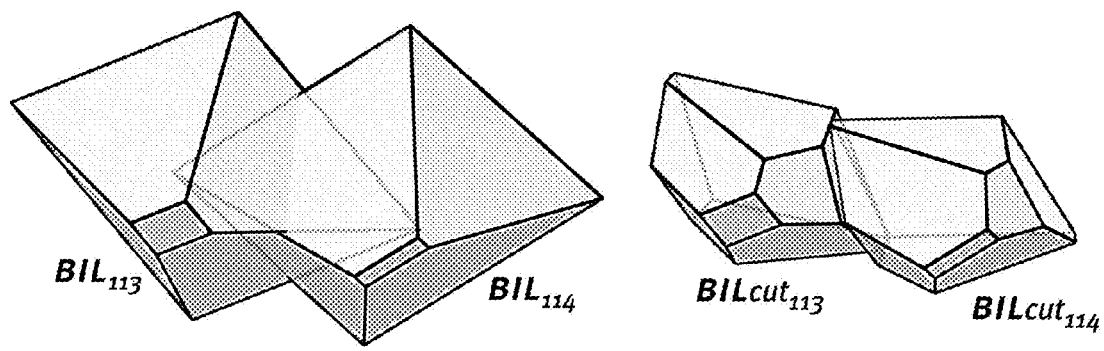

FIG. 54b shows two adjacent solid objects. On the left are $BIL_{113}$ and $BIL_{114}$ that encroach on each other, and on the right are the same objects trimmed with planes, namely "BIL $cut_{113}$" and "BIL $cut_{114}$".

Figure 54C:
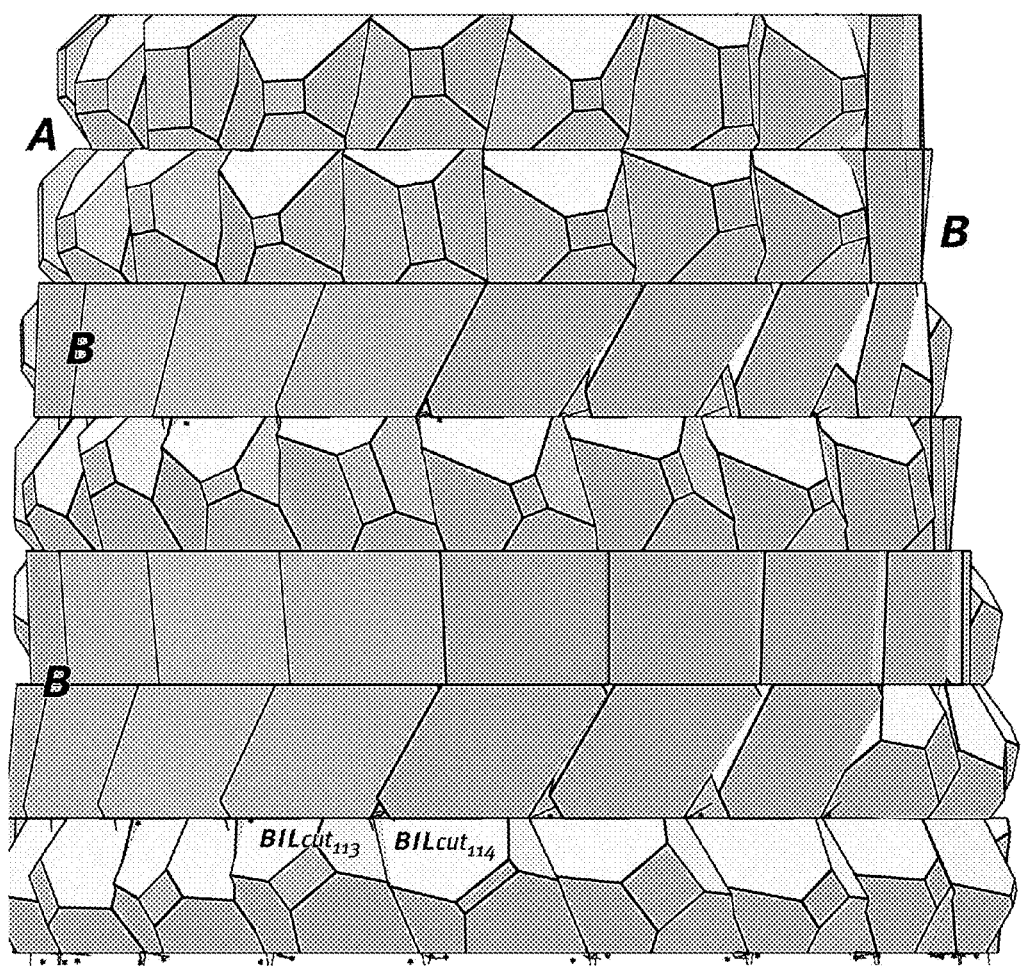

The resulting model from executing the generating procedure with the parameters above is shown in FIG. 54c. The trimmed objects "BIL $cut_{113}$" and "BIL $cut_{114}$" are shown in their position in the model.

Sensor Functions to Detect a Property of the Model Using the Model Graph

At step S800 in the second round of processing described previously, a sensor function was executed which divided bases into equivalence classes in dependence upon the value of an attribute of each base (that is, the attribute "CURVATURE").

However, sensor function executor 110 is also operable to generate and execute a sensor function to divide bases into equivalence classes in dependence upon connections to/from the vertex representing that base in the model graph.

An example of such a sensor function will be described below.

In this example, graph manager 80 adds two additional connections to the model generated in rounds 1-3 of the processing described previously, and sensor function executor 110 defines a sensor function which divides the ring bases into new equivalence classes.

These operations are performed at steps S400 and S800 in the second round of processing.

More particularly, at step S450 in the second round of processing, graph manager 80 defines two additional intrageneration connections, namely LINE-1 and LINE-2.

Connections LINE-1 are produced by the following procedure:

A finite series of indices S is created by applying the following rules:
$s_0$=starting index
$s_i$=+19
$s_i$<=total number of ring bases Series S is completely defined by its starting index. When starting indices $s_0$=1, 4, 7, 10, 13, and 16 are used, six series of indices are created:
L1-1={1, 20, 39, 58, 77, 96, 115, 134}
L1-4={4, 23, 42, 61, 80, 99, 118, 137}
L1-7={7, 26, 45, 64, 83, 102, 121, 140}
L1-10={10, 29, 48, 67, 86, 105, 124, 143}
L1-13={13, 32, 51, 70, 89, 108, 127}
L1-16={16, 35, 54, 73, 92, 111, 130}

Connection LINE-1 is applied to each pair of consecutive indices from each series L1-1 to L1-16 (that is, from series L1-1, pairs (1, 20), (20, 39), (39, 58), (58, 77), (77, 96), (96, 115) and (115, 134) are connected).

Figure 55:
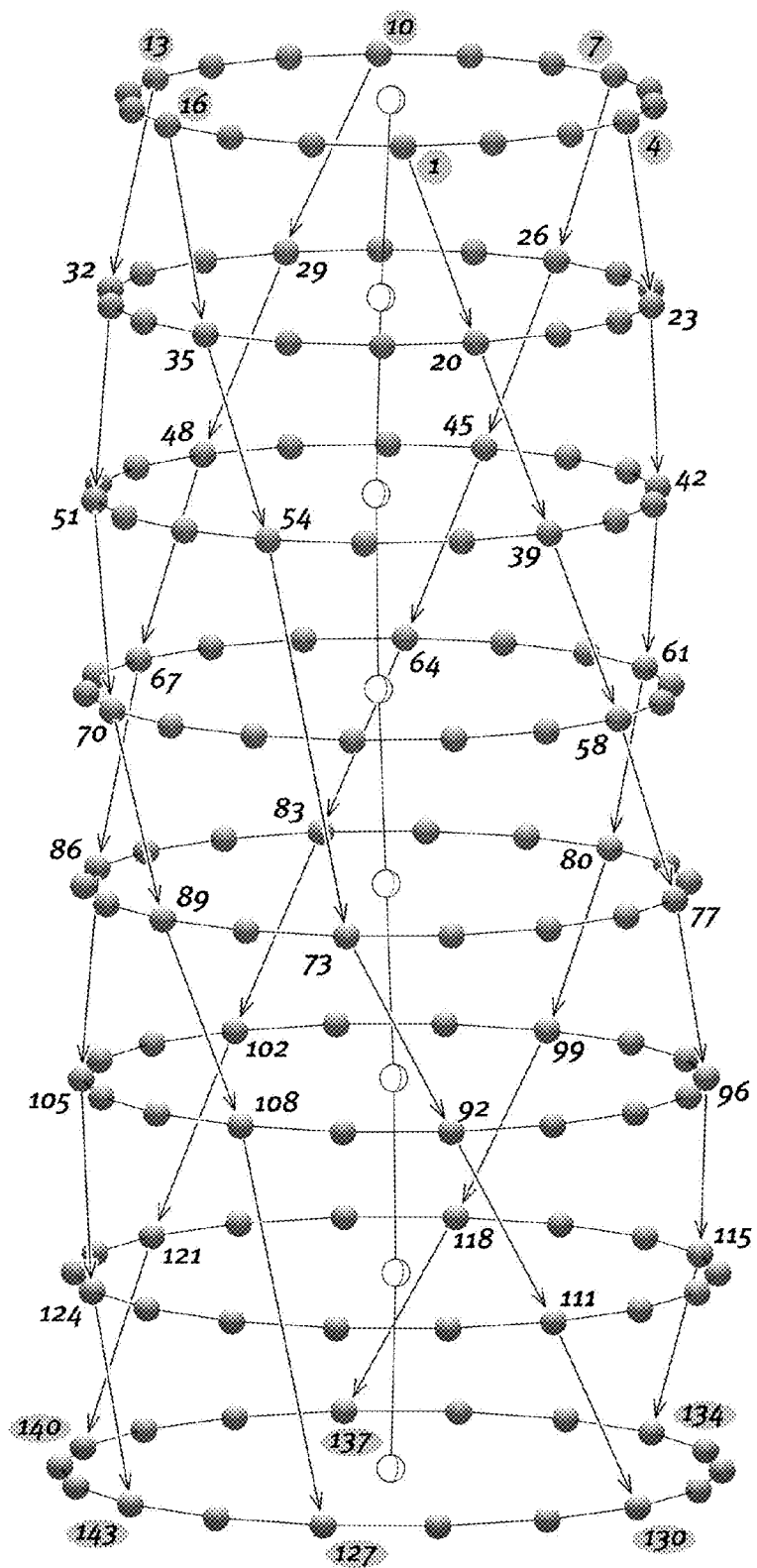
FIGS. 55, 56 and 57 show an example to illustrate the execution of a sensor function to detect a property of the model using the model graph.

The connections LINE-1 in a model graph are shown in FIG. 55.

Connections from the second additional connection LINE-2 are produced by the following procedure:

A finite series of indices S is created by applying the following rules:
$s_0$=starting index
$s_{i-1}$=+Displacement[i]
$s_i$<=total number of ring bases Displacement[i] is a random series of whole numbers between 15 and 21. For this example following series is used:
Displacement[i]={19, 19, 21, 17, 20, 21, 15, 18, 21, 18, 19, 17, 17, ... }

When starting indices $s_0$=1, 5, 9 and 13 are used, four series of indices are created:
L2-1={1, 20, 39, 58, 77, 96, 115, 134}
L2-5={4, 23, 42, 61, 80, 99, 118, 137}
L2-9={7, 26, 45, 64, 83, 102, 121, 140}
L2-13={13, 32, 51, 70, 89, 108, 127}

Connection LINE-2 is then applied to each pair of consecutive indices from each series L2-1 to L2-13.

Figure 56:
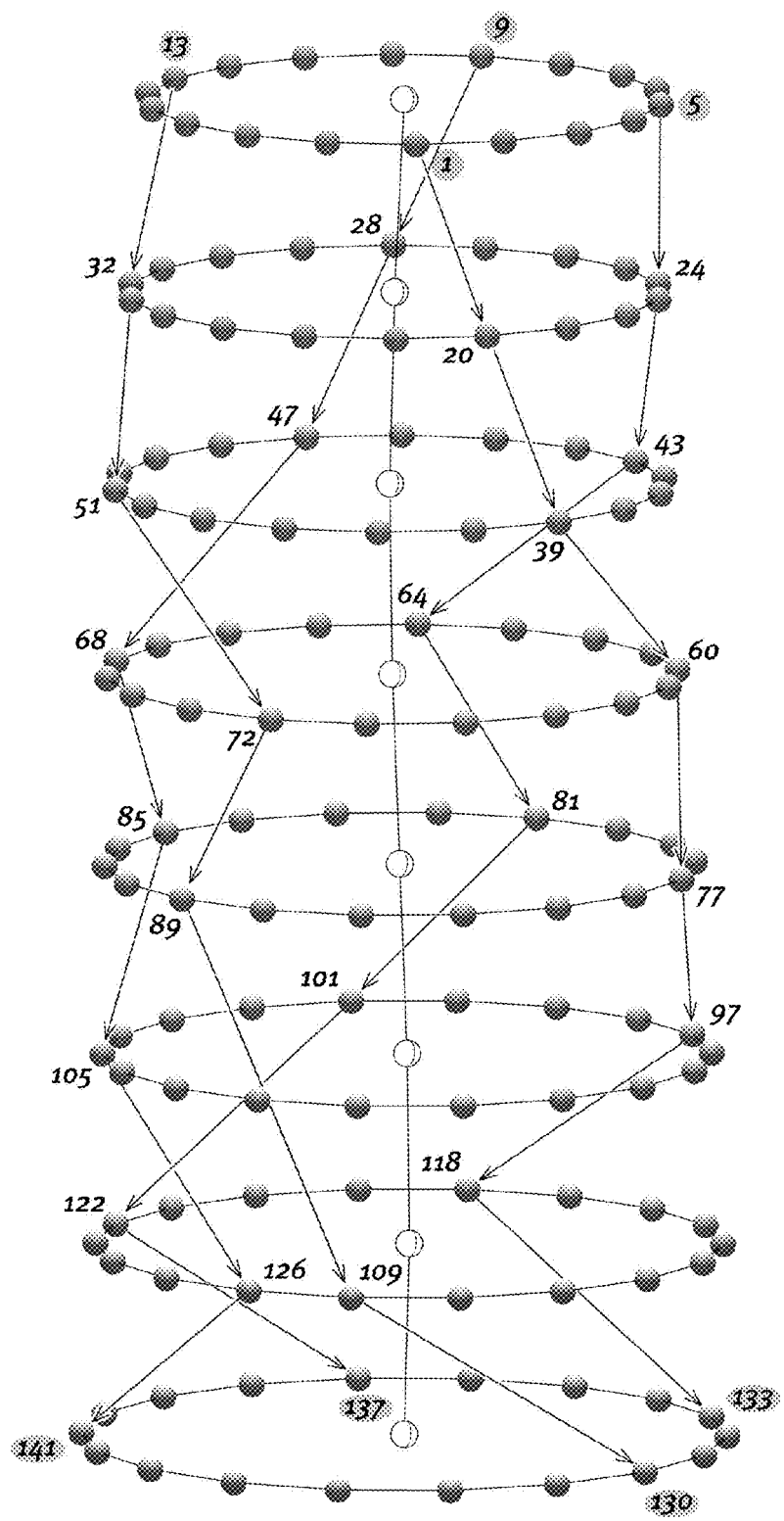

The connections LINE-2 in a model graph are shown in FIG. 56.

At step S800 in the second round of processing, ring bases are classified into 5 equivalence classes based upon the results of a sensor function SG, which checks what connections are going out of each node in a model graph.

These 5 equivalence classes are:

| Equivalence class | Description |
|---|---|
| EQLN-0 | ring bases which lack both of connections LINE-1 and LINE-2 |
| EQLN-1 | ring bases with connection LINE-1 only |
| EQLN-2 | ring bases with connection LINE-2 only |
| EQLN-3 | ring bases with connections LINE-1 and LINE-2, which connects to different end points |
| EQLN-4 | ring bases with connections LINE-1 and LINE-2, which connects to the same end point |

The above classification is achieved with a sensor function SG defined and executed by sensor function executor 110:

$$SG[I] = \begin{cases} 0, & (SL1[I] = 0) \text{ and } (SL2[I] = 0) \\ 1, & (SL1[I] < 0) \text{ and } (SL2[I] = 0) \\ 2, & (SL1[I] = 0) \text{ and } (SL2[I] > 0) \\ 3, & (SL1[I] > 0) \text{ and } (SL2[I] > 0) \text{ and } (SL1[I] \neq SL2[I]) \\ 4, & (SL1[I] > 0) \text{ and } (SL2[I] > 0) \text{ and } (SL1[I] = SL2[I]) \end{cases}$$

Index $I$ = index of $i$-th ring base

Function SL1[I] returns the index of the end point of connection LINE-1 from the ring base with index I. If there is no connection LINE-1 from this base, function SL1[I] returns 0.

Function SL2[I] returns the index of the end point of connection LINE-2 from the ring base with index I. If there is no connection LINE-2 from this base, function SL2[I] returns 0.

Each value of the sensor function SG[I] defines one equivalence class, which is represented with an additional attribute "LINE NODE" on each ring base. Depending on the value of function SG[I], the following values are assigned to the attribute "LINE NODE":

| Value of function SG[I]: | 0 | 1 | 2 | 3 | 4 |
|---|---|---|---|---|---|
| value of attribute "LINE NODE" | EQLN-0 | EQLN-1 | EQLN-2 | EQLN-3 | EQLN-4 |

Figure 57:
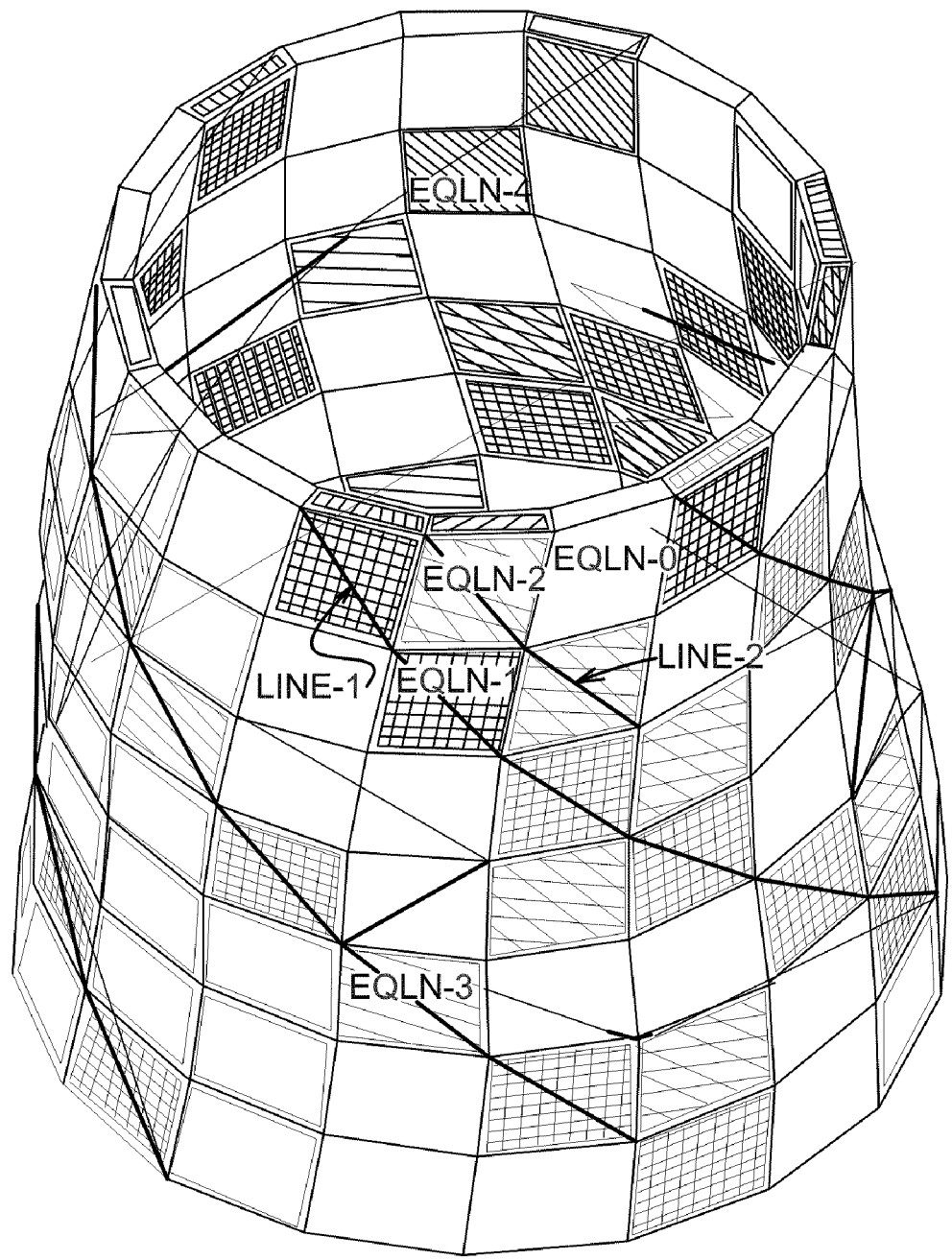

FIG. 57 shows the graphical distribution of equivalence classes over a model. On the figure, white blocks are shaded with a different pattern according to the value of the attribute LINE NODE. Also connections LINE-1 and LINE-2 are shown in the form of lines.

Identifying Bases with Defined Relationships, and Adding Different Content Objects In this part, another use for equivalence classes is described. The difference from the main example is only at step S500 in the third round of processing, where content objects are inserted in the centre bases.

Figure 41A:
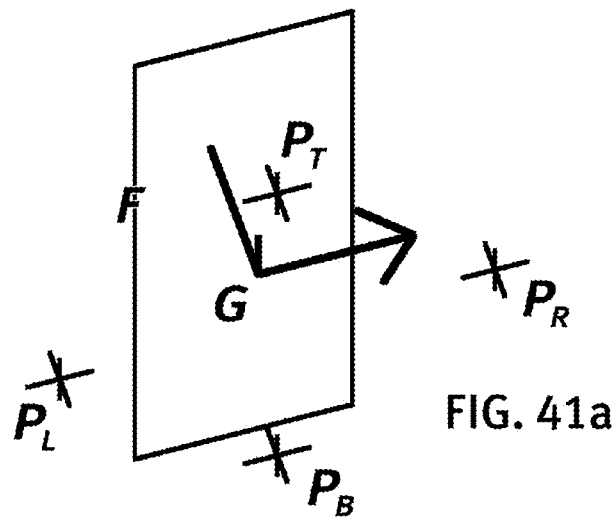
FIGS. 41a and 41b show an example to illustrate the insertion of content objects into the centre bases at step S500 in the third round of processing.
Figure 41B:
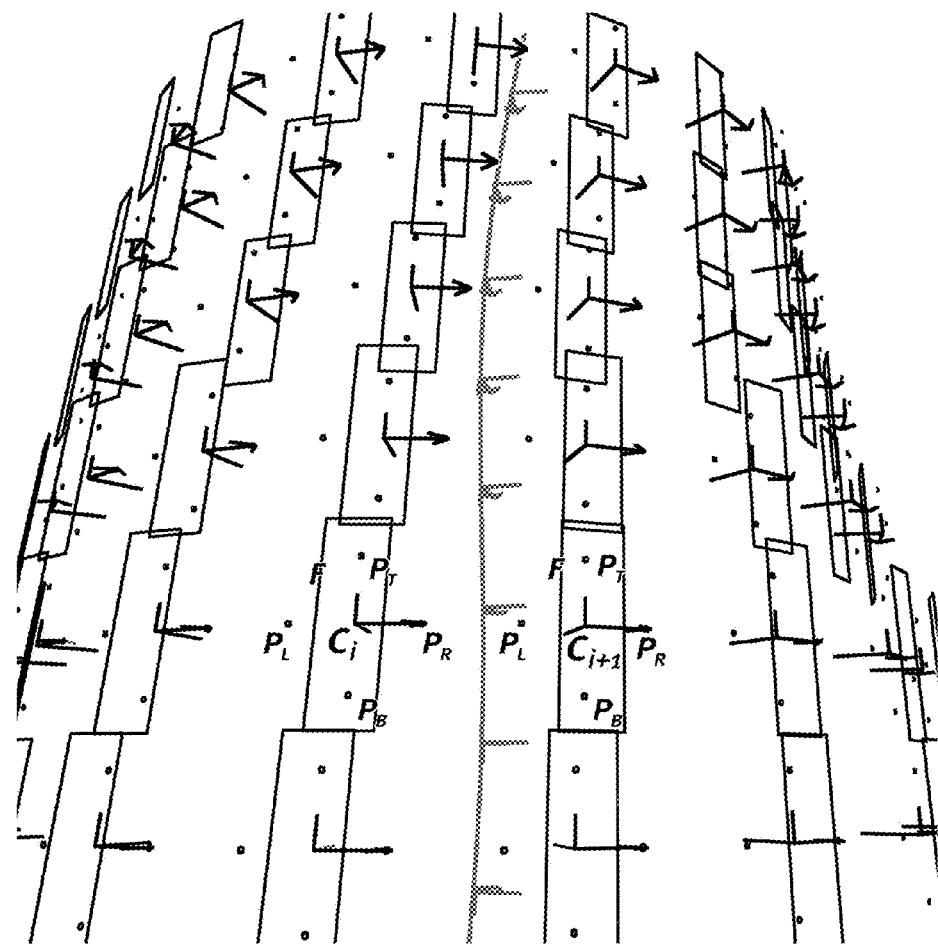
Figure 58A:
FIGS. 58a and 58b show an example to illustrate how the embodiment is operable to identify bases having a defined relationship and to add different content objects thereto.

At this step, content object polygon F is inserted in each of the centre bases (FIGS. 41*a* and 41*b*). In the example below, instead of the same polygon F, different polygons $F_1$ and $F_2$ are inserted in the centre bases $C_i$ (FIG. 58*a*). Polygon $F_1$ is inserted in the centre bases where the value of the attribute "CURVATURE" of its parent ring base $R_i$ is "−" and polygon $F_2$ in the centre bases where the value of the attribute "CURVATURE" of its parent ring base $R_i$ is "+".

The coordinates of the vertices of the polygons $F_1$ and $F_2$ relative to centre base in this example are:

$F_1$={{−2.1, 0.0, −2.1}, {2.1, 0.0, −2.1}, {2.1, 0.0, 2.1}, {−2.1, 0.0, 2.1}}

$F_2$={{0.0, 0.0, −3.156}, {0.0, 0.0, −3.156}, {2.733, 0.0, 1.578}, {−2.733, 0.0, 1.578}}

Subsequent processing is then carried on as in the main example. The result of this change is shown in FIG. 58*b*.

Figure 58B:
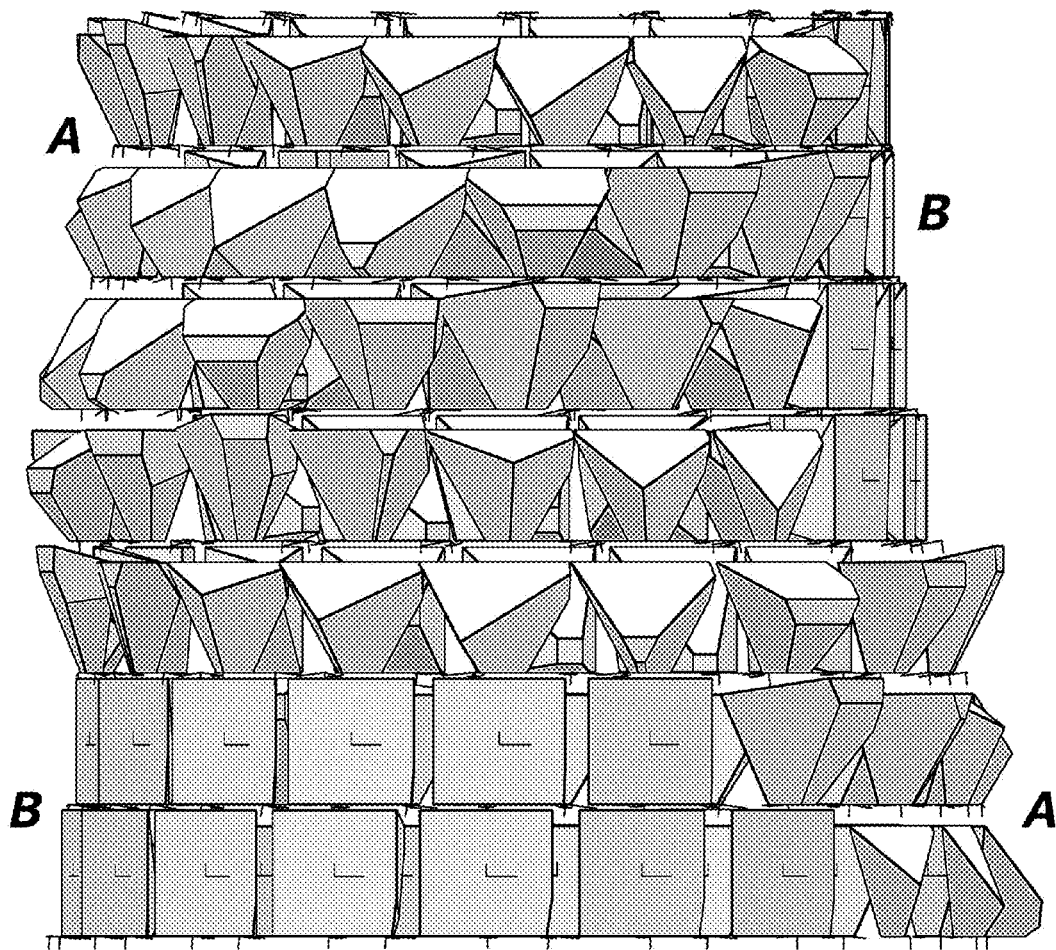

Referring to FIG. 58*b*, the ring bases, centre bases and solid objects named $BIL_{CUT}$ are shown. The main difference in the model produced by the use of different polygons $F_i$ in this example is in the shape of the solid objects $BIL_{CUT}$ in region A in comparison to the objects in the same region A shown in FIG. 46. Objects in region B are the same in both FIGS. 58*b* and 46 since the polygon $F_1$ from this example used for construction of objects $BIL_{CUT}$ is the same as polygon F from the main example.

Identifying of Bases and Content Objects with Defined Relationships, Identifying Content Objects with Defined Relationships, and Adding Further Content Objects At step S800 in the second round of processing described previously, a sensor function was executed which divided bases into equivalence classes in dependence upon the value of an attribute of each base (that is, the attribute "CURVATURE").

An example will now be described of two additional sensor functions executed at step S800 in the third round of processing. First, sensor function SA[i] will compute a directed angle between the X-axis direction of backbone base $B_{Iref}$ and the normal vector of the plane in which polygon $F_i$ lies. Second, sensor function LA[i] will compute a directed angle between the normal vector of the plane $PL_i$ from ring base $R_i$ and the normal vector of the plane in which polygon $F_i$ lies. Based upon different criteria for each sensor, two attributes are assigned to centre bases $C_i$: "SIDE-ANGLE" depending on the values of sensor function SA and "LOCAL-ANGLE" depending on the values of sensor function LA. The result will be a generation of centre bases partitioned into two sets of equivalence classes, one set of equivalence classes per attribute.

Sensor Function Sa[i]:
$R_i$—i-th ring base
$C_i$—i-th centre base, contained in ring base $R_i$
$F_i$-Polygon F in centre base $C_i$
$B_{Iref}$—Reference backbone base for i-th ring base $R_i$ (index $I_{ref}$ is
computed by formula from step S215 on second round of processing)
$X_{Iref}$—X-axis direction of reference backbone base $B_{Iref}$
$N_{Fi}$—Normal vector of plane in which lies polygon $F_i$ $$SA[i] = \text{AngleBetween}[x[I_{ref}[i]], N_{Fi}]$$

Figure 59A:
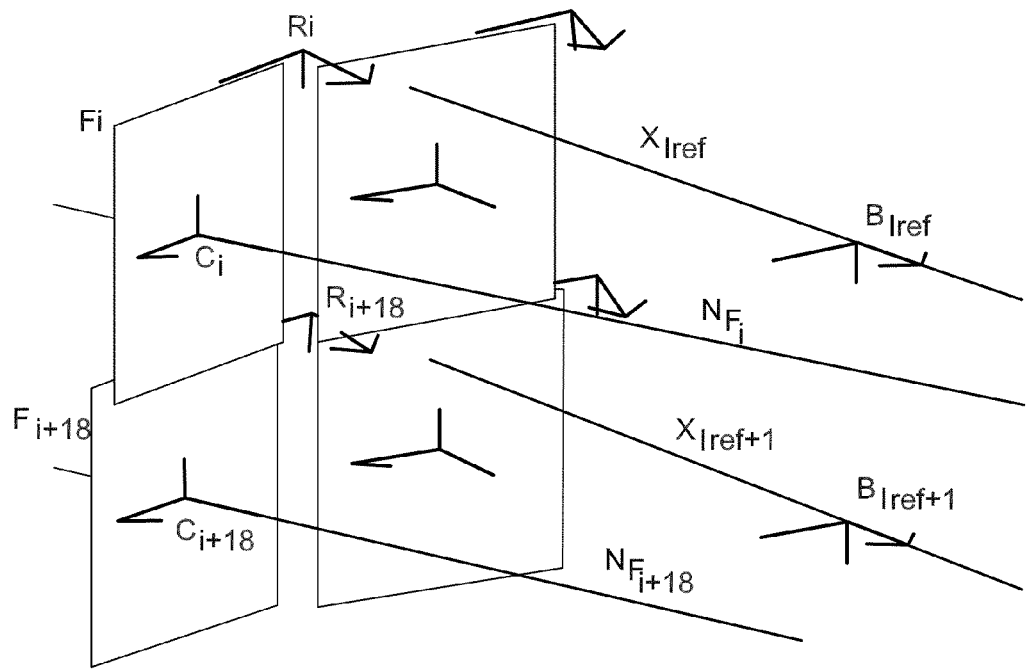
FIGS. 59a, 59b, 60a, 60b, 60c, 61, 62, 63 and 64 show an example to illustrate how the embodiment is operable to identify bases and content objects having a defined relationship, to identify content objects having a defined relationship, and to add further content objects to the design in accordance with the identified features.

FIG. 59*a* shows objects involved in the computation of sensor function SA for bases $C_i$ and $C_{i+18}$.

The attribute "SIDE-ANGLE" for each centre base $C_i$ is defined with the following function:

$$\text{SIDE-ANGLE}[i] = \begin{cases} EQSA - 1, & 0° \leq SA[i] < 120° \\ EQSA - 2, & 120° \leq SA[i] < 240° \\ EQSA - 3, & 240° \leq SA[i] < 360° \end{cases}$$

Figure 61:
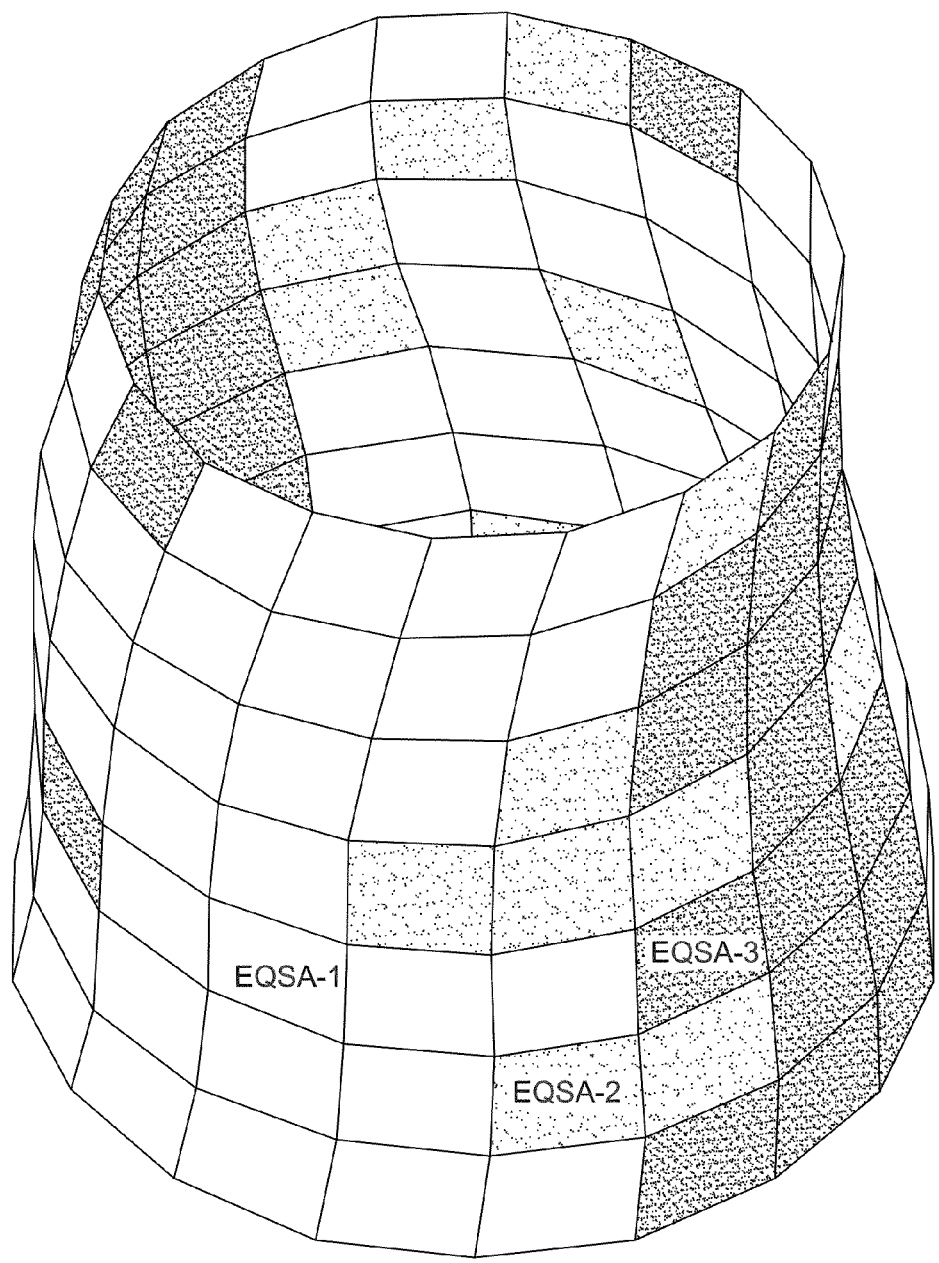

Since the angle is always between 0° and 360°, all possible values for the function SA[i] are covered, thus splitting the generation of centre bases $C_i$ into three distinct groups (equivalence classes), each group identified by the different values of the attribute "SIDE-ANGLE": EQSA-1, EQSA-2 or EQSA-3. FIG. 61 shows the distribution of equivalence classes EQSA-1, EQSA-2 and EQSA-3 across the model (the view of the model is from the same position as that in FIG. 35*a*).

Different partitioning of the generation of centre bases can be achieved by using the second sensor function LA.

Sensor Function La[i]:
$R_i$—i-th ring base
$C_i$—i-th centre base, contained in ring base $R_i$
$F_i$—Polygon F in centre base $C_i$
$PL_i$—Left plane in ring base $R_i$ (defined in step S700 on second round of processing)
$N_{Fi}$—Normal vector of plane in which lies polygon $F_i$
$N_{PLi}$—Normal vector of plane $PL_i$ $$LA[i]=\text{AngleBetween}[N_{PLi}, N_{Fi}]$$

Figure 59B:
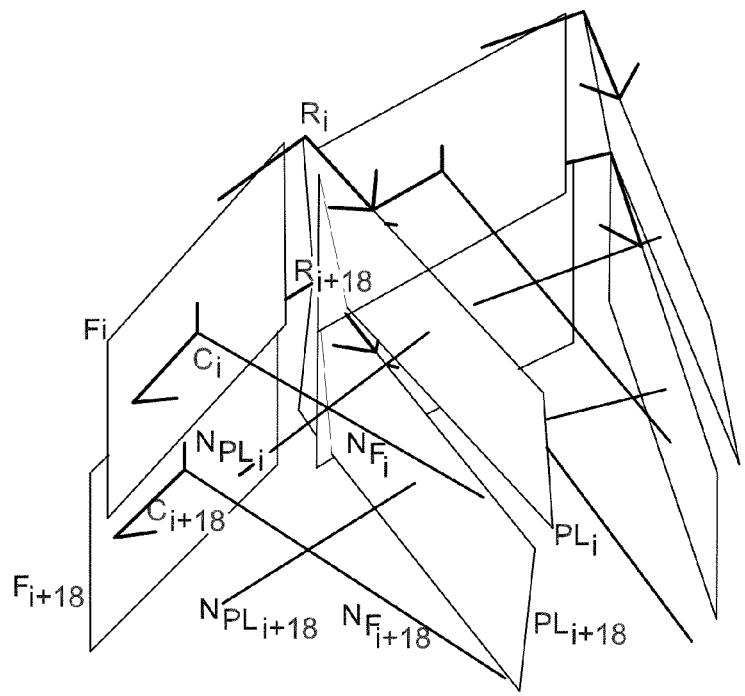

FIG. 59*b* shows the objects involved in computation of sensor function LA for bases $C_i$ and $C_{i+18}$.

The attribute "LOCAL-ANGLE" for each centre base $C_i$ is defined with the following function:

$$\text{LOCAL-ANGLE}[i] = \begin{cases} EQLA-1, & 0° \leq SA[i] < 75° \vee 285° < SA[i] < 360° \\ EQLA-2, & 75° \leq SA[i] < 105° \vee 255° < SA[i] \leq 285° \\ EQLA-3, & 105° \leq SA[i] \leq 285° \end{cases}$$

Figure 63:
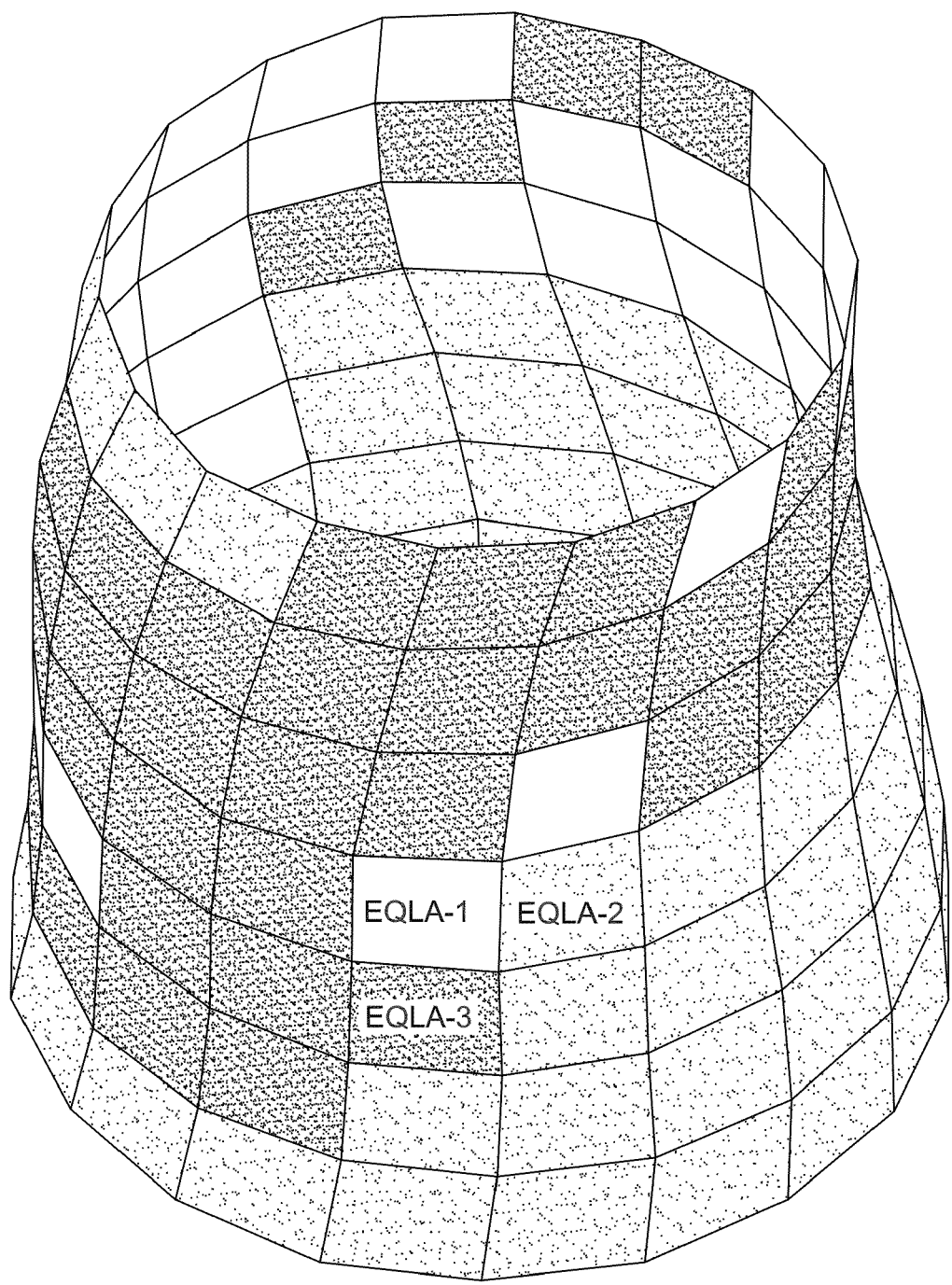

Since the angle is always between 0° and 360°, all possible values for the function LA[i] are covered, thus splitting the generation of centre bases $C_i$ into three distinct groups (equivalence classes), each group identified by the different values of the attribute "LOCAL-ANGLE": EQLA-1, EQLA-2 or EQLA-3. FIG. 63 shows the distribution of equivalence classes EQLA-1, EQLA-2 and EQLA-3 across the model (the view of the model is from the same position as that in FIG. 35*a*).

By partitioning the centre bases into distinct groups of bases, different content objects can be inserted into each group of bases, as will now be shown.

After assigning attributes "SIDE-ANGLE" and "LOCAL-ANGLE" in step S800, the processing procedure goes back to step S700 to add new content objects to the model. A solid block FB will be created in the centre bases $C_i$ from equivalence class EQSA-1 (having value of attribute "SIDE-ANGLE" equal to EQSA-1), solid block FBM will be created in the centre bases $C_i$ from equivalence class EQSA-2, and shelled solid block FBS will be created in the centre bases $C_i$ from equivalence class EQSA-3. The procedures for creating these content objects are described below and shown in FIGS. 60*a*, 60*b* and 60*c*.

Solid block FB is created from polygon F by an operation "Thicken to solid" executed in the external geometric modelling kernel. This operation thickens polygons on both sides and in the direction of a supplied vector.

Making of solid block FB:
$C_i$—Reference centre base $C_i$
F—Polygon F in centre base $C_i$
$d_{IN}$ Thickness of the solid FB on negative side of polygon F (=0.15 m)
$d_{OUT}$—Thickness of the solid FB on positive side of polygon F (=0.50 m)

FB—Created solid block

Figure 60A:
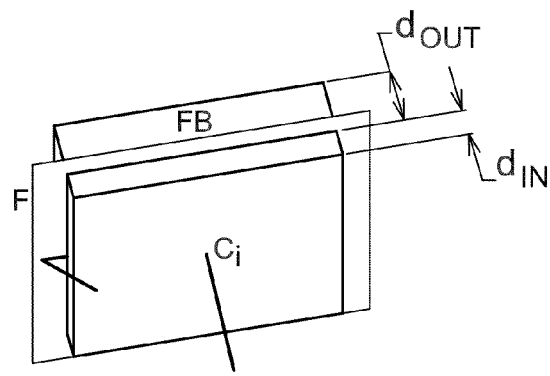
Figure 60B:
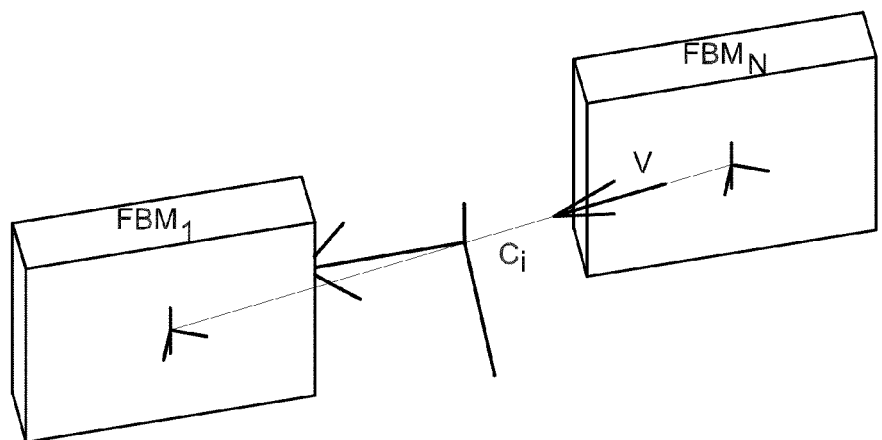

The orientation of the polygon F and with it the labelling of one side of the polygon as positive and the other as negative is defined by the order in which the vertices on the polygon are enumerated. In this case, the vertices are enumerated in such a way that the positive side of polygon F points in the direction of the negative Y-axis of the reference centre base $C_i$. Before thickening to solid, polygon F is scaled by a factor of 0.85 around its centre, which, in this example, corresponds to the origin of the reference centre base $C_i$. The vector along which the thickening is carried out is the Y-axis of the reference centre base $C_i$. FIG. 60*a* shows the relevant objects for the execution of this operation.

Making of Solid Block FBM:
$C_i$—Reference centre base $C_i$
$FBM_1$—Copy of solid block $FB_1$ in new position relative to the centre base $C_1$
$FBM_N$—Copy of solid block $FB_N$ in new position relative to the centre base $C_N$
V—Vector v represents path for translating solid blocks $FBM_i$ from centre base $C_i$ Solid block $FBM_i$ has the same shape as solid block $FB_i$. The difference is in its position relative to the reference centre base $C_i$. Each solid block $FBM_i$ is created as a solid block $FB_i$ and then transformed with transformation TRF[i].

$$FBM[i]=TRF[i] \cdot FB[i]$$

Transformation TRF[i] comprises translation TF[i] and identity rotation matrix which are calculated relative to each centre base $C_i$. Translation TF[i] is defined as a move along a vector v given relative to the centre base $C_i$ for the amount $FBM_{DIST}[i]$.

$$TF[i]=FBM_{DIST}[i]v=(m_1+(i-1)(m_N-m_1)/(N-1))v$$

$m_1$=2.5 m
$m_N$=−2.5 m
v={2.0, 1.0, 1.0}
N=number of centre bases

In other words, solid blocks $FBM_i$ are moved in a straight line defined by vector v from the position occupied by the solid block $FBM_1$ to the position of the solid block $FBM_N$. This situation is shown on FIG. 60*b*.

Although index i runs for all centre bases $C_i$, it should be noted that the translated objects $FBM_i$ will be created only in the centre bases $C_j$ that are part of the equivalence class EQSA-2.

Making of Solid Block FBS:
$C_i$—Reference centre base $C_i$
FB—Solid block
FBS—shelled solid block
$S_F$—front side of solid block FB
$S_B$—back side of solid block FB
s—shell thickness (=0.15 m)

Solid block FBS is derived from solid block FB by applying a shelling operation on it. Shell is a standard operation for most geometric modelling kernels (sometimes called offset) which takes the surface of the solid and then thickens it by a specified amount in the desired direction—in or out. Parameters for the shell operation can also include a list of faces of the solid which must remain open (actually they are removed before thickening).

Figure 60C:
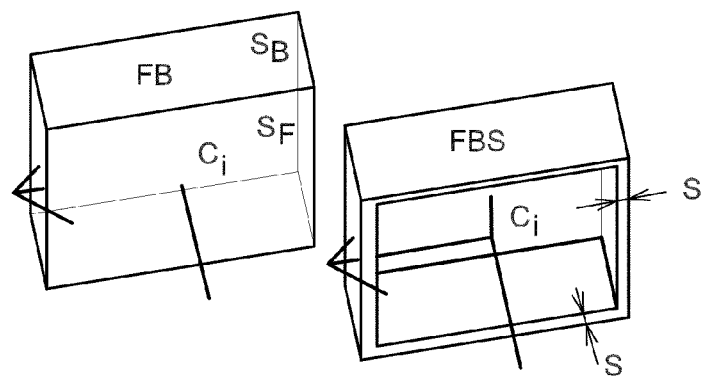

In this example, the solid object FBS is created by applying a shell operation on solid block FB, where front and back faces of the solid FB must remain open. The orientation front/back is defined by the relative position of the faces of the solid FB against reference centre base $C_i$: the face pointing in the direction of the Y-Axis of the centre base $C_i$ is the front face $S_F$, and the opposite face is the back face $S_B$. Shell thickness "s" is applied toward the inside of the solid block FB, meaning that the outer limits of solid blocks FB and FBS are the same. FIG. 60c shows the initial solid block FB with front and back face and the final shelled solid block FBS.

In step S700, solid objects FB, FBM and FBS are created in the centre bases $C_i$ corresponding to the equivalence classes EQSA-1, EQSA-2 and EQSA-3 respectively. Steps S705 to S799 are executed three times in a row, for each content object once. Which centre bases are used for a particular content object is determined in step S720.

The solid objects FB must be created in the centre bases belonging to the equivalence class EQSA-1, which is governed by the value of the attribute "SIDE-ANGLE" (the procedure for making the solid objects FB being as described above).

The solid objects FBM must be created in the centre bases from the equivalence class EQSA-2 (the procedure for making the solid objects FBM being as described above).

It should be noted that another way of producing the solid objects FBM exists. Firstly, the solid objects FB are created using the same procedure as for the solid objects FB for the equivalence class EQSA-1 (basically, they are created in all of the bases from equivalence classes EQSA-1 and EQSA-2). Secondly, their names are changed to FBM in step S800 and, finally, they are transformed with transformation TRF (described above) in the step S600.

The solid object FBS is then created in the centre bases from equivalence class EQSA-3 (the procedure for making solid objects FBS being as described above).

Figure 62:
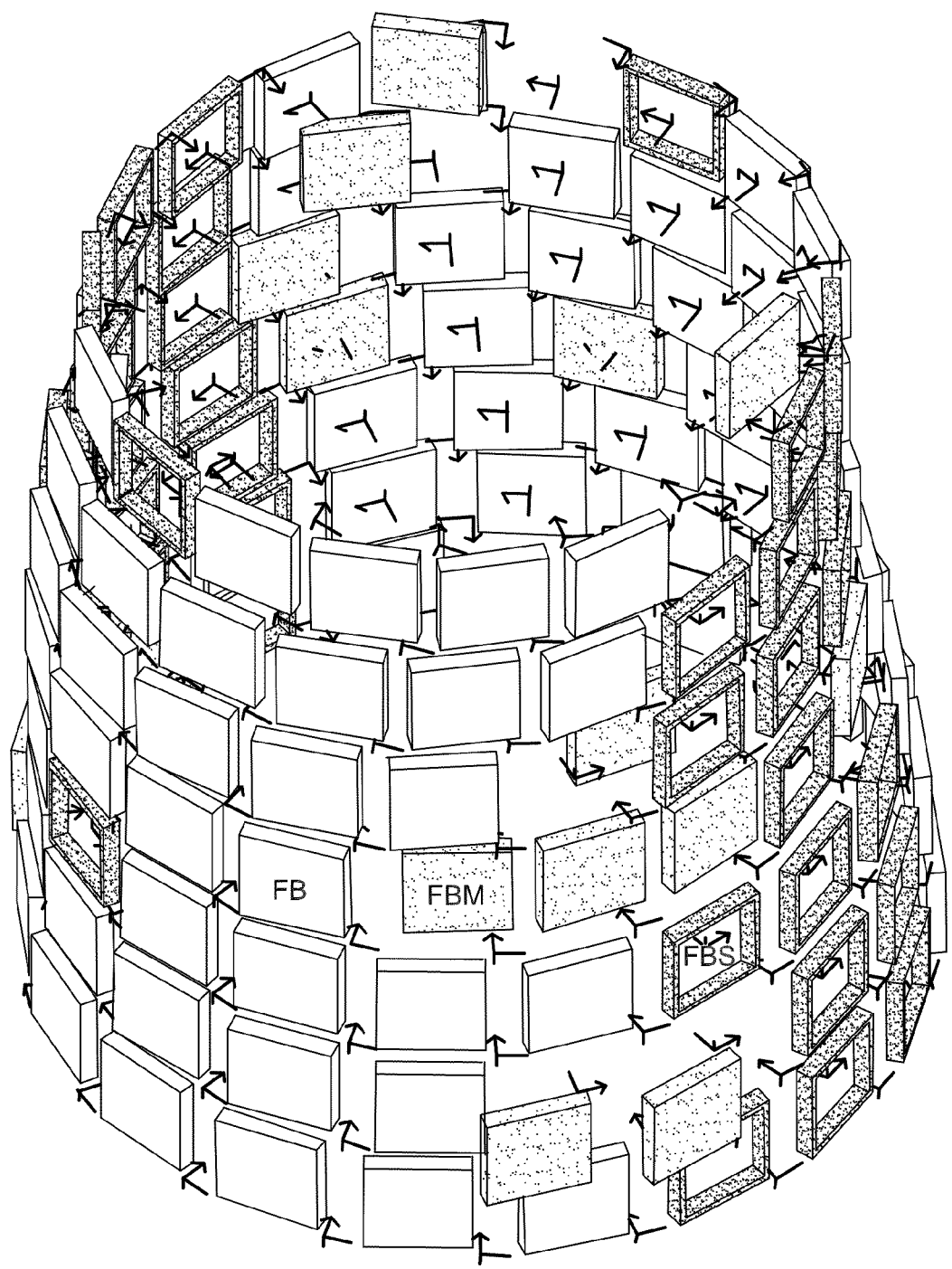

The distribution of the newly added content objects FB, FBM and FBS to the model is shown in FIG. 62 (ring bases and centre bases are also shown in this figure).

If the criteria for selecting the bases for creation of the new content objects FB, FBM and FBS is based upon equivalence classes EQLA-1, EQLA-2 and EQLA-3, such that the content objects FB are created in the centre bases from equivalence class EQLA-1, the content objects FBM in the centre bases from equivalence class EQLA-2, and the content objects FBS in the centre bases from equivalence class EQLA-3, a different distribution of content objects FB, FBM and FBS is achieved.

Figure 64:
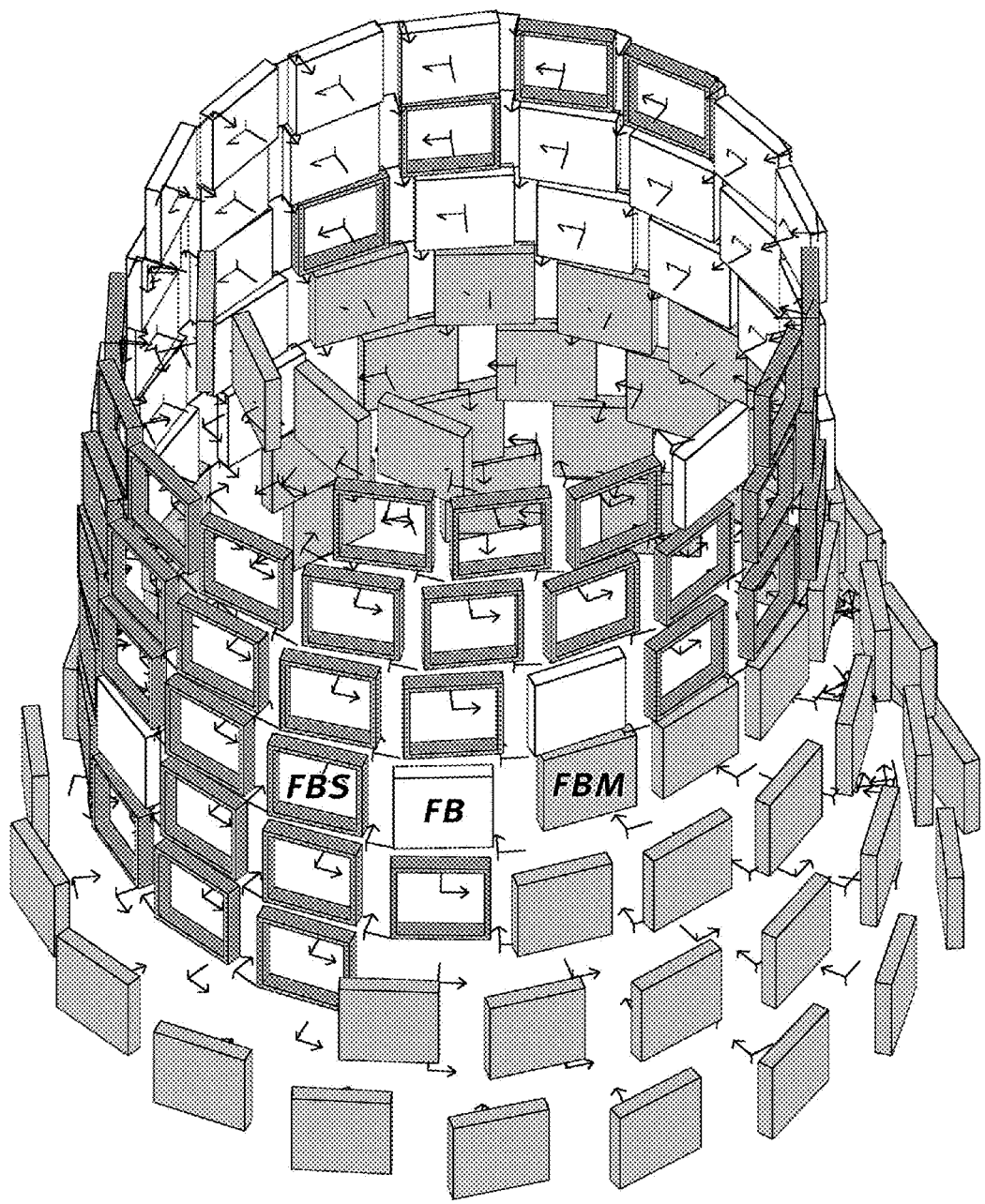

This distribution is shown on FIG. 64 (ring bases and centre bases are also shown in this figure).

Modifications and Variations

Many modifications and variations can be made to the embodiment described above.

For example, at step S300 on the first round of processing, base generator 70 calculated the position and orientation of each backbone base in accordance with mathematical functions. This enables a large number of backbone bases to be generated without the user having to position and orient each backbone base individually. However, base generator 70 is operable to generate the backbone bases in accordance with positions and orientations input by a user (for example, if only a small number of backbone bases are required).

In the embodiment described above, the generations of bases are generated sequentially—that is, all of the first generation (backbone) bases are generated, then all of the second generation (ring bases) are generated, and then all of the third generation (centre) bases are generated. However, base generator 70 is operable to generate the bases in different ways. For example, base generator 70 is operable to generate one first generation base and all of its second generation bases, followed by a next first generation base and all of its second generation bases, and so on up to the final first generation base and all of its second generation bases. In addition, base generator 70 is operable to generate bases in other orders.

In the embodiment described above, base generator 70 and content generator 90 are operable to generate bases and content objects respectively using a mathematical function or functions having base index values (base identification numbers) as a variable of the function(s). In this way, the bases and content objects change position, orientation and/or shape in accordance with the base index value of the base in which they are located. In the embodiment described above, the base index values used as the variables in the function are the base index values stored in the model graph, namely the base index values that were assigned when the bases were created. However, instead, temporary base index values (base identification numbers) can be used as the variables in the mathematical function(s). For example, when reference bases are selected to hold the new bases or content objects, each selected reference base can be assigned a temporary base index value which is independent of its actual base index value. For example, if twenty four bases are selected as reference bases, then temporary base index values 1 to 24 can be assigned to the selected reference bases, irrespective of their actual base index values stored in the model graph (which could be, for example, 25 to 48). The temporary base index values would then be used as the variables in the mathematical function(s) to generate the new bases and/or content objects, with the same effects as those described in the embodiment above.

In the embodiment described above, graph manager 80 generates and maintains a graph comprising a directed and labelled multigraph. However, graph manager 80 may generate and maintain other types of graph instead, such as a directed graph without labels, with the labels being stored in separate notes connected to the object nodes (that is bases and content objects).

In the embodiment described above, three-dimensional coordinate systems and three-dimensional mathematics are used to generate the design for a three-dimensional object. However, coordinate systems and/or mathematics of dimensions greater than three could be used to generate a design for a three-dimensional object.

In the embodiment described above, the bases within each generation have different respective positions and different respective orientations. However, some or all of the bases within a generation may have different respective positions but the same orientation, or the same position with different respective orientations.

In the embodiment described above, content creator 94 employs geometric modelling kernels that are pre-stored in apparatus 2 in order to create content objects. However, in addition or instead, content creator 94 may be arranged to download modelling kernels from a separate apparatus, at the time when the modelling kernels are required. Furthermore, content creator 94 may be arranged to export all of the necessary data for content object creation (instructions for operations and data for parameters) either to a separate software application running on apparatus 2 or to a separate processing apparatus, with the results (the created content object) then being imported back. Similarly, sensor function executor 110 may be arranged to export data to a separate application or apparatus for the execution of a sensor function, and to import the results. It will therefore be understood that an embodiment may comprise multiple processing apparatus (which may operate in series or in parallel), and that the term "apparatus" used in the claims is not restricted to a single apparatus.

The nature of the bases and content objects described above are specific to the example described, whereas base generator 70 and content generator 90 are operable to generate a wide variety of bases and content objects. For example, in the example described above, one backbone base is generated for each floor of the building—in the centre of the floor with ring bases around it. However, in the case of a square or rectangular building, base generator 70 is operable to generate a backbone base at each corner of each floor. Of course, other bases and content objects can be generated depending upon the application and design.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A computer-aided design apparatus for the design of three-dimensional objects to be fabricated, the apparatus comprising:
    a processor and a computer usable medium having computer readable program instructions embodied therein, the computer readable program instructions executable by the processor to so as to provide:
    a base generator operable to generate a plurality of bases in a reference coordinate system, each base comprising a local coordinate system; and
    a feature generator operable to generate at least one respective further feature for the design in the local coordinate system of each of a plurality of respective bases in accordance with a mathematical function having as a variable thereof base identification numbers representative of the plurality of respective bases in which the at least one respective further feature will be generated,
    such that each further feature has at least one of a position and orientation relative to the local coordinate system of the base in which it is located which depends upon a value of the base identification number thereof, and
    such that at least one of the position and orientation of the further feature of each of the plurality of bases relative to its local coordinate system changes in accordance with the value of the respective base identification number.

2. The computer-aided design apparatus according to claim 1, wherein the base identification numbers representative of the plurality of respective bases correspond to the order of creation of the bases.

3. The computer-aided design apparatus according to claim 1, wherein:
    each respective further feature has a unique feature identification number; and
    the feature generator is operable to generate further features using at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

4. The computer-aided design apparatus according to claim 3, wherein the feature generator is operable to generate a plurality of respective further features in the local coordinate system of each base in accordance with the at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

5. The computer-aided design apparatus according to claim 1, wherein the feature generator is operable to generate a plurality of groups of further features in accordance with the mathematical function, each respective group of further features being located in the local coordinate system of a different base and each further feature having a unique feature identification number, and wherein the mathematical function has the base identification numbers and also the feature identification numbers as variables of the function such that each group of further features has at least one of a position and orientation relative to the local coordinate system of the base in which it is located which depends upon the value of the base identification number thereof and each further feature has at least one of a position and orientation within the group to which it belongs which depends upon the feature identification number of the feature.

6. The computer-aided design apparatus according to claim 3, wherein the feature generator is operable to generate the further features in accordance with a first mathematical function having the base identification numbers as a variable thereof and a second mathematical function having the feature identification numbers as a variable thereof.

7. The computer-aided design apparatus according to claim 1, further comprising a transformation controller operable to transform at least some of the further features in accordance with a mathematical transformation dependent upon the base identification numbers such that the further features are transformed differently in dependence upon the values of the base identification numbers of their corresponding bases.

8. The computer-aided design apparatus according to claim 1, wherein the base generator is operable to generate each of the plurality of respective bases before the feature generator generates any of the further features.

9. The computer-aided design apparatus according to claim 1, wherein the feature generator is operable to generate further features comprising bases, each base comprising a local coordinate system.

10. The computer-aided design apparatus according to claim 1, wherein the feature generator is operable to generate further features comprising content objects.

11. A method of designing a three-dimensional object with a computer-aided design apparatus comprising a processor, a display, and a computer usable medium having computer readable program instructions embodied therein, the computer readable program instructions executed by the processor to implement the method, the method comprising:
    generating, with the computer-aided design apparatus, a plurality of bases in a reference coordinate system, each base comprising a local coordinate system; and
    generating, with the computer-aided design apparatus, at least one respective further feature for the design in the local coordinate system of each of a plurality of respective bases in accordance with a mathematical function having as a variable thereof base identification numbers representative of the plurality of respective bases in which the at least one respective further feature will be generated, such that each further feature has at least one of a position and orientation relative to the local coordinate system of the base in which it is located which depends upon a value of the base identification number thereof, and such that at least one of the position and orientation of the further feature of each of the plurality of bases relative to its local coordinate system changes in accordance with the value of the respective base identification number; and displaying a three-dimensional object representative of the generated bases and features.

12. The method according to claim 11, wherein the base identification numbers of the plurality of respective bases correspond to the order of creation of the bases.

13. The method according to claim 11, wherein:

each respective further feature has a unique feature identification number; and further features are generated using at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

14. The method according to claim 13, wherein a plurality of respective further features are generated in the local coordinate system of each base in accordance with the at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

15. The method according to claim 11, wherein a plurality of groups of further features are generated in accordance with the mathematical function, each respective group of further features being located in the local coordinate system of a different base and each further feature having a unique feature identification number, and wherein the mathematical function has the base identification numbers and also the feature identification numbers as variables of the function such that each group of further features has at least one of a position and orientation relative to the local coordinate system of the base in which it is located which depends upon the value of the base identification number thereof and each further feature has at least one of a position and orientation within the group to which it belongs which depends upon the feature identification number of the feature.

16. The method according to claim 13, wherein the further features are generated in accordance with a first mathematical function having the base identification numbers as a variable thereof and a second mathematical function having the feature identification numbers as a variable thereof.

17. The method according to claim 11, further comprising transforming at least some of the further features in accordance with a mathematical transformation dependent upon the base identification numbers such that the further features are transformed differently in dependence upon the values of the base identification numbers of their corresponding bases.

18. The method according to claim 11, wherein each of the plurality of respective bases is generated before any of the further features are generated.

19. The method according to claim 11, wherein the further features comprise bases, each base comprising a local coordinate system.

20. The method according to claim 11, wherein the further features comprise content objects.

21. The method according to claim 11, wherein the method further comprises an act of modifying at least one of the generated bases and features, and wherein the act of displaying the three-dimensional object includes displaying the three-dimensional object having any modifications of the at least one of the modified bases and features.

22. A non-transitory computer usable medium having computer readable program instructions embodied therein, the computer readable program instructions adapted to be executed to implement a method for operating a computer to design a three-dimensional object to be fabricated, the method comprising:

generating a plurality of bases in a reference coordinate system, each base comprising a local coordinate system; and generating at least one respective further feature for the design in the local coordinate system of each of a plurality of respective bases in accordance with a mathematical function having as a variable thereof base identification numbers representative of the plurality of respective bases in which the at least one respective further feature will be generated, such that each further feature has at least one of a position and orientation relative to the local coordinate system of the base in which it is located which depends upon a value of the base identification number thereof, and such that at least one of the position and orientation of the further feature of each of the plurality of bases relative to its local coordinate system changes in accordance with the value of the respective base identification number.

23. The non-transitory computer usable medium according to claim 22, wherein the computer readable program instructions are such that the base identification numbers representative of the plurality of respective bases correspond to the order of creation of the bases.

24. The non-transitory computer usable medium according to claim 22, wherein the computer readable program instructions are such that:

each respective further feature has a unique feature identification number; and further features are generated using at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

25. The non-transitory computer usable medium according to claim 24, wherein the computer readable program instructions are such that a plurality of respective further features are generated in the local coordinate system of each base in accordance with the at least one mathematical function having the base identification numbers and also the feature identification numbers as variables of the function(s) so that each further feature has at least one of a position and orientation relative to the local coordinate system of the base in which it is located which depends upon both the value of the base identification number thereof and the value of the feature identification number of the feature.

26. The non-transitory computer usable medium according to claim 22, wherein the computer readable program instructions are such that a plurality of groups of further features are generated in accordance with the mathematical function, each respective group of further features being located in the local coordinate system of a different base and each further feature having a unique feature identification number, and wherein the mathematical function has the base identification numbers and also the feature identification numbers as variables of the function such that each group of further features has at least one of a position and orientation relative to the local coordinate system of the base in which it is located which depends upon the value of the base identification number thereof and each further feature has at least one of a position and orientation within the group to which it belongs which depends upon the feature identification number of the feature.

27. The non-transitory computer usable medium according to claim 24, wherein the computer readable program instructions are such that the further features are generated in accordance with a first mathematical function having the base identification numbers as a variable thereof and a second mathematical function having the feature identification numbers as a variable thereof.

28. The non-transitory computer usable medium according to claim 22, wherein the computer readable program instructions when executed further cause the computer to transform at least some of the further features in accordance with a mathematical transformation dependent upon the base identification numbers such that the further features are transformed differently in dependence upon the values of the base identification numbers of their corresponding bases.

29. The non-transitory computer usable medium according to claim 22, wherein the computer readable program instructions are such that each of the plurality of respective bases are generated before generation of any of the further features.

30. The non-transitory computer usable medium according to claim 22, wherein the further features are generated comprising bases, and wherein each base comprises a local coordinate system.

31. The non-transitory computer usable medium according to claim 22, wherein the computer readable program instructions are such that the further features are generated comprising content objects.

\* \* \* \* \*